US005208782A

United States Patent [19]

Sakuta et al.

[11] Patent Number: 5,208,782
[45] Date of Patent: May 4, 1993

[54] SEMICONDUCTOR INTEGRATED CIRCUIT DEVICE HAVING A PLURALITY OF MEMORY BLOCKS AND A LEAD ON CHIP (LOC) ARRANGEMENT

[75] Inventors: Toshiyuki Sakuta; Masamichi Ishihara, both of Hamura; Kazuyuki Miyazawa, Iruma; Masanori Tazunoki, Hamura; Hidetoshi Iwai; Hisashi Nakamura, both of Shin; Yasushi Takahashi, Tachikawa; Toshio Maeda, Ohme; Hiromi Matsuura, Tokorozawa; Ryoichi Hori, Hinode; Toshio Sasaki, Hachioji; Osamu Sakai, Kodaira; Hiroyuki Uchiyama, Fuchuu; Eiji Miyamoto; Kazuyoshi Oshima, both of Ohme; Yasuhiro Kasama, Tokyo, all of Japan

[73] Assignees: Hitachi, Ltd., Tokyo; Hitachi Vlsi Engineering Corp., Kodaira, both of Japan

[21] Appl. No.: 892,708

[22] Filed: May 29, 1992

Related U.S. Application Data

[63] Continuation of Ser. No. 478,541, Feb. 9, 1990, abandoned.

[30] Foreign Application Priority Data

Feb. 9, 1989 [JP] Japan .................................. 1-30196
Mar. 20, 1989 [JP] Japan .................................. 1-65839

[51] Int. Cl.$^5$ .............................................. G11C 5/06
[52] U.S. Cl. ................................ 365/230.03; 365/51;
365/63; 257/784; 257/786
[58] Field of Search ................... 365/51, 63, 230.03;
357/45, 70

[56] References Cited

U.S. PATENT DOCUMENTS

| | | | |
|---|---|---|---|
| 4,809,234 | 2/1989 | Kuwashiro | 365/230.03 |
| 4,855,958 | 8/1989 | Ikeda | 357/45 |
| 4,905,201 | 2/1990 | Ohira et al. | 365/230.03 |
| 4,907,199 | 3/1990 | Dosaka et al. | 365/230.03 |
| 4,914,630 | 4/1990 | Fujishima | 365/230.03 |
| 4,930,000 | 5/1990 | Kantz | 357/70 |
| 4,934,820 | 6/1990 | Takahashi et al. | 357/45 |
| 4,945,395 | 7/1990 | Suehiro | 357/45 |
| 4,951,122 | 8/1990 | Tsubasaki et al. | 357/70 |
| 4,958,316 | 9/1990 | Ochii et al. | 365/51 |
| 4,974,053 | 11/1990 | Kinoshita et al. | 357/70 |
| 4,984,202 | 1/1991 | Kawahara et al. | 365/177 |
| 4,987,474 | 1/1991 | Yasuhara et al. | 357/70 |
| 4,989,068 | 1/1991 | Yasuhara et al. | 357/70 |
| 5,028,986 | 7/1991 | Sugano et al. | 357/70 |

FOREIGN PATENT DOCUMENTS 106693 10/1977 Japan .

OTHER PUBLICATIONS

"Manufacturers Groping for 16M DRAM Specifications Toward the Sample Delivery in 1990", Nikkei Micro Device, Mar. 1, 1988, pp. 67-81.

Primary Examiner—Joseph L. Dixon
Assistant Examiner—Jack A. Lane
Attorney, Agent, or Firm—Antonelli, Terry, Stout & Kraus

[57] ABSTRACT

A semiconductor integrated circuit memory structure is provided which uses macro-cellulated circuit blocks that can permit a very large storage capability (for example, on the order of 64 Mbits in a DRAM) on a single chip. To achieve, this, a plurality of macro-cellulated memory blocks can be provided, with each of the memory blocks including a memory array as well as additional circuitry such as address selection circuits and input/output circuits. Other peripheral circuits are provided on the chip which are common to the plurality of macro-cell memory blocks. The macro-cell memory blocks themselves can be formed in an array so that their combined storage capacity will form the large overall storage capacity of the chip. The combination of the macro-cell memory blocks and the common peripheral circuitry for controlling the memory blocks permits a faster and more efficient refreshing operation for a DRAM. This is enhanced by a LOC (Lead On Chip) arrangement used in conjunction with the memory blocks.

28 Claims, 34 Drawing Sheets

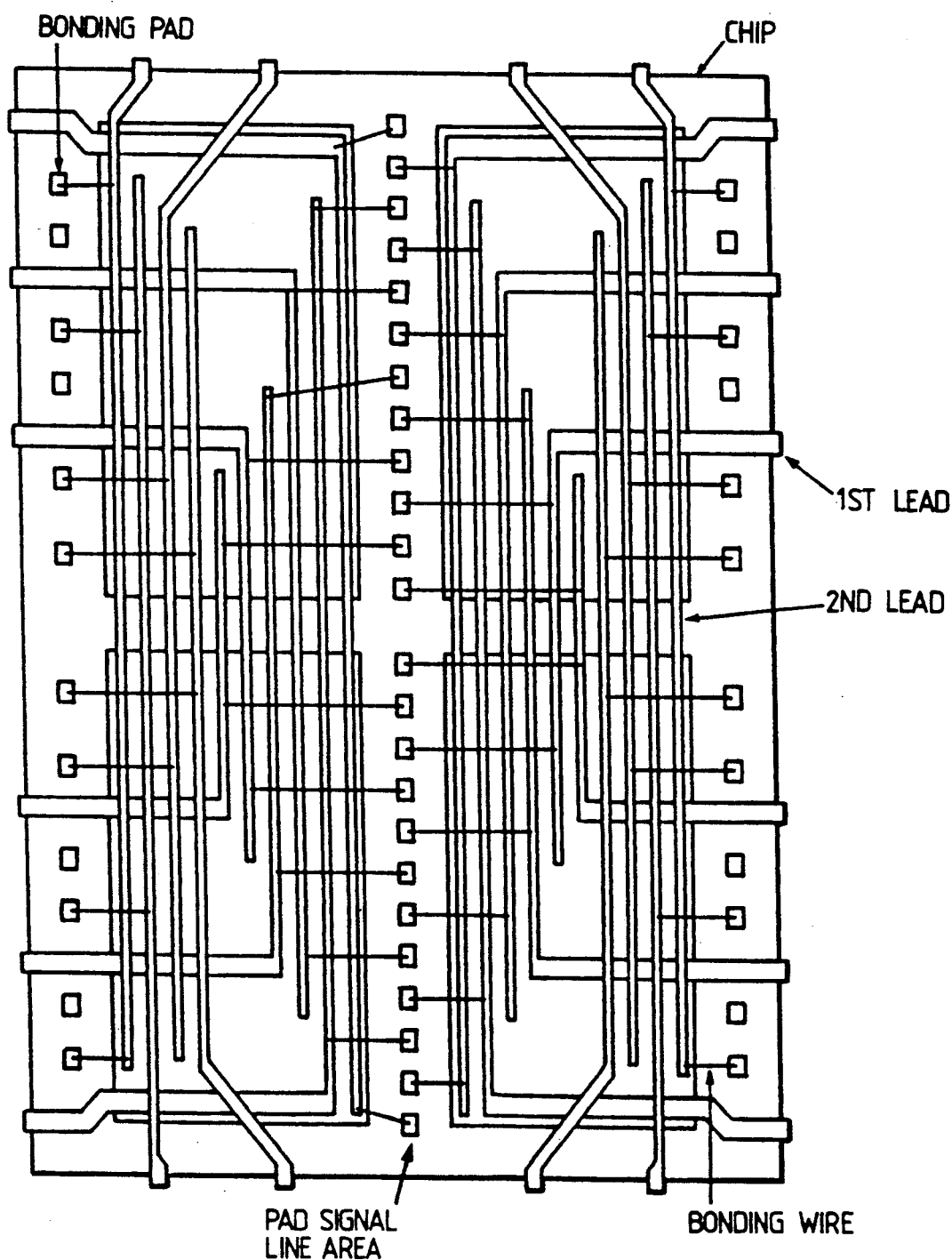

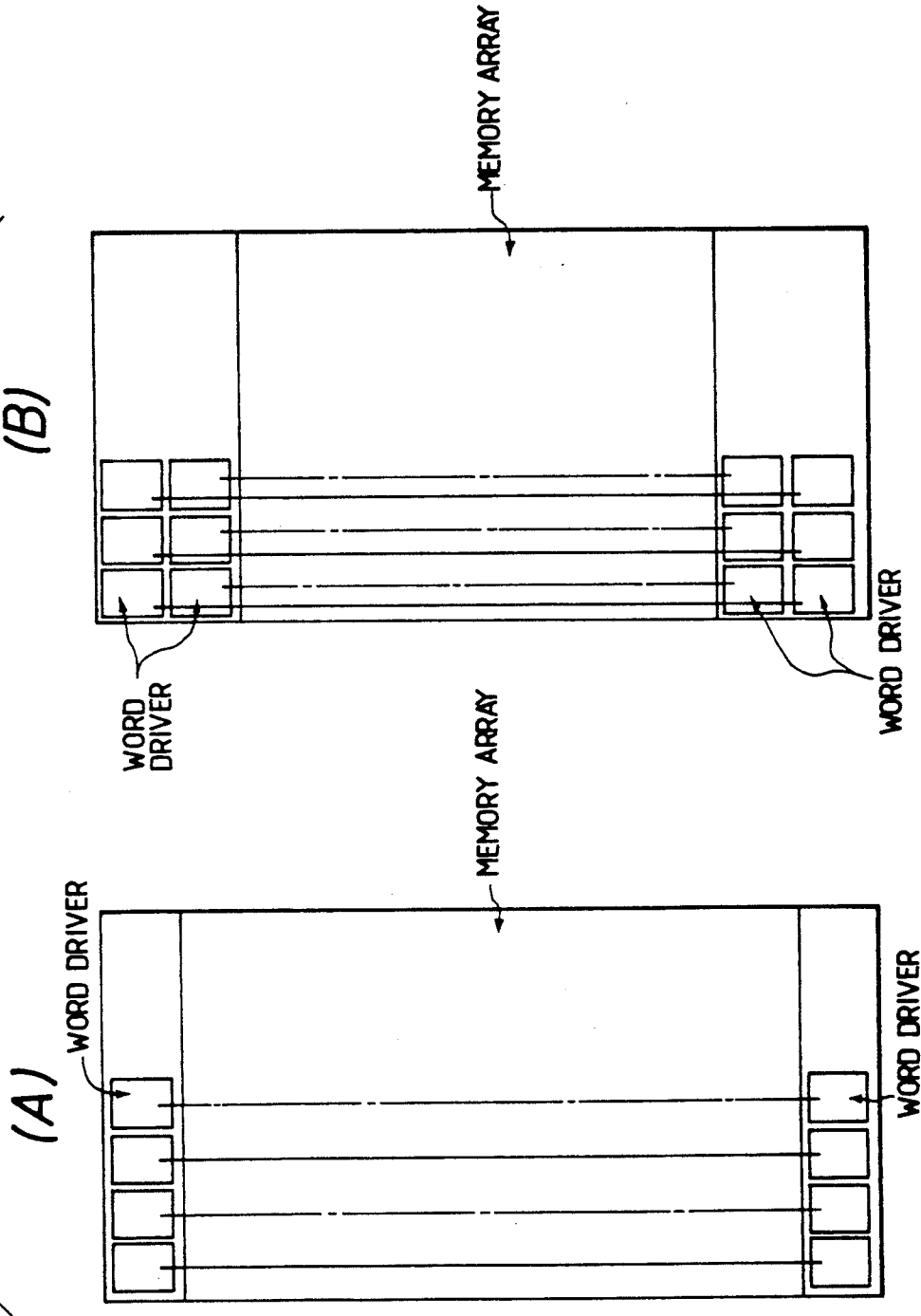

MEMORY CHIP

SEMICONDUCTOR INTEGRATED CIRCUIT DEVICE HAVING A PLURALITY OF MEMORY BLOCKS AND A LEAD ON CHIP (LOC) ARRANGEMENT

This application is a continuation of application Ser. No. 478,541, filed on Feb. 9, 1990, abandoned.

BACKGROUND OF THE INVENTION

The present invention relates to a semiconductor integrated circuit device and a defect relieving method therefor and, more particularly, to technologies which are effective when used in a dynamic RAM (i.e., Random Access Memory) having a large storage capacity such as 64 Mbits, although the invention is not limited to this, and a defect relieving method therefor.

There has recently been developed a dynamic RAM (which may be referred to as "DRAM") which has a large storage capacity of about 16 Mbits. This dynamic RAM is exemplified on pages 67 to 81 of "Nikkei Micro Device" published on Mar. 1, 1988 by NIKKEI McGRAW-HILL.

A semiconductor memory device such as the DRAM using MISFETs includes a memory cell array having a plurality of memory cells arranged in a matrix form. In case data is to be written in or read out from an arbitrary memory cell of the DRAM, a row address decoder and a column address decoder select the row and column corresponding to address signals coming from the outside to address that memory cell. In response to the selection signals from the row address decoder, the word driver drives the word line of the row to be selected to a selection level. The aforementioned word line acts as the gate electrode of the selected MISFET of the memory cell. The aforementioned gate electrode acts as a mask for forming the source or drain electrode of the selected MISFET by an ion implantation. The aforementioned gate electrode is made of polycrystalline silicon, for example, because it has to stand the heat of the heat treatment after the ion implantation.

To attain a higher degree of integration of the aforementioned semiconductor memory device, the memory cell array becomes larger so that the word lines become longer. Since the polycrystalline silicon has a high resistance, the word lines take an extremely high resistance so that the CR time constant is enlarged. This causes a delay in the signal transmission time from the word driver. Thus, it is possible to adopt the technology, by which word shunting lines made of a material having a low resistance such as aluminum are disposed close to and in parallel with the aforementioned word lines made of polycrystalline silicon so that the transmission delay of word line drive signals may be reduced by connecting the aforementioned word shunting lines and the aforementioned word lines.

Incidentally, the word shunting lines are described in Japanese Patent Laid-Open No. 106693/1977.

In accordance with the aforementioned large storage capacity, the memory chips are naturally large-sized. Accordingly, in a dynamic RAM having its storage capacity enlarged to about 64 Mbits, the signal transmission speed is dropped as the wiring length is increased by making the elements (e.g. the wiring layer and the circuit elements) finer and by having the wiring lines lugged around the chip. As a result, the DRAM intended to achieve the aforementioned high storage capacity has to take into special consideration the drop in the operation speed due to the aforementioned signal delay. In other words, a new technology different from the techniques used in the prior art for about 1 Mbit or 4 Mbits is required for realizing the large storage capacity of about 64 Mbits.

In order to improve the degree of integration of the semiconductor memory device, on the other hand, it is necessary to reduce the size of the memory cell and the width of the wiring lines such as the word shunting lines. In the DRAM of 16 Mbits, for example, it is expected that the word shunting lines have a width of about 0.6 to 0.8 μm. The word shunting lines are frequently made of aluminum. In case the electric wiring lines are made of thin aluminum, they can easily be broken by the so-called "electro-migration phenomena" (which will be shortly referred to as "EMD"), in which wiring metal will migrate while exchanging kinetic energy with the carriers. We have also found another problem that the wiring materials are broken by the so-called "stress migration" (which will be shortly referred to as "SMD"), in which a strain is caused in the wiring materials by the stress coming from the inter-layer insulating films.

SUMMARY OF THE INVENTION

An object of the present invention is to provide a semiconductor integrated circuit device which is equipped with a semiconductor memory circuit having a high storage capacity.

Another object of the present invention is to provide a semiconductor integrated circuit device which comprises a semiconductor memory circuit given a large storage capacity while speeding up the operation.

Still another object of the present invention is to provide a method of efficiently relieving a defect of the semiconductor memory circuit given a large storage capacity.

A further object of the present invention is to provide a semiconductor memory circuit which can prevent the EMD and SMD of the word shunting lines for the purpose of achieving high integration.

To achieve these and other objects, a semiconductor memory device having a large storage capacity is constructed by providing a plurality of macro-cellulated circuit blocks each including a memory array, an address selection circuit for the memory array, and a data input/output circuit. In the vicinity of the aforementioned macro cells, there are arranged external input/output bonding pads, of which the bonding pads for feeding a signal are bonded with a coating wire by extending a common LOC (Lead on Chip) lead frame. In the memory cells, the word line backing lines and the bit lines are so multi-layered that the adjacent wiring lines may belong to different layers. The word lines and/or bit lines are alternately equipped at their ends with drivers and unit sense amplifiers. The number and operation time of the operation circuits are made different between a normal mode and a refresh mode. On condition that no defective bit is present at an address, the output of a non-defective portion of the two memory chips is validated, or only the non-defective portion is accessed to. Such plural ones of the aforementioned defective chips which use only the non-defective portion are packaged in one package to provide an apparently complete product. The output signals of three or more odd memory chips or blocks having no defect at an address are outputted through a majority decision logic circuit.

According to the aforementioned means, a plurality of macro-cellulated memory circuits having the RAM function are used to construct the semiconductor memory circuit having a large storage capacity so that the layout can be simplified and rationalized. The LOC leads are extended close to the aforementioned macro cells and bonded with the coating wires so that the signals can be inputted/outputted at a high speed. The memory cells can be arranged in high density by multi-layering the word line backing lines and the bit lines and by providing the two ends of the word lines and/or bit lines alternately with the drivers and the unit sense amplifiers. The numbers and operation times of the circuits are made different between the normal mode and the refresh mode so that the power consumption can be reduced. By using the non-defective portions of the two defective chips, moreover, one apparently complete memory chip can be formed. The defective bits can be invalidated by taking a majority decision of odd bits. The yield of the RAM can be enhanced by packaging those defective chips in a package.

In another representative of the invention to be disclosed herein, the adjacent word shunting lines are made of vertically offset different layers.

The total undesired loads to be driven by the word drivers, such as the parasitic capacities or wiring resistors of the simultaneously selected ones of the laminated word shunting lines of the semiconductor memory device are always equal at the selection step of each word line. In case the word shunting lines are made of two layers and in case an even number of word lines are simultaneously selected, the word shunting lines of the upper layer and the word shunting lines of the lower layer are paired so that one or more pairs of word shunting lines are selected.

Since the adjacent word shunting lines are formed of upper and lower different layers through an insulating film, it becomes unnecessary to form a spacing for the insulation between the aforementioned adjacent word shunting lines. As a result, the width of the word shunting lines can be increased to the aforementioned spacing or more, for example, and an improvement in the resistance to the EMD or SMD can be achieved.

If the adjacent word shunting lines are made of vertically different layers, as described above, the undesired loads of the word shunting lines of the lower layer are higher than those of the word shunting lines of the upper layer. In case the memory cell array is divided into a plurality of memory mats, the word shunting lines are driven, if simultaneously selected in each memory mat, by the word driver in accordance with the selection signals of the address decoder. The aforementioned address decoder having the selection logic to keep constant the total loads of the plural word shunting lines to be simultaneously selected keeps constant the loads to be driven by the word driver, even in any addressing operation, to stabilize the accessing operation and warrant the high-speed access.

BRIEF DESCRIPTION OF THE DRAWINGS

FIGS. 5A to 5C are schematic pattern diagrams showing another embodiment of the aforementioned semiconductor chips and the LOC leads;

FIG. 20C is a layout showing another embodiment of the word lines and their drivers of the memory cell array according to the present invention;

DETAILED DESCRIPTION

Figure 1:
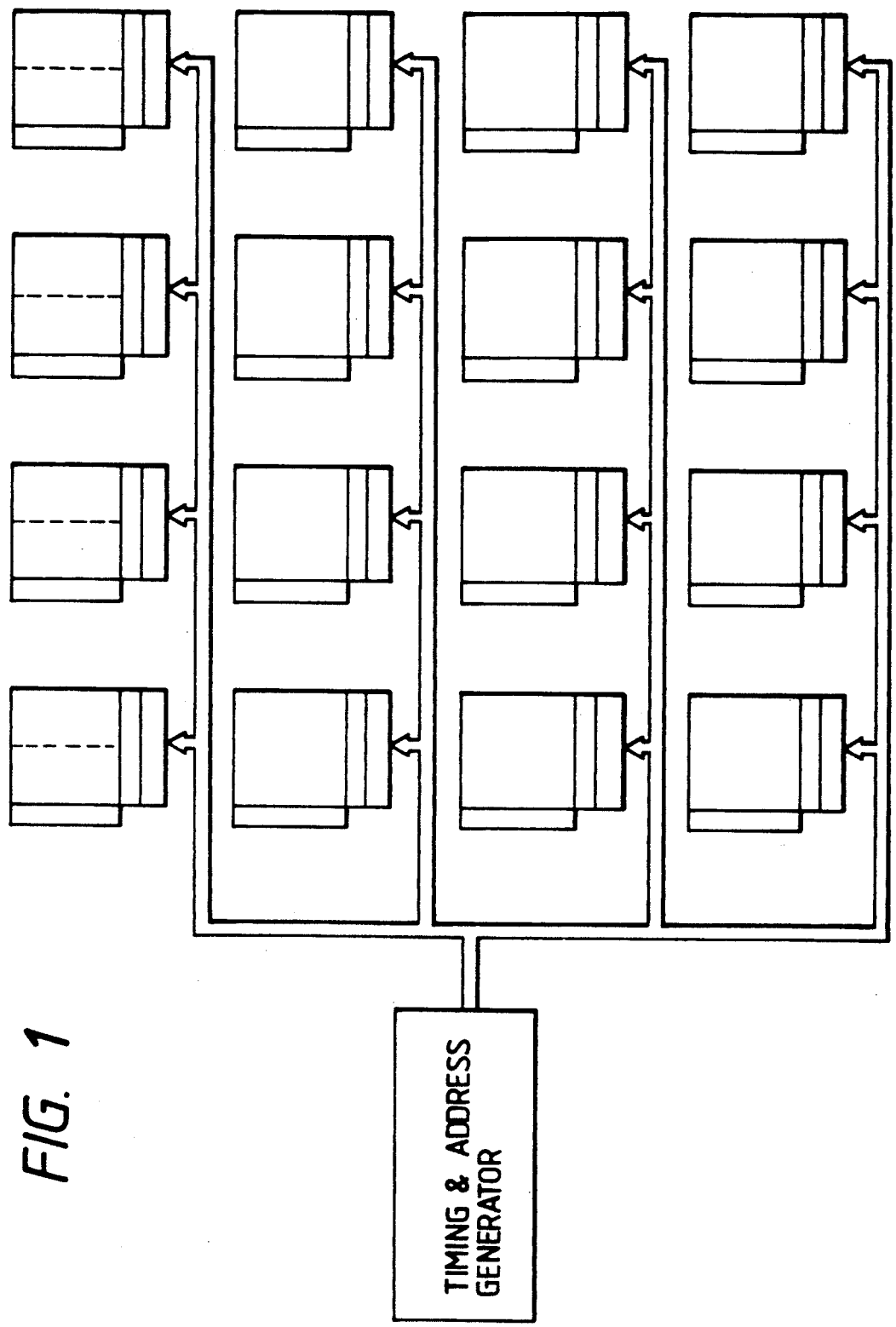
FIG. 1 is a fundamental block diagram showing one embodiment of the dynamic RAM of about 64 Mbits according to the present invention.

FIG. 1 is a fundamental block diagram showing one embodiment of a dynamic RAM having a storage capacity as large as about 64 Mbits, to which the present invention is applied.

This embodiment performs the following devices in the arrangement of the memory array portion constructing the RAM and the peripheral portion for selecting the addresses of the former. The devices prevent the delay in the operating speed according to the elongation of the signal propagation delay time, which might otherwise be inevitable caused by elongating the various wiring lengths of control signals or memory array drive signals due to the increase in the chip size accompanying the increased capacity of the memory.

The major circuit block of FIG. 1 are individually drawn in accordance with the geometrical arrangement of the practical semiconductor chip.

The RAM of this embodiment is constructed such that a plurality of macro-cellulated memory blocks are arranged in a matrix form. One macro-cellulated memory block is made to have a storage capacity of about 4 Mbits. The shown embodiment is made to have a large storage capacity of about 64 Mbits as a whole by arraying sixteen macro-cellulated memory blocks in four rows and in four columns.

Figure 2:
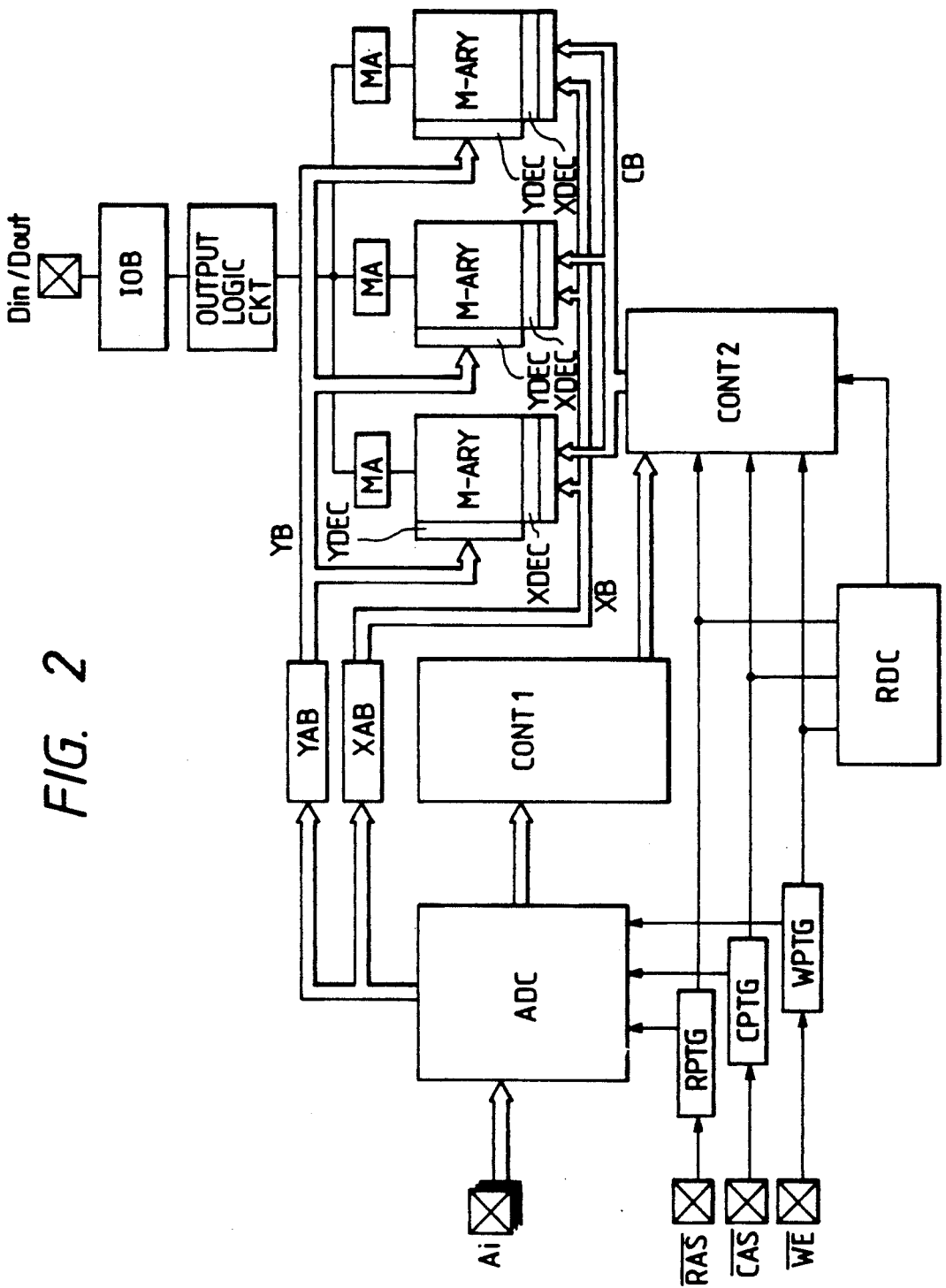
FIG. 2 is a block diagram showing an embodiment of the dynamic RAM according to the present invention for implementing the arrangement shown in FIG. 1.

Each macro-cellulated memory block is equipped with: an address selector composed of address decoders and word line drivers of rows and columns for receiving address signals fed through shared timing/address generators; a memory array; an internal timing generator for generating time-series timing pulses necessary for the internal operations in accordance with an operation mode; and an input/output circuit for writing/reading data in and out of a selected memory cell. The memory blocks specified above are matrix-arranged together with above-specified control circuit (i.e., the timing and address generator). This control circuit exchanges signals with the individual memory blocks through signal buses. One embodiment of a control arrangement of the timing and address generator is shown in FIG. 2.

Therefore, the dynamic RAM of this embodiment looks like a semiconductor memory device of board structure, in which one macro-cellulated memory block is deemed as one RAM.

However, the overall RAM of this embodiment is constructed of one semiconductor integrated circuit and is quite different from the aforementioned structure in which the packaging substrate of the aforementioned board structure is merely replaced by a semiconductor substrate. This is because the semiconductor integrated circuit device includes a variety of technical problems, which are not experienced in the semiconductor memory device of the board structure, such as the restriction on the chip size, as well as problems with the wiring layer, with power consumption, and with defect relief. In other words, one semiconductor integrated circuit device such as shown in FIG. 1 cannot be constructed before the aforementioned various technical problems are solved.

In this embodiment, the overall layout and its control are simplified by macro-cellulating the memory block having the aforementioned memory functions. In short, the dynamic RAM having a scale of 64 Mbits can be formed by designing macro-cells having a storage capacity of about 4 Mbits and by arranging the macro-cells in the number of 4×4.

In the aforementioned control circuit (i.e., the timing and address generator of FIG. 1), moreover, the operation mode is decided to form corresponding major timing signals, and address signals are divided into internal address signals to be fed to the individual memory blocks and decoded memory block selection signals so that they are fed to macro-cellulated memory blocks through the aforementioned signal buses. The control circuit is equipped with a refresh control circuit including a refresh address generator for refreshing operations.

By taking this structure, the macro-cellulated memory block can be made to have such a simplified circuit structure as in constructed of memory cells arranged in a matrix form, a selector and a data input/output circuit therefor. In the macro-cellulated memory block of this embodiment, more specifically, it is unnecessary, as opposed to a case of each DRAM being packaged in the memory device of the board structure, to provide an operation mode decision circuit, a corresponding timing signal generator (such as shown in FIG. 1), and a refresh control circuit including a refresh address generator.

In this embodiment, the power-supply voltage is set at a relatively low level such as about 3.3 V, although not limited thereto, so as to cope with the drops of the breakdown voltage and power consumption of the elements due to the reduction of the element structure. This power-supply voltage may be established either by the structure, in which a power-supply circuit for dropping the voltage of about 5 V received from the outside is disposed inside, or by supplying the aforementioned voltage of about 3.3 V from the outside. In this case, the circuit requiring the selection level of the word line or the like or the level elevated with respect to the power-supply voltage such as the selection signal for selecting a shared sense amplifier may be exemplified by a bootstrap circuit or operated with a voltage boosted in advance.

In order to further reduce the power consumption, the internal operation voltage may be dropped from the aforementioned voltage of about 3.3 V to 2 V or 1.5 V. If the circuit is operated with the aforementioned voltage as low as 1.5 V, it can be easily backed up by a battery.

FIG. 2 is a block diagram showing one embodiment of a control arrangement for the dynamic RAM according to the present invention.

The individual circuit blocks of FIG. 2 are formed in one semiconductor substrate. The RAM of this embodiment has the aforementioned large capacity of about 64 Mbits and is constructed of one semiconductor integrated circuit device, as has been described hereinbefore. Only three of the macro-cellulated memory blocks are shown for purposes of drawing simplification. Thus, the external terminals include an address signal terminal Ai (e.g., A0 to A12 in the address multiplex system), a row address strobe signal terminal $\overline{RAS}$, a column address strobe signal terminal $\overline{CAS}$, a write enable signal terminal $\overline{WE}$ and data signal terminals Din and Dout.

An address signal is fed from the address signal terminal Ai to an address control circuit ADC contained in the control circuit. A row address strobe signal is fed from the terminal $\overline{RAS}$ and is introduced into a row pre-timing generator RPTG. This row pre-timing generator RPTG has its output signal fed to the aforementioned address control circuit ADC, an operation mode decision circuit RDC for operation modes such as a normal mode, a refresh mode or a counter test mode, and a control circuit CONT2 including a generator for generating a memory block selection signal and major timing signals according to the operation mode and a refresh address counter. A column address strobe signal is fed from the terminal $\overline{CAS}$ and is introduced into a column pre-timing generator CPTG. This column pre-timing generator CPTG has its output signal fed to the aforementioned address control circuit ADC, operation mode decision circuit RDC and control circuit CONT2. A write enable signal is fed from the terminal $\overline{WE}$ and is introduced into its pre-timing generator WPTG. This pre-timing generator WPTG has its output signal fed to the aforementioned address control circuit ADC, control circuit CONT2 and operation mode decision circuit RDC.

The address control circuit ADC uses the aforementioned address strobe signals $\overline{RAS}$ and $\overline{CAS}$ to fetch the row and column address signals fed time-serially from the external terminal Ai. The address control circuit ADC inputs its specific address signals to a control circuit CONT1 and its remaining address signals to address buffers XAB and YAB. The address buffers XAB and YAB feed X-addresses and Y-addresses commonly to the individual memory blocks through internal buses XB and YB, respectively.

The aforementioned control circuit CONT1 generates the number of operation mats and the address in normal mode when in the refreshing operation.

The operation mode decision circuit RDC decides the CBR refresh (CAS before RAS refresh) and the WCBR (counter test) from the output signals of the pre-timing generators RPTG, CPTG and WPTG and transmits the decision result to the control circuit CONT2. This control circuit CONT2 feeds the block selection signals in the normal mode and the major timing signals according to the operation mode through an internal bus CB. The control circuit CONT2 feeds the refresh addresses line the refresh mode (CBR). For this operation, each memory block is equipped with a switch circuit for switching the addresses for the normal and refresh modes fed from the internal buses XB and CB. When in this refresh mode, the operations of the Y-selection circuit and the X-address buffer are stopped, as will be described in the following. In the counter test mode (WCBR), the Y-selection circuit is operated together with the aforementioned refresh operation. It is to be noted that each of the macro-cellulated memory blocks includes its own address decoders.

A read signal of each memory block is transmitted through a main amplifier MA (which can be part of the macro-cellulated block) to an output logic circuit and further through an input/output circuit IOB to a terminal Dout. In the write path, on the other hand, data inputted from a terminal Din are introduced through the aforementioned input/output circuit IOB and transmitted to a selected memory block. This write path is omitted from FIG. 2 but should be understood to be arranged in parallel with the aforementioned read path.

In this embodiment, one memory block is macro-cellulated so that a plurality of memory blocks may be arranged to realize the aforementioned large storage capacity of about 64 Mbits. Therefore, a plurality of memory circuits each having a storage capacity of about 4 Mbits are developed and designed so that the circuit and its layout can be easily designed. As has been described hereinbefore, moreover, one memory block is equipped with the memory cell selection circuit and the input/output circuit so that it may constitute one RAM. This makes it possible to activate only the memory block having a memory cell to be selected, as will be described hereinafter, to reduce the power consumption.

Since the operation mode decision circuit and the refresh control circuit are shared among the plural memory blocks, as has been described hereinbefore, the circuit scale of the memory blocks themselves can be reduced to reduce the overall circuit scale accordingly.

Figure 3:
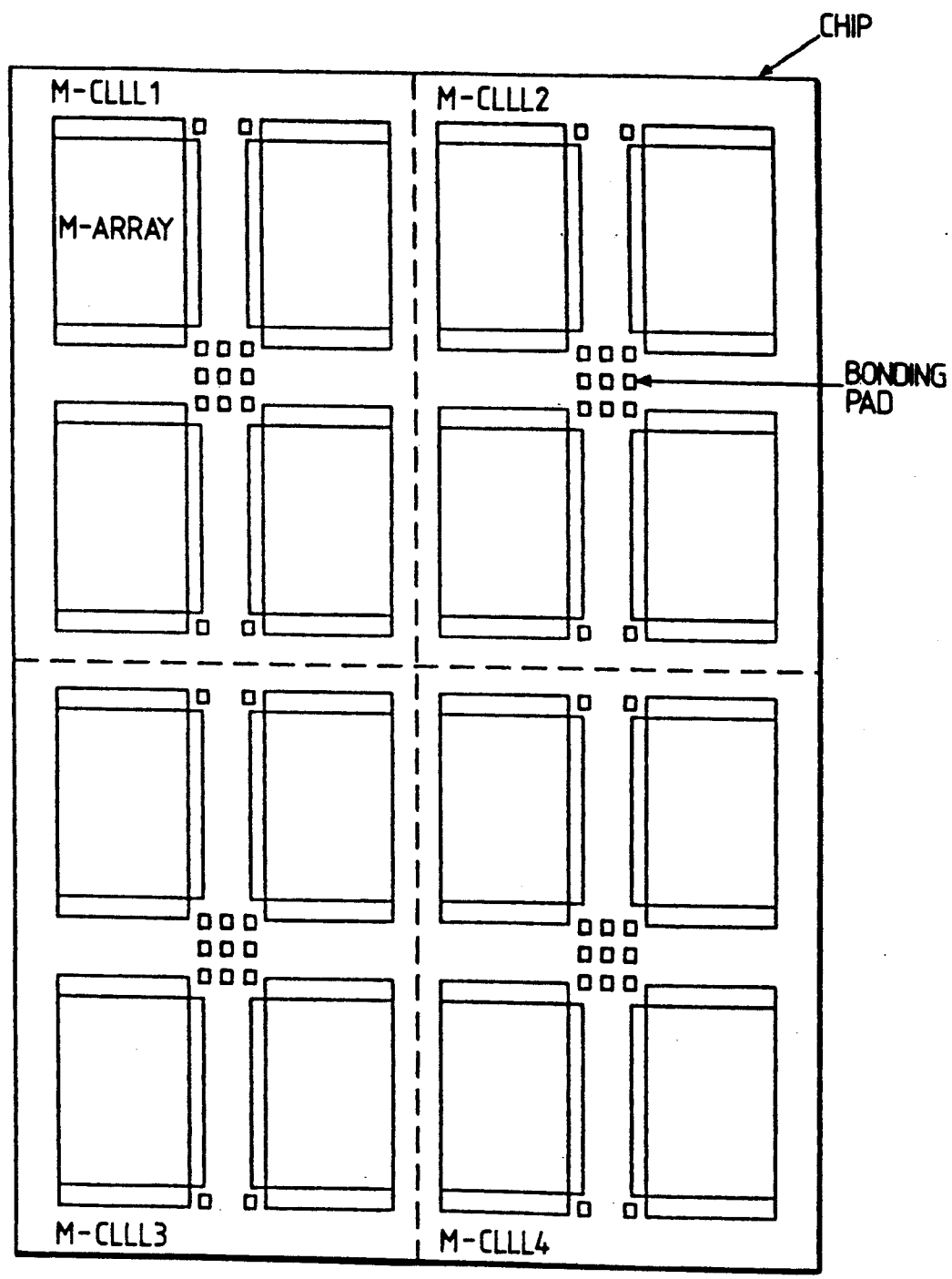
FIG. 3 presents a circuit block showing a semiconductor integrated circuit device according to the present invention and a fundamental layout showing one embodiment of the arrangement of the corresponding bonding pads.

FIG. 3 is a fundamental layout showing another embodiment of the external terminals of a semiconductor integrated circuit device according to the present invention.

As shown in FIG. 3, one semiconductor integrated circuit device is constructed of a plurality of macro-cellulated circuit blocks. In case the aforementioned dynamic RAM of about 64 Mbits is to be constructed, for example, the individual circuits are made of the aforementioned dynamic RAMS each having about 4 Mbits. However, this embodiment is not equipped with the aforementioned control circuit which is commonly used for the plural memory blocks. It should therefore be understood that each memory block of this embodiment is equipped with the address selection circuit, the input/output circuit and the control circuit.

In this embodiment, the exchange of the signals with the external terminals of a large-scale integrated circuit is prevented from causing a signal delay because of the internal wiring and accordingly from delaying the operation speed. For these preventions, bonding pads are arranged near and for the memory blocks, respectively.

For example, near the address buffers of the individual memory blocks, there are arranged bonding pads for the address terminals. Near the control circuits, there are arranged bonding pads for the control signals $\overline{RAS}$, $\overline{CAS}$ and $\overline{WE}$. Near the input/output circuits, there are arranged bonding pads for the data terminals. These bonding pads are arranged as close as possible. According to this embodiment, the bonding pads are disposed not in the peripheral portions like the semiconductor chip of the prior art but close to the individual memory blocks.

In this case, although not especially limited thereto, the memory blocks of four rows and columns are halved longitudinally and transversely to form four memory groups each composed of four memory blocks of two rows and columns. The bonding pads are disposed at the center of each memory group so that they may be commonly used for the four memory blocks. The adoption of this structure makes it possible to reduce the number of the bonding pads. In this structure, the total sixteen memory blocks are grouped into the four groups so that one signal is shared among the four bonding pads. For the row-address strobe signal $\overline{RAS}$, for example, four bonding pads are provided for the aforementioned four memory groups.

In the DRAM chip of the prior art, the bonding pads are disposed only in the peripheral portions of the chip, as has been described hereinbefore, and only one bonding pads is provided for one signal. The structure of this embodiment is highly different from those of the prior art. In the DRAM of the prior art, the bonding pads are provided in no place other than the peripheral portions of the chip, and only one bonding pad is provided for one signal. If the chip size is enlarged with the prior art structures, the wiring line is extended from one portion, where the bonding pad is disposed, to an opposed peripheral portion so that it is elongated.

In this embodiment, the aforementioned restrictions are eliminated to accelerate the operation speed, and bonding pads for the necessary signals are disposed close to the individual memory blocks. As a result, the wiring lines from the bonding pads to the corresponding internal circuits can be shortened to realize the high-speed operations independently of the large size of the chip size. Although the invention is not necessarily limited to this, it is desirable that distance from a bonding pad to the most end portion in the memory block related to the bonding pad is substantially equal with distance from a bonding pad in the conventional DRAM to the most end portion in the memory array related to the bonding pad in the conventional DRAM, in order to prevent access time dropping.

In case, however, the bonding pad are provided, as described above, bonding technologies different from those of the DRAM of the prior art are required. Therefore, the LOC (Lead On Chip) technologies to be used will be described in the following.

Figure 4:
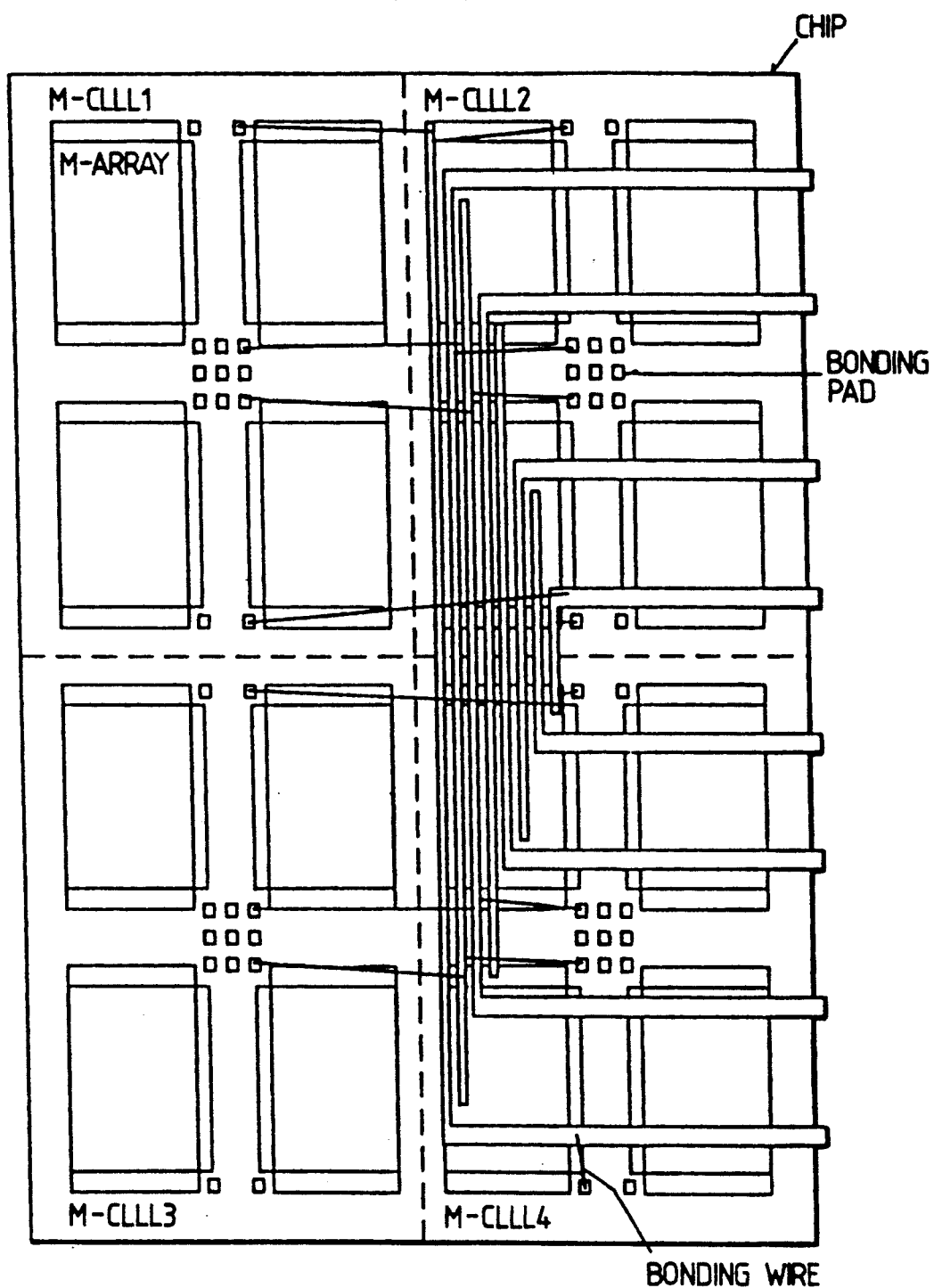
FIG. 4 presents a fundamental layout of the aforementioned semiconductor integrated circuit device and a pattern diagram showing one embodiment of the corresponding LOC leads.

FIG. 4 presents both a fundamental layout showing one embodiment of the semiconductor integrated circuit device according to the present invention and a pattern diagram showing one embodiment of the corresponding LOC lead frame. The LOC lead frame of FIG. 4 is so shown, by way of example, as to correspond to the longitudinal half area of the chip.

Each LOC lead frame and the surface of the chip are connected by using a film-shaped insulator inbetween through an adhesive, for example. As a result, each lead is extended from the longer side of the chip and is bent from a predetermined portion at a right angle with respect to the length of the chip, as shown. By adopting this LOC lead frame, the bonding pads to be fed with a signal are wire-bonded to the common LOC lead frame. In this case, the wires used are coated with insulators so as to prevent the electric contact with another LOC lead frame.

In the remaining half, too, the bonding pads corresponding to the memory block are equipped for similar connections with the LOC leads axially symmetrically with the aforementioned LOC lead frame. In this structure, this LOC lead frame is commonly connected with the bonding pads to be fed with the common signal. In this embodiment, therefore, the signal transmission path is constructed such that the LOC lead frame is a part of the wiring lines of the semiconductor integrated circuit device. The LOC lead frame can drop the wiring resistance more than the signal lines formed in the semiconductor integrated circuit device so that the operations can be highly speeded up.

The aforementioned LOC lead frame should not be limited only to a method in which the aforementioned film is sandwiched, but may be formed by another method in which leads are directly adhered to an insulator formed in advance on the surface (excepting the bonding pads) of the semiconductor chip, or in which the lead frame itself is covered with a molding resin or the like, except its portion to be bonded, and is applied to the surface of the semiconductor chip.

Incidentally, a portion of the internal bus shown in FIG. 2 may be replaced by the LOC lead frame. In this case, the signals are divided into address signals for selecting the memory blocks and address signals to be commonly fed to the individual memory blocks. The address signals to be fed to the individual memory blocks are fed by the use of the aforementioned LOC lead frame to the bonding pads which are arranged close to the individual memory blocks. On the other hand, the address signals for selecting the memory blocks are fed to the bonding pads which are arranged close to the aforementioned control circuit CONT2. Moreover, the data input output paths are also connected with their bonding pads of the individual memory blocks by the use of the aforementioned LOC lead frame. Thanks to the adoption of this structure, it is possible to achieve the aforementioned simplification of the system and to realize the speed-up of the operations.

Figure 5A:
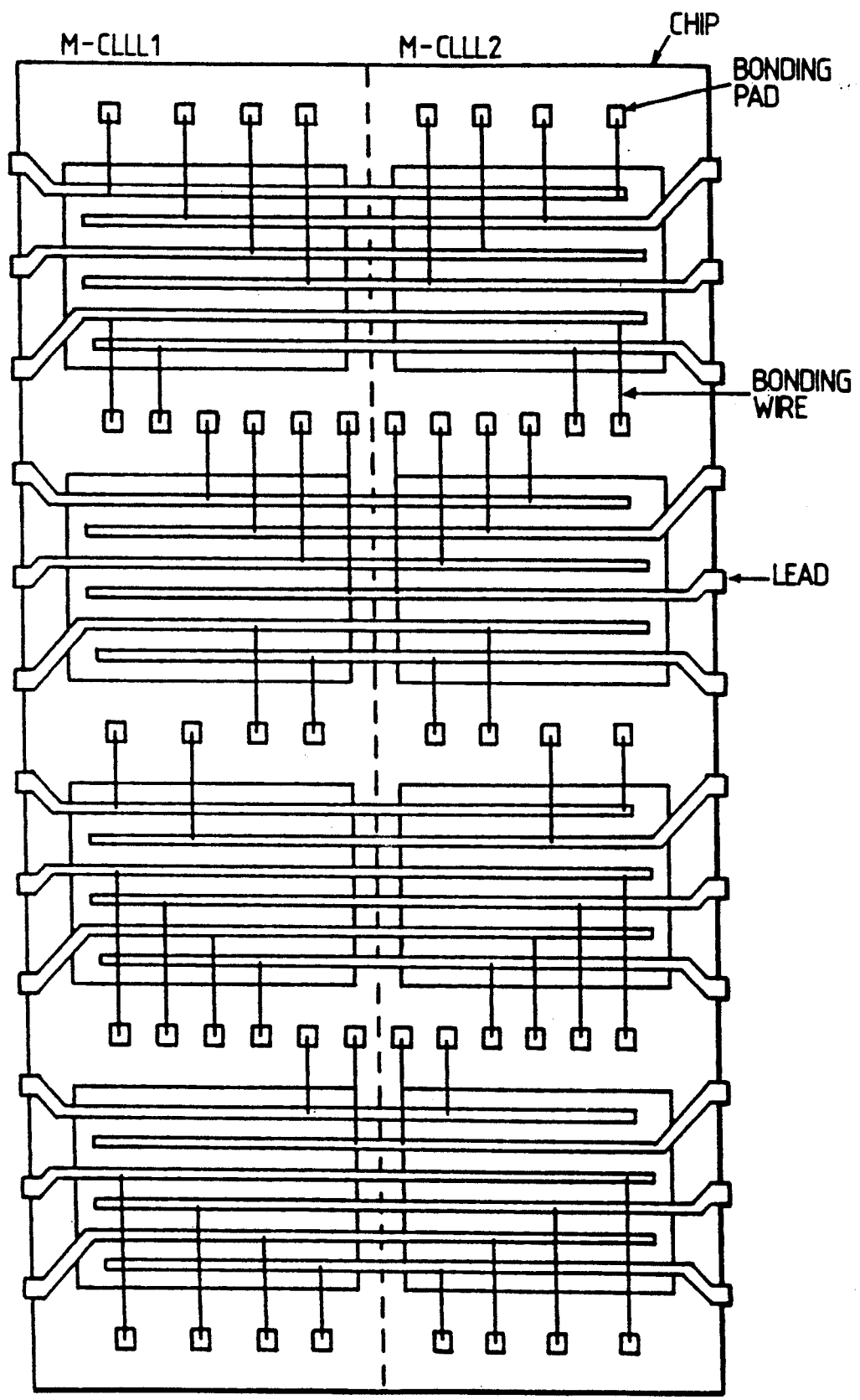
Figure 5B:
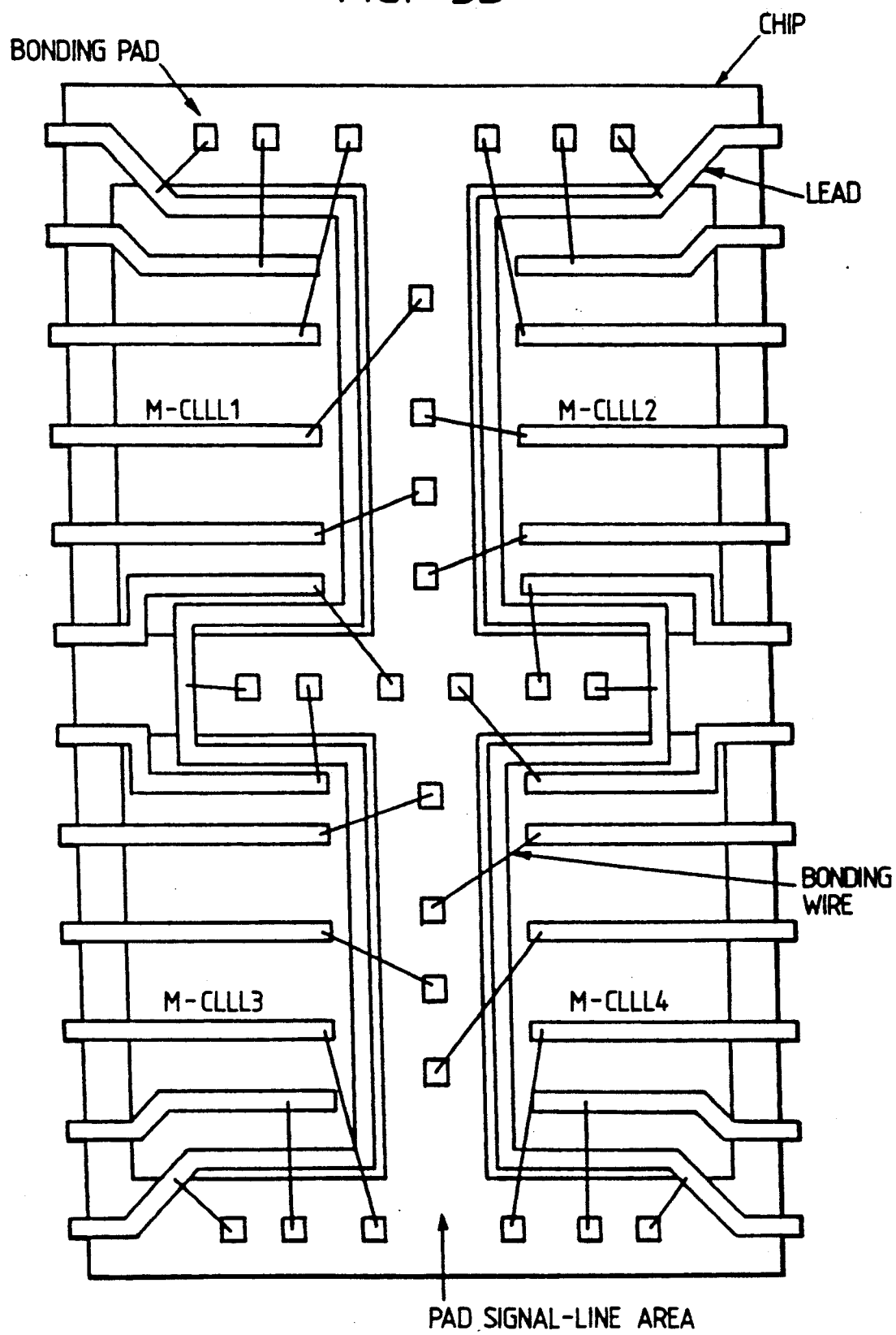

FIGS. 5A to 5C present schematic patterns showing other embodiments of the aforementioned semiconductor chip and the LOC lead frame.

FIG. 5A shows an embodiment, in which the LOC lead frame is arranged in the shorter direction of the semiconductor chip. FIG. 5B shows another embodiment, in which the LOC lead frame is extended from the longer sides of the semiconductor chip to the central portion of the semiconductor chip. FIG. 5C shows a further embodiment in which the LOC lead frame is two-layered so that more LOC leads may be formed on the chip surface. Thus, the patterns of the LOC lead frame can have a variety of modes of embodiment in accordance with the arrangements of the bonding pads.

Figure 6:
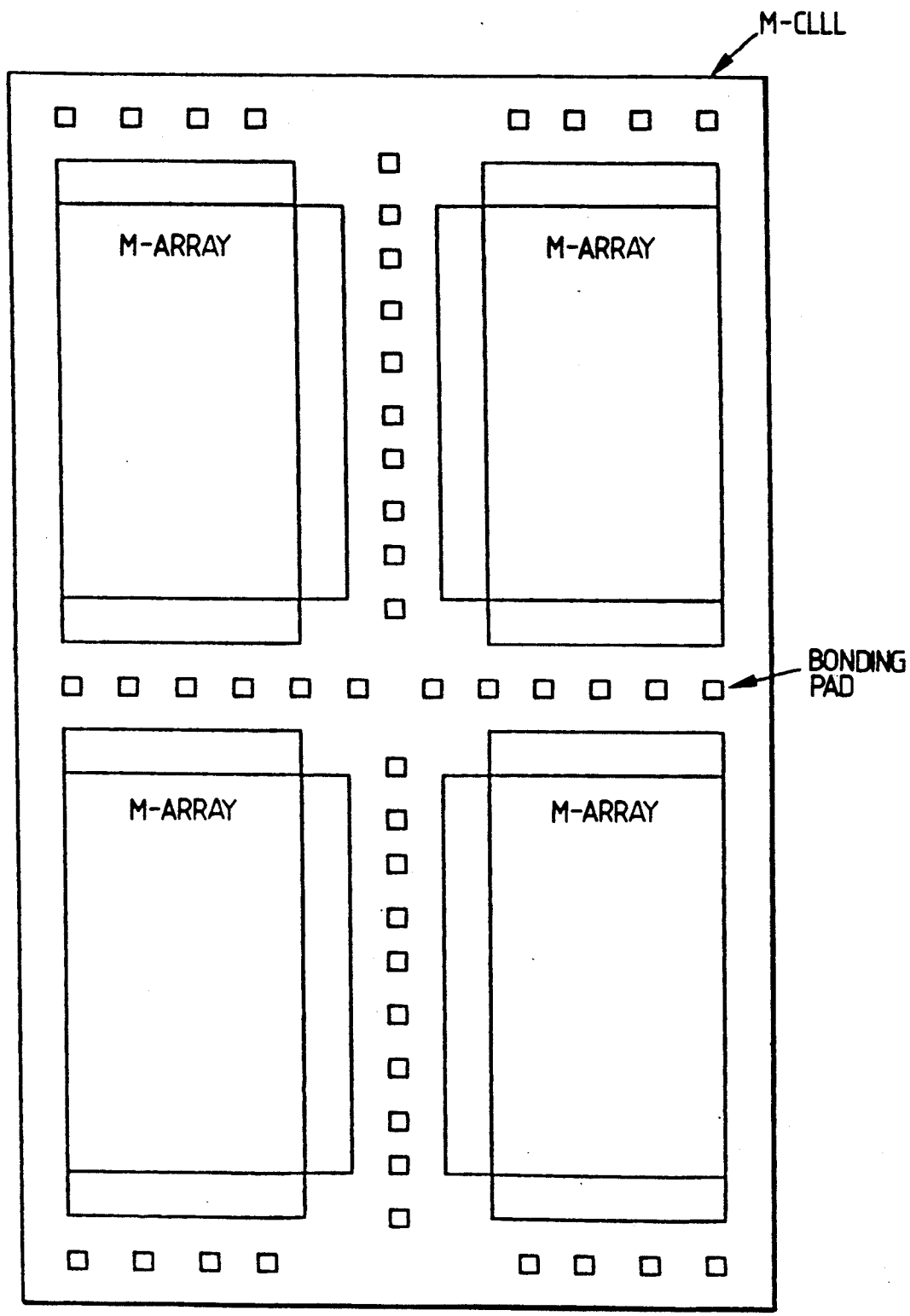
FIG. 6 is an arrangement diagram showing the bonding pads according to another embodiment of the macro-cellulated memory blocks according to the present invention.

FIG. 6 is a diagram showing the arrangement of the bonding pads according to another embodiment on the macro-cellulated memory blocks according to the present invention.

In this embodiment, the aforementioned four memory blocks of two rows and columns are grouped into one memory group, which is arranged at its peripheral portion with the bonding pads. In this embodiment, the bonding pads are arranged close to the individual circuits so as to shorten the wiring lines from the bonding pads to the internal circuit. Of the bonding pads, therefore, the bonding pads formed in a region defined between the two memory blocks can be commonly used for the two memory blocks, but the remaining bonding pads are provided for the individual memory blocks. In order to use the aforementioned bonding pads commonly, therefore, the layout of the internal circuit of the aforementioned four memory blocks may desirably be arranged axially symmetrically with respect to the longitudinal and transverse axes of the cross enclosed by the aforementioned memory blocks.

Figure 7:
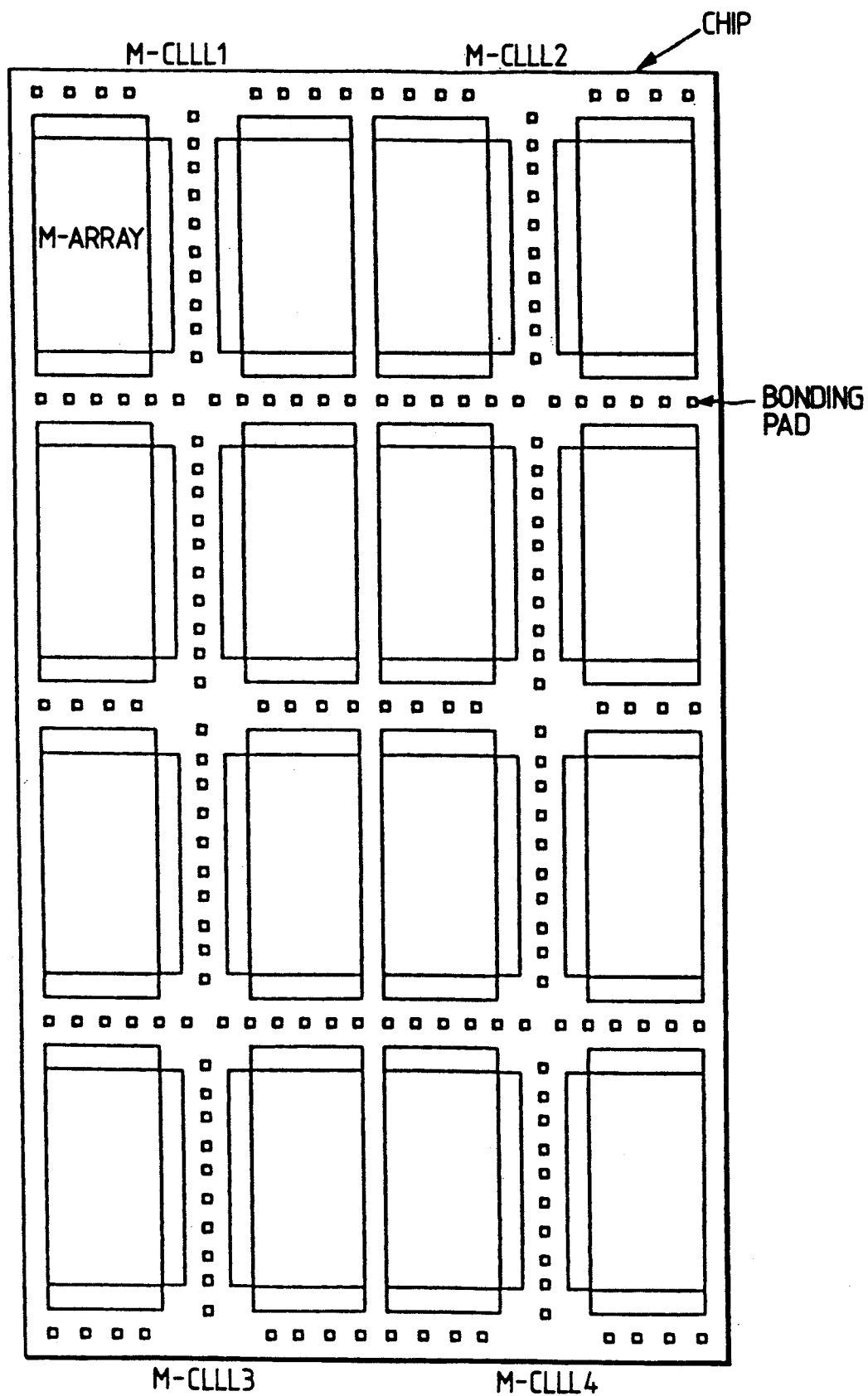
FIG. 7 is a fundamental layout diagram showing one embodiment of the semiconductor integrated circuit device using the memory group of FIG. 6.

FIG. 7 is a layout showing one embodiment of the semiconductor integrated circuit device using the aforementioned memory group shown in FIG. 6.

In FIG. 7, the aforementioned four memory groups are arranged in two rows and two columns. In this case, the pads disposed in the large cross region sandwiched between the four memory groups are commonly used in the adjacent memory blocks of the two memory groups interposing them axially symmetrically. Thus, it is possible to reduce the number of bonding pads. In this case, it becomes necessary to arranged the individual memory groups axially symmetrically with respect to the longitudinal and transverse axes constituting the aforementioned cross region. This is because the corresponding internal circuits are constructed close to the aforementioned common bonding pads.

Since the data are inputted to and outputted from the input/output nodes in the memory block, this block itself constitutes a closed circuit. In case, therefore, memory blocks having independent memory functions like this embodiment are macro-cellulated, the corresponding bonding pads take the structure in which the bonding pads to be fed with a signal are merely connected by making use of the LOC lead frame.

In the aforementioned control circuits CONT1 and CONT2 shown in FIG. 2, on the contrary, the input signals are logically processed in the internal logic circuit before they are outputted. Therefore, the input unit, the logic circuit and the output unit are arranged in accordance with the flow of signals. Therefore, let the case be considered in which the memory blocks are replaced or in which one semiconductor integrated circuit device is constructed by macro-cellulating the aforementioned plural memory blocks, their control circuits and the logic circuits such as logic units for generating data to be stored in the memory blocks. In this case, the LOC lead frame can be utilized as a part of the wiring line connecting the macro cells like before. In this structure, more specifically, the LOC lead frame is equipped with not only the ordinary leads but also leads acting as the internal wiring lines not to be connected with external terminals. In other words, the lead frame acting as the internal wiring lines is finally packaged in a package and is shielded from the outside. In the DRAM of the structure of FIG. 2, for example, the refresh address signals, the block selection signal and so on to be transmitted from the control circuit CONT2 to the individual memory blocks may make use of the LOC lead frame in place of the internal signal bus CB. In this case, the lead may desirably be made of two layers, one of which is used as a wiring line for connecting the internal macro cells, so that it may be distinguished from the lead connected with the external terminal. Thanks to the adoption of this structure, it is possible to reduce the power consumption and to speed up the operations. In other words, the reduction in the power consumption can be achieved by activating only the memory block in which the memory cell to be selected is present. In this case, for the high-speed accesses, the block selection signals have to be transmitted prior to the address signals which are fed to the individual memory blocks. Since the block selection signals can be transmitted at a high speed through not the internal bus but the LOC lead frame to the individual memory blocks, as has been described hereinbefore, it is possible to realize both the reduction in the power consumption and the high-speed operations.

Figure 8:
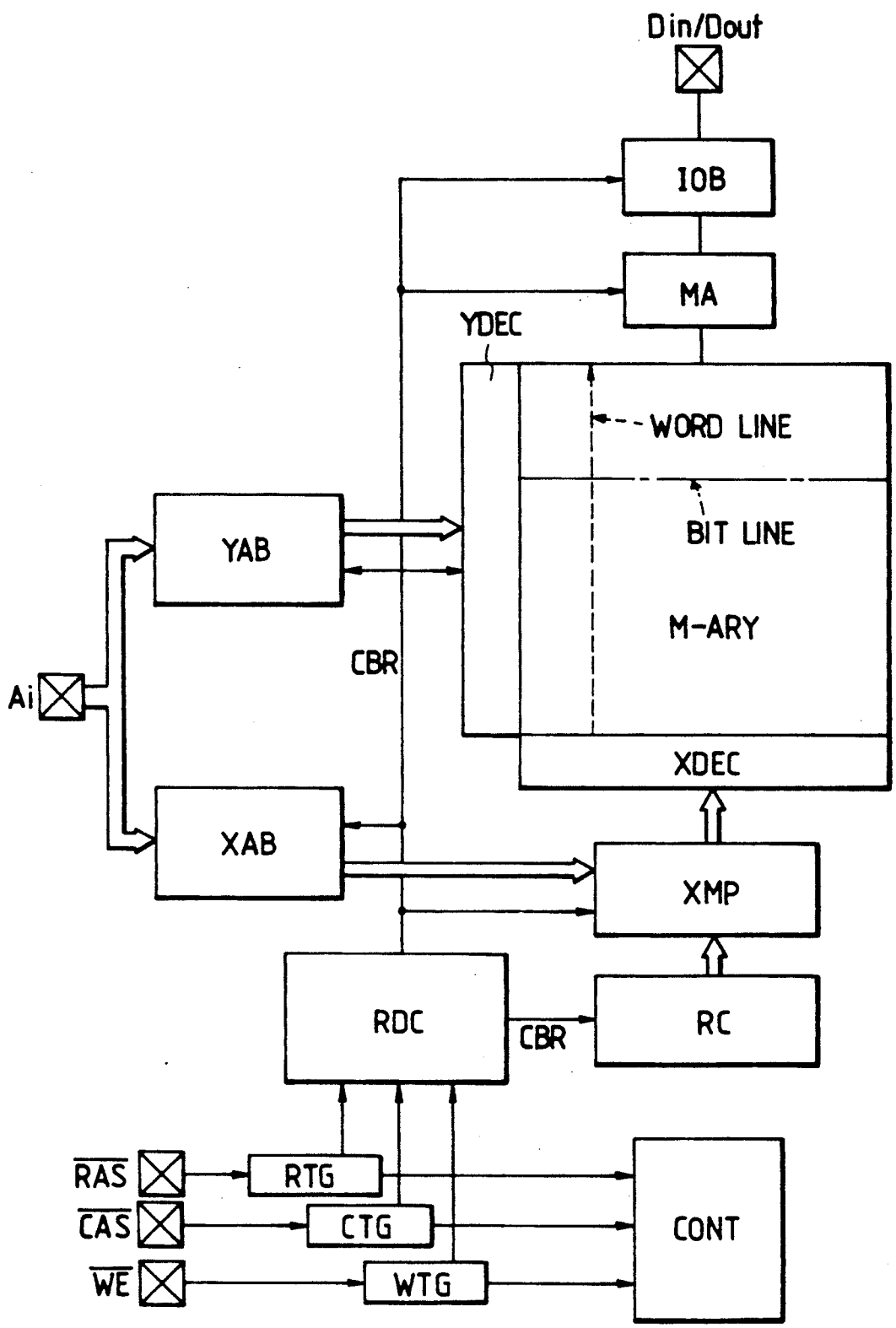
FIG. 8 is a block diagram showing one embodiment of one memory block to be macro-cellulated.

FIG. 8 is a block diagram showing one embodiment of one memory block and a portion of an in-chip common circuit to be macro-cellulated.

A memory array M-ARY is made to have 2,048 X-addresses and 2,048 Y-addresses and accordingly a total storage capacity of about 4 Mbits. In FIG. 8, 2,048×2,048 memory cell arrays are arranged, but are divided, as a matter of fact, into a plurality of memory mats so as to shorten the word lines and the bit lines (e.g., data lines or digit lines). Each memory cell is composed of an address selecting MOSFET and an information storing capacitor, as will be described hereinafter. The aforementioned address selecting MOSFET has its gate connected with the word line extending in the longitudinal direction, as shown in FIG. 8. The input/output node or drain of the address selecting MOSFET is connected with the bit line extending in the transverse direction, as shown in FIG. 8.

The aforementioned word line is selected by the driver on the basis of the selection signal which is generated by an X-decoder XDEC. The driver is coupled to a number of memory cells and has a relatively large current drivability for driving at a high speed the word lines having a relatively large load capacity. The aforementioned bit lines are selected on the basis of the selection signals which are formed by a Y-decoder YDEC. Specifically, this Y-decoder YDEC forms a selection signal for selecting a column switch circuit for connecting the bit lines with a common input/output line.

The bit lines are equipped with sense amplifiers for amplifying the read signals of the memory cells. In the dynamic memory cell, the stored charges in the storage capacitor are lost by the charge share with the parasitic capacity of the bit lines, when the address selection MOSFET is turned ON to connect the capacitor with the bit line. However, the charge in the storage capacitor is restored by receiving the amplified output of the aforementioned sense amplifier as it is. The shown memory array M-ARY includes the aforementioned sense amplifier and column switch circuit. The memory array M-ARY is further equipped with precharge circuits for the bit lines and word clear circuits disposed at the ends of the word lines.

Those of the address signals fed from the outside, which are inputted in synchronism with the row address strobe signal $\overline{RAS}$, are introduced into the X-address buffer XAB. The output signal of the X-address buffer XAB and the address signal formed by a refresh address generator RC are selectively fed through a multiplexer XMP to the X-decoder XDEC. In the normal mode, the address signal introduced into the X-address buffer XAB is fed through the multiplexer XMP to the X-decoder XDEC. In the refresh mode, the address signal formed by the refresh address generator RC is fed through the multiplexer XMP to the X-decoder XDEC.

Those of the address signals fed from the outside, which are inputted in synchronism with the column address strobe signal $\overline{CAS}$, are introduced into the Y-address buffer YAB. The output signal of this Y-address buffer YAB is fed to the Y-decoder YDEC.

The row address strobe signal $\overline{RAS}$ fed from the outside is fed to a row timing circuit RTG. The column address strobe signal $\overline{CAS}$ fed from the outside is fed to a column timing circuit CTG. The write enable signal $\overline{WE}$ fed from the outside is fed to a timing circuit WTG. The timing signals formed by those row timing circuits RTG and CTG are fed to the X-address buffers XAB and YAB, although not shown, so that they are used to take the address signals.

The output signals of the aforementioned individual timing circuits RTG, CTG and WTG are fed to a control circuit CONT, in which internal operation timing signals are formed in accordance with the operation modes judged by the an operation mode decision circuit RDC. The paths for these timing signals are omitted from FIG. 8.

The timing signals formed by the aforementioned timing circuits RTG, CTG and WTG are fed to the operation mode decision circuit RDC. In order to reduce the power consumption in the refresh mode, according to this embodiment, the aforementioned multiplexer XPM is switched in response to the signal CBR, and the individual column circuits such as the Y-address buffer YAB, the Y-decoder YDEC, the main amplifier MA and the data input/output circuit IOB are rendered inoperative if the refresh mode is decided. Since the X-decoder XDEC is fed with the address signal from the refresh address generator RC, as has been described hereinbefore, the X-address buffer XAB is rendered inoperative.

If the dynamic RAM is in the refresh mode in the information processing system to be packaged with the dynamic RAM of this embodiment, the address signal is fed to the address bus so that the processor may access another memory device or the peripheral device. Then, it is prevented by the aforementioned signal CBR for the input circuit of the address buffer to cause the current consumption. In the dynamic RAM of the prior art having the large storage capacity, the column circuit is operated to confirm the operations of the refresh address counter circuit so that the storage information of the memory cell to be refreshed may be sequentially read out to the outside by selecting the bit lines when in the refreshing operation.

In the dynamic RAM of this embodiment, on the contrary, the aforementioned individual peripheral circuits having no relation to the intrinsic refreshing operation are rendered inoperative in the refresh mode so as to reduce the power consumption. As a result, the memory cells of more bits can be simultaneously refreshed in one refresh cycle.

If the method of the prior art is adopted as it is in the case of the large storage capacity of about 64 Mbits, for example, in one refresh cycle, the refresh operation can be accomplished for the memory cells of about 8 Kbits, which are connected with the word lines designated in terms of the X-addresses. In this structure, it takes as many as about 8 Kcycles for all the memory cells of the RAM to be completely refreshed.

In This embodiment, the current consumption in the peripheral circuit is reduced, as described above, so that the refreshing operation may be executed from about 4 Kcycles like the dynamic RAM of about 16 Mbits. The spared current is applied to the charging and discharging currents of the bit lines by the sense amplifier so that a number of memory cells of about 16 Kbits may be refreshed in one refreshing operation.

This refreshing system can naturally be applied to not only the dynamic RAM composed of a plurality of macro-cellulated memory blocks like the foregoing embodiment but also the dynamic RAM of the prior art, in which the memory cell array is suitably divided into mats so that the peripheral circuits such as the decoders or the address buffers are suitably laid out.

Figure 9:
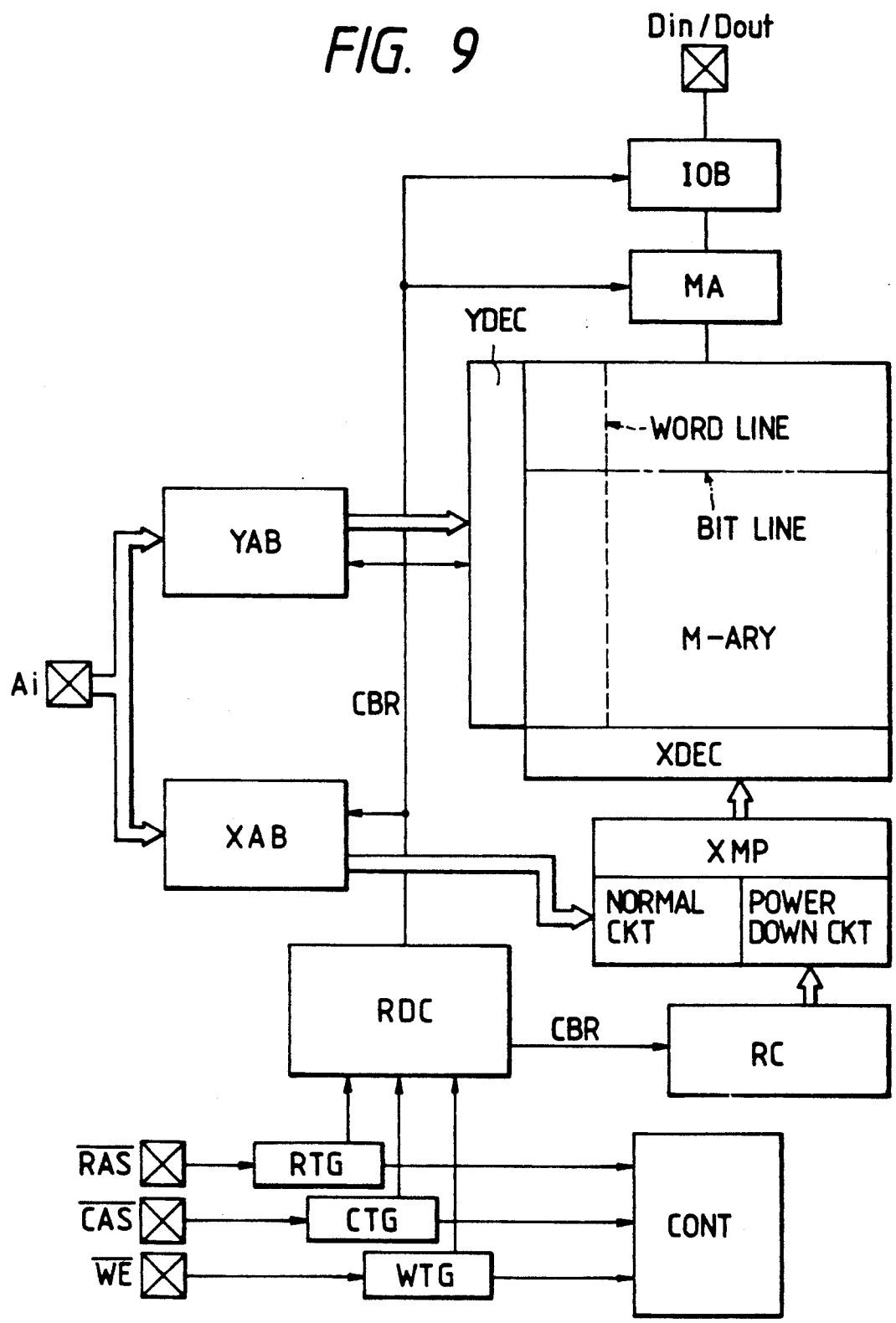
FIG. 9 is a block diagram showing another embodiment of the memory block to be macro-cellulated.

FIG. 9 is a block diagram showing the aforementioned macro-cellulated one memory block and another embodiment of a portion of a chip common circuit.

In this embodiment, the following normal circuit and power down circuit are provided in the row selection circuit in addition to the block diagram of the aforementioned embodiment shown in FIG. 8.

Although the description has an overlap with that of the embodiment of FIG. 8, the circuit blocks of FIG. 9 will be described in the following.

A memory array M-ARY is made to have 2,048 X-addresses and 2,048 Y-addresses and accordingly a total storage capacity of about 4 Mbits, although not especially limited thereto. In FIG. 9, 2,048×2,048 memory cell arrays are arranged, but are divided, as a matter of fact, into a plurality of memory mats so as to shorten the word lines and the bit lines.

The aforementioned word line is selected by the word line driver on the basis of the selection signal which is generated by an X-decoder XDEC. The word line driver is coupled to a number of memory cells and drives at a high speed the word lines having a relatively large load capacity. The aforementioned bit lines are selected by a column switch circuit on the basis of the selection signals which are formed by a Y-decoder YDEC.

The bit lines are equipped with sense amplifiers for amplifying the read signals of the memory cells. The shown memory array M-ARY includes the aforementioned sense amplifier and column switch circuit. The memory array M-ARY is further equipped with precharge circuits for the bit lines and word clear circuits disposed at the ends of the word lines.

Those of the address signals fed from the outside, which are inputted in synchronism with the row address strobe signal $\overline{RAS}$, are introduced into the X-address buffer XAB. In this embodiment, the output signal of the X-address buffer XAB is fed to the normal circuit for effecting the further power-down and the reduction in the peak current in the refresh mode. The address signal formed by the refresh address generator RC is fed to the power down circuit. The aforementioned normal circuit and power down circuit have their output portions equipped with the multiplexer XMP, whose operation mode controls the feed to the X-decoder XDEC.

Those of the address signals fed from the outside, which are inputted in synchronism with the column address strobe signal $\overline{CAS}$, are introduced into the Y-address buffer YAB. The output signal of this Y-address buffer YAB is fed to the Y-decoder YDEC.

The row address strobe signal $\overline{RAS}$ fed from the outside is fed to a row timing circuit RTG. The column address strobe signal $\overline{CAS}$ fed from the outside is fed to a column timing circuit CTG. The write enable signal $\overline{WE}$ fed from the outside is fed to a timing circuit WTG. The timing signals formed by those row timing circuits RTG and CTG are fed to the X-address buffers XAB and YAB, although not shown, so that they are used to take the address signals.

The output signals of the aforementioned individual timing circuits RTG, CTG and WTG are fed to a control circuit CONT, in which internal operation timing signals are formed in accordance with the operation modes judged by the operation mode decision circuit RDC. The paths for these timing signals are omitted from FIG. 9.

The timing signals formed by the aforementioned timing circuits RTG, CTG and WTG are fed to the operation mode decision circuit RDC. In order to reduce the power consumption in the refresh mode, according to this embodiment, the aforementioned multiplexer XMP is switched in response to the signal CBR, and the individual column circuits such as the Y-address buffer YAB, the Y-decoder YDEC, the main amplifier MA, the data output circuit and the X-address buffer XAB are rendered inoperative like before if the refresh mode is decided. Moreover, the multiplexer XMP is switched like before. This reduces the current to be consumed for the selections of the word lines in the refreshing operation and for the amplifications of the sense amplifier. Also reduced are the peak currents for the word line selecting operations and the sense amplifier amplifying operations. In FIG. 9, more specifically, the signals having passed through the power down circuit are fed to the X-decoder XDEC. As a matter of fact, however, it should be understood that the power down circuit (including the word line driver) and the normal circuit are integrated with the X-decoder XDEC. In the X-decoder circuit, more specifically, row inverter circuits having their drivabilities increased by the normal circuit are provided to drive a relatively large capacitative load. In this case, the inverter circuits such as the output inverter circuits for the high drive currents are rendered inoperative so that the aforementioned capacitative loads are driven by the inverter circuits having relatively small drive currents at their inputs. Moreover, the drivers for driving the word lines at a high speed are also rendered inoperative so that the word lines are driven by the word line drivers having a relatively small drivability. Therefore, the multiplexer XMP may use either not only the logic gate circuit disposed at the aforementioned decode unit and the output unit of the driver but also the clocked inverter or the tri-state output functions including the output high-impedance states to switch the aforementioned current drivability in accordance with various modes of embodiments.

As a result, it is possible to reduce the current consumption for the selection circuit and the sense amplifier driver for selecting the word lines for the refreshing operations. As a result, the current consumption in the refresh mode is reduced so that the peak current value is accordingly dropped. By applying this reduction in the current to the charge and discharge currents of the bit lines for the refreshing operations, moreover, more memory cells can be refreshed in one refreshing operation. In other words, the refreshing operation with about 2 K cycles can be finished.

If the X-decoder operating current or the word line driving current is reduced, as described above, the actual selection of the word lines is accordingly delayed. In the refresh mode of this embodiment, however, the stored information of the memory cell selected by the refreshing operation need not be outputted to the outside, but only the word selections and the sense amplifier amplifications may be accomplished. Thus, since the whole period of one memory cycle can be applied to the aforementioned word line selections and sense amplifier amplifications, there arises no problem even if the aforementioned power down circuit is used.

This refreshing system can naturally be applied to not only the dynamic RAM composed of a plurality of macro-cellulated memory blocks like the foregoing embodiment but also the dynamic RAM of the prior art, in which the memory cell array is suitably divided into mats so that the peripheral circuits such as the decoders or the address buffers are suitable laid out.

Figure 10:
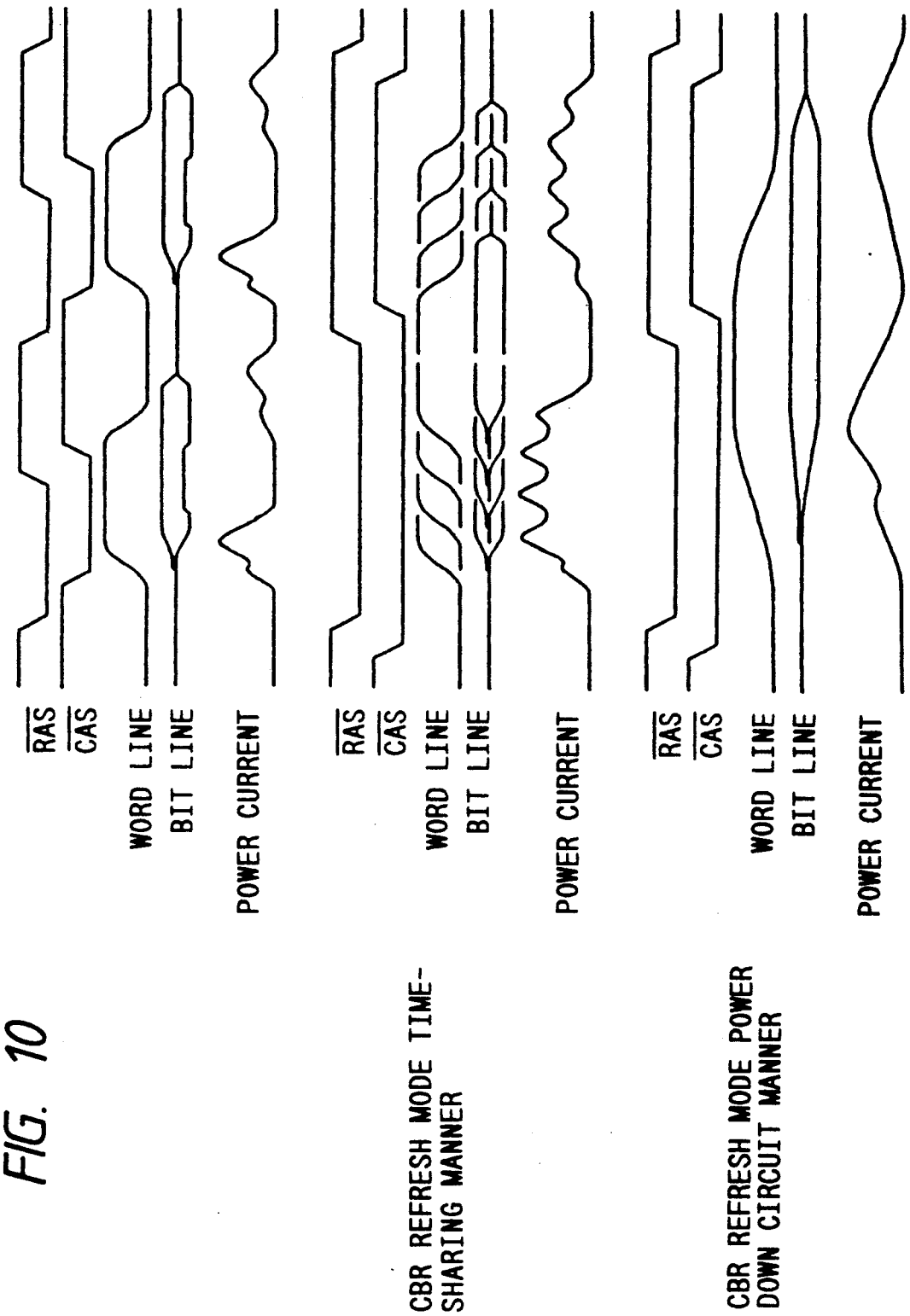
FIG. 10 is a schematic waveform chart for explaining the refreshing operations.

FIG. 10 is a schematic waveform diagram of the aforementioned DRAM.

In the normal mode, the row address strobe signal $\overline{RAS}$ takes the low level so that the row address signals are accordingly fetched to select the row lines. In this case, the peak current flows when in the word line selecting operation or the operation of the sense amplifiers.

In the CBR mode (i.e., refresh mode), on the contrary, the word lines of four times as many as those of the aforementioned normal mode are selected, and the word line selecting operations are accomplished in the time-sharing manner to reduce the peak currents. Then, the current peak value can be substantially equalized to that of the aforementioned normal mode.

If, on the other hand, the aforementioned power down circuit is used to restrict the word line selecting operations an the current of the sense amplifiers, the peak current value can be substantially equalized to that of the normal mode although the four word lines and the corresponding four sense amplifiers are operated.

In either of the refresh cases, however, the total current consumptions are likewise four times as much as that of the normal mode.

Figure 11:
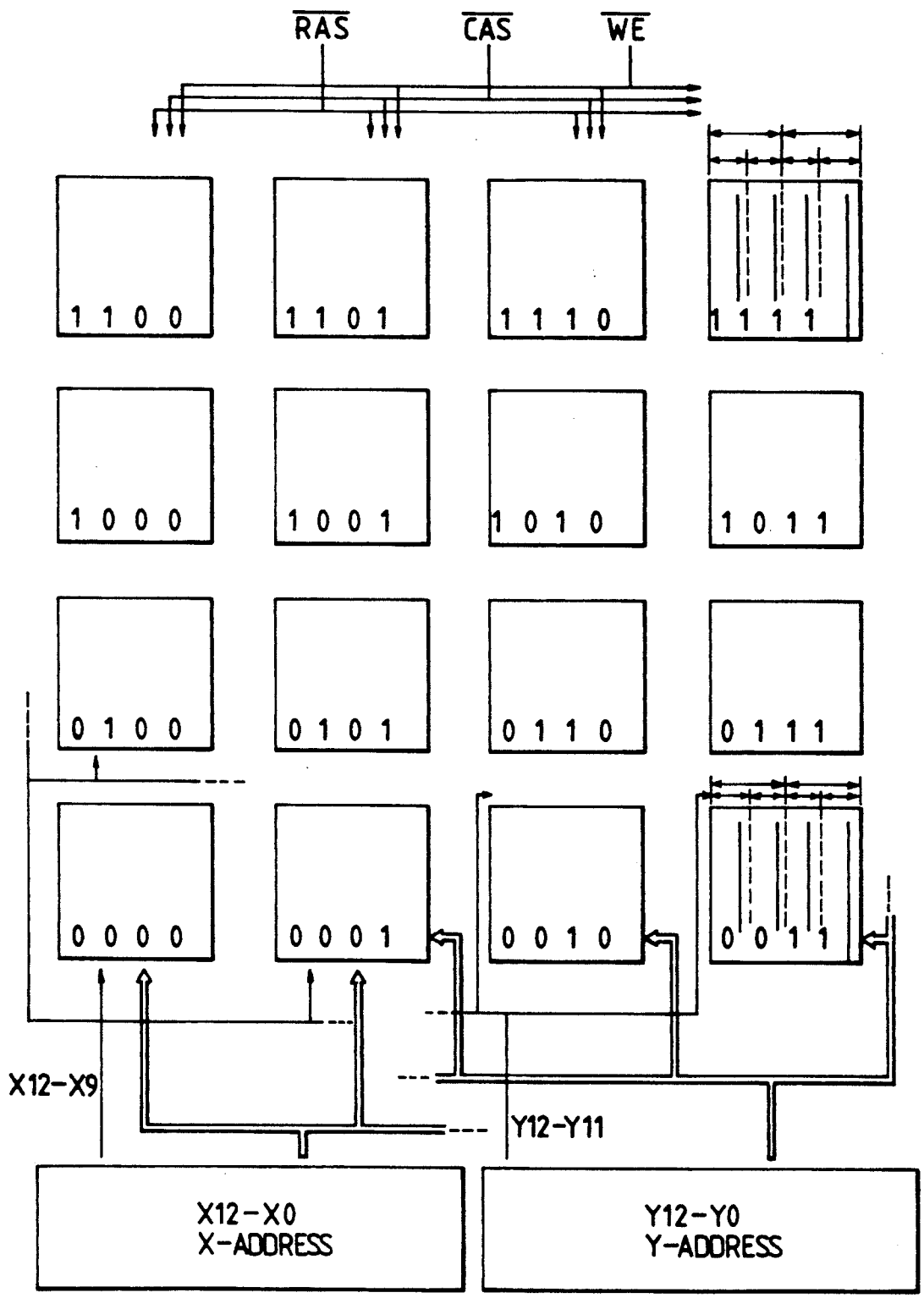
FIG. 11 is a block diagram for explaining one embodiment of the address assignment of RAM in the embodiment of FIG. 3.

FIG. 11 is a block diagram for explaining one embodiment of the address assignment of the dynamic RAM shown in FIG. 3.

In this embodiment, in order to activate only one memory block that is macro-cellulated to spare the power consumption, although not especially limited thereto, the address signals X9 to X12 of the more significant four bits are used to assign the addresses, as indicated by binary numbers (0000) to (1111), to FIG. 11. For the totally sixteen memory blocks arranged in 4×4, more specifically, the row addresses are designated at X9 and X10, and the column addresses are designated at X11 and X12.

On the other hand, each memory block has a storage capacity of 2,048 bits ×2,048 bits, as has been described hereinbefore. In case the X-addresses of 4 bits are used, therefore, the address signals assigned to one memory block is as few as X0 to X8 of 9 bits. Therefore, what is designated by the aforementioned addresses X0 to X8 is 1/512 addresses. Thus, one memory block is quartered to have four memory areas, each of which has its one word line selected by the aforementioned address signals X0 to X8, so that four word lines are simultaneously designated all over one memory block. As a result, the memory cells of 2,048×4 bits are selected by the selecting operations of the row (X) system.

The aforementioned four memory areas are selected with Y-address signals Y11 and Y12 of the more significant 2 bits. Specifically, the memory areas of the memory block are sequentially assigned from their lefthand side with addresses of binary numbers (00, 01, 10 and 11) by the Y-address signals Y11 and Y12 of 2 bits.

Moreover, the address selection of 1/2,048 is accomplished from one word line of one memory area of the aforementioned designated one memory block by the remaining Y-address signals Y0 to Y10 of the remaining 11 bits.

In this structure, only one macro-cellulated memory block is activated by using the row address signals fed in advance of the row and column address signals which are fed in time-series in response to the row address strobe signal $\overline{RAS}$ and the column address strobe signal $\overline{CAS}$. Since only one memory block is activated, this structure can have its power consumption reduced. In case the X-addresses and Y-addresses of 2 bits are assigned to one memory block, four memory blocks have to be activated in the row selecting operations. With this address assignment of this embodiment, on the contrary, only one memory block is activated so that the current consumption in the circuits such as the address buffer or the decoder can be reduced to about one quarter. Since the numbers of the sense amplifiers or the word lines are equal between the cases in which the four memory blocks are activated and in which only one memory block is activated as in this embodiment, there is theoretically no reduction in the current consumption.

In FIG. 11, the assignments of addresses are explained, but it should be noted that the aforementioned 2,048 memory cells are not connected with one word or bit line formed in the practical memory blocks. Specifically, the word lines and bit lines formed in each of the memory blocks macro-cellulated for the high-speed operations are divided into plural memory mats as in the known dynamic RAM of about 4 Mbits. From the address selecting operations, however, the memory cells of the aforementioned number are selected for the specific address designation.

For the address assignments of the memory blocks, as described above, it is arbitrary to use the X (row) address signals or to create new Z-address signals. For these Z-address signals, the timing of the SCBR can be used, although not especially limited thereto. Specifically, the column address strobe signal $\overline{CAS}$ and the write enable signal $\overline{WE}$ are held at the low level when the row address strobe signal $\overline{RAS}$ is changed from the high to low levels. The address signals thus fed at that timing are introduced as the Z addresses to the inside so that they may be used for designating the aforementioned memory blocks.

In case the WCBR is used for the aforementioned counter test mode or the like, the write enable signal $\overline{WE}$ is set to the low level, during the precharge period for which the row address strobe signal $\overline{RAS}$ is at the high level, so that the address signals fed then may be introduced as the Z-address signals. In another of various modes of embodiment, the Z-address signals may be fed from the data terminals in synchronism with the changes of the row address strobe signal $\overline{RAS}$ from the high to low levels. By thus creating those Z-address signals, one memory block need not be divided into four memory areas, as in the foregoing embodiments. In accordance with this, the number of word lines to be selected and the number of sense amplifiers to be operated can e reduced in one memory block to be activated, so that the power consumption can be made lower than that in case the aforementioned X-address signals are used.

Figure 12:
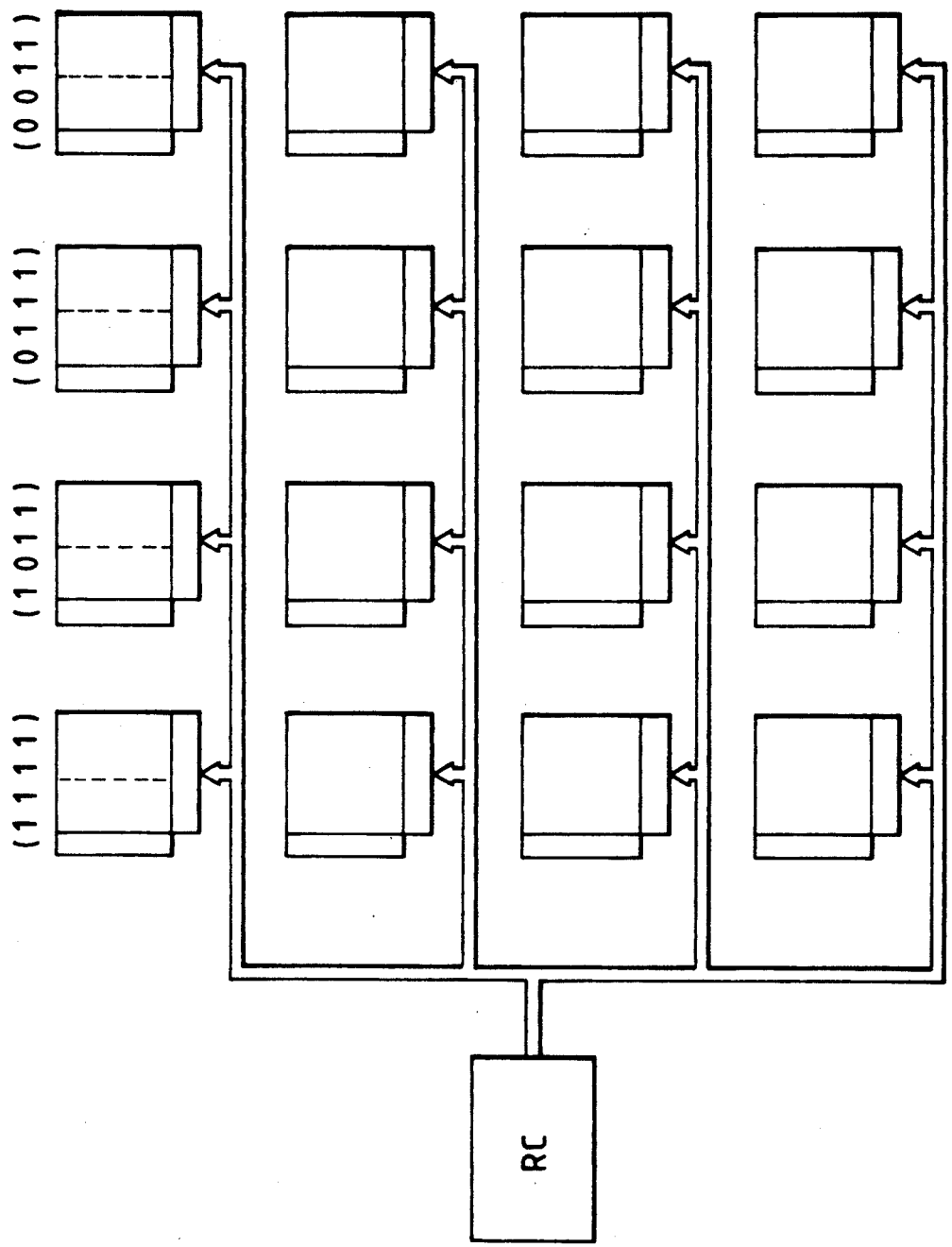
FIG. 12 is a block diagram for explaining one embodiment of the refreshing operations of the dynamic RAM according to the present invention.

FIG. 12 is a block diagram for explaining one embodiment of the refreshing operation of the dynamic RAM having the aforementioned structure.

In order to simplify the circuit, according to this embodiment, the refresh address counter RC is so shared that the address signals may be fed through the signal bus formed in the chip. By adopting this structure, the refreshing circuit can be shared to simplify the circuit structure. Since the refreshing operation requires no high-speed access, as has been described hereinbefore, there arises no problem even if the address signals are fed by using the internal bus having a relatively large delay time in the signal propagations.

In order to reduce the number of the refresh cycles, according to this embodiment, the X-addresses for designating the memory blocks are reduced by 2 bits, although not especially limited thereto. If the X-address signals X11 and X12 of the more significant 2 bits are reduced, for example, the refreshing operations, as indicated by broken lines, are effected in the four memory blocks designated by the address signals X9 and X10 of the less significant 2 bits, as shown.

In one memory block, the four word lines (2,048×4) are refreshed, as has been described hereinbefore. If the four memory blocks are refreshed as in this embodiment, the refreshing operations are effected in the memory cells of 2,048×4×4=32,768 bits by one refreshing cycle. In the dynamic RAM of about 64 Mbits, therefore, 2,048 cycles are consumed for completing the refresh of all the memory cells, as in this embodiment. Alternatively, the address signal X12 of the most significant bit of the refresh address signals formed by the refresh address counter RC is reduced. Then, the refreshing operations are accomplished for every two memory blocks so that the number of the refreshing cycles is 4,096. This is equal to the refreshing cycle number of the dynamic RAM having a storage capacity of about 16 Mbits being developed at present.

In order to reduce the refreshing cycle number, it is sufficient to increase the number of the memory blocks to be simultaneously refreshed. If, however, the number of the memory blocks to be simultaneously refreshed is thus increased, the number of sense amplifiers to be accordingly operated is increased to augment the current consumption. Thus, the current consumption of the memory blocks for the refreshing operations is reduced by rendering inoperative the column selection circuit, the data output circuit and the column address buffer, when in the refreshing operation of each memory block, as has been described hereinbefore, and by using the power down circuit having reduced the drive currents of the X-decoders or the drivers for the refreshing operations, as will be described hereinafter. Therefore, the number of memory blocks to be activated by one refreshing operation is selected from the balance between the reduction in the current consumption of the refreshing operation and the current increase due to the number of the memory blocks to be simultaneously refreshed. In the case of memory blocks of 4×4, as in this embodiment, the number of the memory blocks to be simultaneously refreshed may be not only the aforementioned 2 or 4 but also 8.

In order to reduce the peak current when in the refreshing operation, moreover, a shift may be caused between the individual memory blocks.

In the block diagram of FIG. 12, more specifically, the refreshing operations are to be accomplished in the four memory blocks indicated by broken lines. In this case, the refreshing operations, i.e., the timings of the word line drives and the sense amplifier operations are sequentially delayed with a time difference in the order of the memory blocks (1111), (1011), (0111) and (0011) near the refresh address counter RC. This time difference may make use of the signal propagation delay time of the refresh address signals to be fed through the internal bus to the individual memory blocks.

By the discrepancy in the operating timing among the aforementioned four memory blocks, it is possible to average the current consumptions in the refreshing operations. As a result, the current peak value necessary for refreshing (or rewriting) the memory cells of 2,048×4×4 bits simultaneously can be reduced to one quarter. As a result, the noises to be generated in the internal power-supply lines can be drastically reduced.

The aforementioned refresh address counter RC forms the memory block selections signal for designating the memory block to be refreshed and feeds it and the refresh address signal to the individual memory blocks through the aforementioned internal bus. In another structure, the refresh address counter may generate only the refresh address signal so that the memory block itself is equipped with the decoder for decoding the designation of the memory block.

Incidentally, the refresh mode is designated at the timing, in which the row address strobe signal $\overline{RAS}$ rises from the high to low levels, till the column address strobe signal $\overline{CAS}$ is at the low level (i.e., CAS before RAS). The circuit for deciding that refresh mode may be built in the aforementioned refresh address counter or in each memory block. In case, however, the aforementioned decision circuit is disposed in each memory block, its decision output is validated/invalidated by the decoder output of the memory block selection signal or a similar address signal. In the validated memory block only, the refresh address signal is introduced so that the according refreshing operation is accomplished. Incidentally, in the structure having the control circuit like that of the embodiment of FIG. 1, there is provided the aforementioned common operation mode decision circuit.

Figure 13:
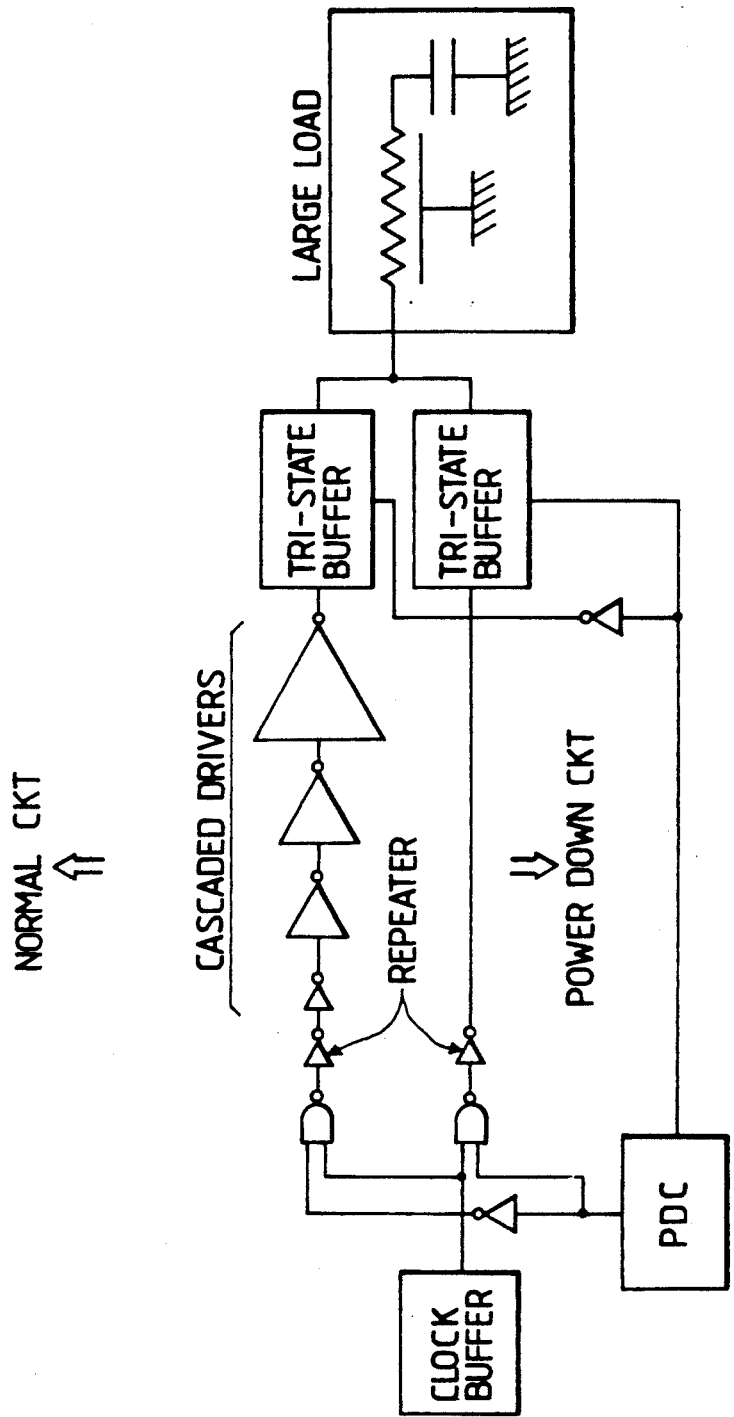
FIG. 13 is a schematic circuit diagram showing one embodiment of the power down circuit shown in FIG. 9.

FIG. 13 is a specific circuit diagram showing one embodiment of the power down circuit shown in FIG. 9.

At the side of the normal circuit, the CMOS inverters having their drivabilities enlarged sequentially are connected in cascade. On the other hand, the power down circuit is composed of one CMOS inverter having a small drivability. A change-over gate circuit and tri-state buffers are at the input and output sides of the aforementioned two circuits, respectively, and are switched by a power down control circuit PDC. In the CMOS circuit, the current is consumed in the CMOS circuit when in the charge up or discharge of the capacitative load when the output signals are changed. In this structure, therefore, when in the refresh mode, the multiple inverters having a large current drivabilities are held in their inoperative states, and only the inverters having small current drivabilities are operated so that the power down operations can be accomplished.

Incidentally, the shown loads are the word lines or the decoders. Therefore, the clock buffer CB acting as the signal source uses as its load the input capacitor of the address buffer and the X-decoder.

Figure 14:
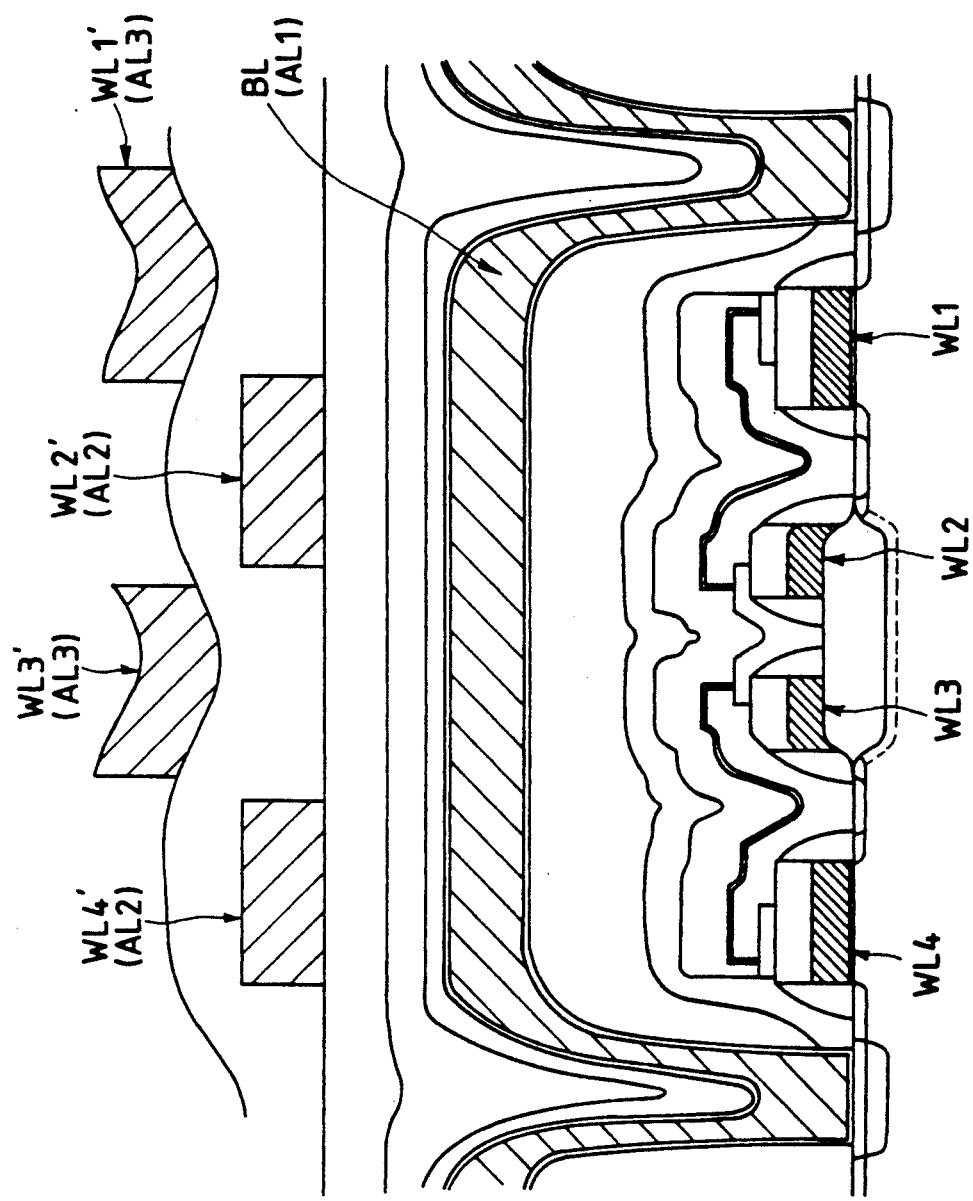
FIG. 14 is a section showing the element structure of one embodiment of the memory cell to be used in the dynamic RAM according to the present invention.

FIG. 14 is a section showing the element structure of one embodiment of the memory cell used in the dynamic RAM according to the present invention. FIG. 14 presents a section taken along the bit lines.

In order to increase the storage capacity of the dynamic RAM, it is necessary to make the circuit blocks common, as has been described, and to make the memory circuit itself dense. If the aforementioned memory blocks of FIG. 3 are identical to those of the known dynamic RAM of about 4 Mbits, the size of the semiconductor chip is about sixteen times as large as the semiconductor chip of the dynamic RAM of about 4 Mbits so as to construct the dynamic RAM of about 64 Mbits like this embodiment. Even if the large semi-conductor chip itself can be formed, the product is not attractive because the package is large-sized.

Therefore, one memory block itself has to be made far smaller than that of the known dynamic RAM having a similar storage capacity.

In this embodiment, therefore, the word shunting backing wiring lines for dropping the wiring resistances of the word lines, which raise one of the causes for obstructing the size reduction and the density increase of the memory cell array, are made of not one layer as in the memory cell array of the prior art, but of two layers. From the standpoint of the high density, the mere structure of the two layers has no meaning, but the adjacent word shunting wiring lines (or backing wiring lines) are made of different layers as in this embodiment. For example, a word shunting wiring line WL1', which is provided to correspond to a righthand word line WL1 made of a polysilicon layer integrally with the gate of the address selecting MOSFET, is made of a third aluminum layer AL3. A word shunting wiring line WL2', which is provided to correspond to a word line WL2 arranged at the lefthand adjacent side of the word line WL1, is made of a second aluminum layer AL2 which is formed below the aforementioned third aluminum layer AL3 through an inter-layer insulating film. Moreover, a word shunting wiring line WL3', which is provided to correspond to a word line WL3 arranged at the lefthand adjacent side of that word line WL2, is made of the aforementioned third aluminum layer AL3. Still moreover, a word shunting wiring line WL4', which is provided to correspond to a word line WL4 arranged at the lefthand adjacent side of that word line WL3, is made of the second aluminum layer AL2.

If the adjacent word shunting wiring lines are made of the different metallic layers through the inter-layer insulting film, there is required no space for insulating the adjacent wiring lines from each other. In other words, the word shunting wiring lines can be made highly dense without forming any space in the horizontal direction, as shown in FIG. 14. For the higher density, the adjacent word shunting wiring lines may be partially overlapped through the inter-layer insulating film.

Incidentally, in FIG. 14, a first aluminum layer AL1 is used to construct the bit lines. These bit lines may be made of silicide in place of the aforementioned aluminum layer AL1.

In case the bit lines are thus made of silicide, the word shunting wiring lines are made of the first and second aluminum layers. Alternatively, the bit lines are made of silicide, as described above, and the column selection lines extending in the same direction as that of the bit lines are made of the aforementioned first metallic layer whereas the aforementioned shunting wiring lines are made of second and third metallic layers. In the aforementioned structure in which the column selection lines are extended over the memory cell array in parallel with the bit lines, the Y-decoders are commonly used for the plural memory mats. In the structure having the Y-address decoder for each memory mat, therefore, the column selection lines can be made of the first metallic layer and the silicide.

Figure 15:
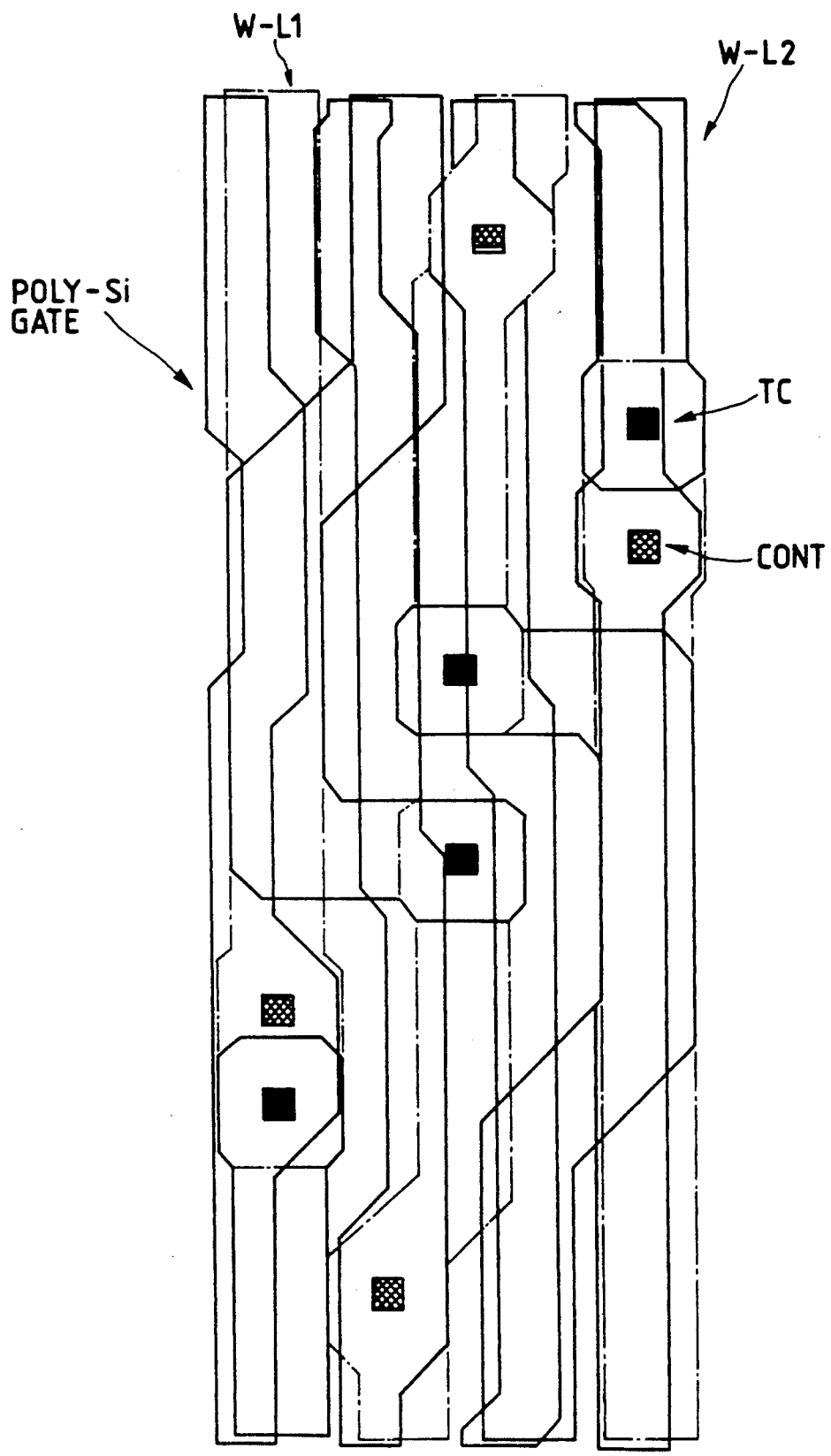
FIG. 15 is a pattern diagram showing one embodiment of the connection portions between the word lines and the word shunting wiring lines.

FIG. 15 is a diagram showing the pattern of one embodiment of the connecting portion between the aforementioned word lines and the word shunting wiring lines.

In FIG. 15, the thick single-dotted lines designate the word shunting wiring lines made of the aforementioned metallic layer, and the thick solid lines designate the word shunting wiring lines made of the aforementioned metallic layer. The solid squares designate through holes for vertically interchanging the word shunting wiring lines. The meshed squares designated word shunting contacts, at which the word lines made of polysilicon, as indicated by thin broken lines, are connected with the aforementioned word shunting wiring lines. By making the wiring pattern of this embodiment, there are formed the contact portions CONT between the word lines made of the polysilicon layer and the word shunting metallic layers formed over the former. By interchanging the upper and lower word shunting wiring lines by the use of the word shunting portions formed at a constant interval, moreover, the continuity at the contact portions is not lost to increase the density to a high level.

Figure 16:
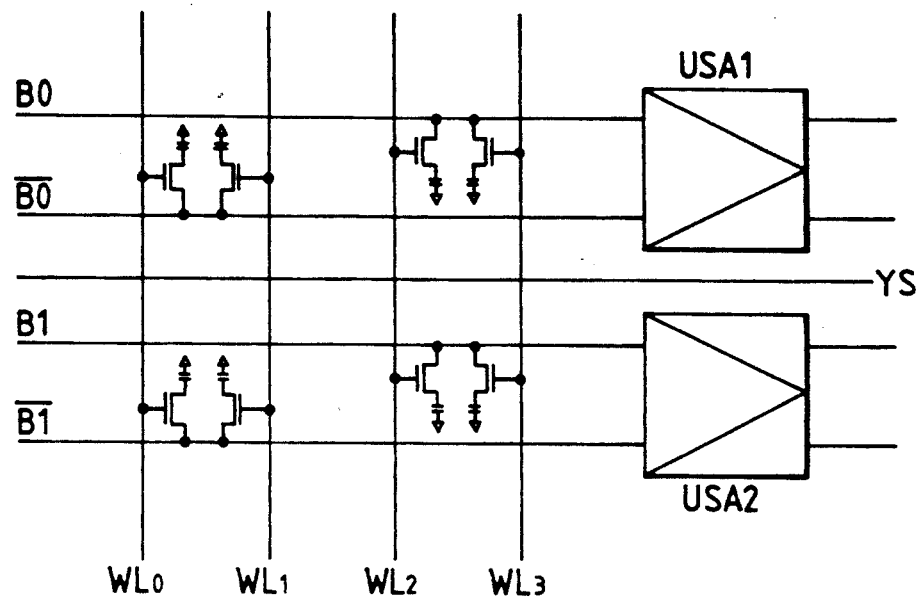
FIG. 16 is a schematic circuit diagram showing one embodiment of the memory cell array according to the present invention.

FIG. 16 is a schematic circuit diagram showing one embodiment of the memory cell array according to the present invention. In FIG. 16, there are shown, by way of example, two pairs of bit lines, sense amplifiers of corresponding units, and one parallel column selecting line, and four word lines.

In this embodiment, unit sense amplifiers USA1 and USA2 are arranged at one side (i.e., righthand side, as shown) of the bit line pairs B0 and $\overline{B0}$, and B1 and $\overline{B1}$ which are exemplified as representatives.

The aforementioned unit sense amplifiers USA1 and USA2 are made to have a similar structure and a pair of CMOS inverter circuits of latch shape having their inputs and outputs connected crossly, although not especially limited thereto. In case the CMOS inverter of latch shape is used, the unit sense amplifiers may be exemplified by the N-channel MOSFET of latch shape, in which the gates and drains are crossly connected, if the necessity for the relatively large pitch prevents the fine pitch of the bit lines. Since the unit sense amplifiers can be constructed of the two N-channel MOSFETs in accordance with this structure, the occupation area can be made smaller than that of the case using the CMOS circuit. In case, however, the N-channel MOSFETs of the latch shape are used, the level of the bit lines at the high level is dropped by the amplifications to make it necessary to provide an active restore circuit for restoring the level to the initial high level.

In FIG. 16, between and in parallel with the two pairs of bit lines B0 and $\overline{B0}$, and B1 and $\overline{B1}$, there is arranged a column selection line YS. Orthogonally of these, there are arranged word lines WL0 to WL3 which are exemplified as representatives. AT the nodes between the aforementioned word lines WL0 to WL3 and the one of the bit lines B0 and B1 or $\overline{B0}$ and $\overline{B1}$ of the parallel bit line pairs B0 and $\overline{B0}$, and B1 and $\overline{B1}$, there are arranged memory cells which are composed of the address selecting MOSFETs and the information storing capacitors. In other words, the gates of the address selecting MOSFETs are connected with the corresponding word lines, and their input/output nodes or drains are connected with the corresponding bit lines.

In order to make the memory cell arrays dense, according to this embodiment, the wiring layers of the bit line pairs B0 and $\overline{B0}$, and B1 and $\overline{B1}$ and the column selection lines YS formed to run in parallel with the former are made of other metallic layers.

In case the bit line pairs B0 and $\overline{B0}$, and B1 and $\overline{B1}$ are made of an aluminum layer or the first metallic layer, the column selection line YS is made of an aluminum layer or the second metallic layer formed over the aforementioned first metallic layer through the inter-layer insulating film. This structure may be changed by using the first metallic layer as the column selection line YS in case the bit line pairs B0 and $\overline{B0}$, and B1 and $\overline{B1}$ are made of silicide. In this embodiment, the metallic layers should not be limited to the aforementioned aluminum layer but may be extended to a metallic wiring layer such as a tungsten layer.

Moreover, the aforementioned embodiment can be modified such that the bit lines B0 and $\overline{B0}$ of the even number of FIG. 16 are made of the first metallic (or silicide) layer whereas the bit lines B1 and $\overline{B1}$ of the odd number are made of the second (or first) metallic layer. Since, in this structure, the adjacent two bit line pairs B0 and $\overline{B0}$, and B1 and $\overline{B1}$ are insulated by the inter-layer insulating film, the space between the two wiring lines (when viewed from the top of the device) can be reduced to zero. Since the coupling noises of the bit line pairs are then highly unbalanced, it is desirable to adopt the known bit line crossing system, in which the bit line pairs are so interchanged at a constant interval that the couplings of the bit lines may be equalized.

The column selection line YS may be so arranged at a constant interval by using the aforementioned two metallic layers like before as to overlap with the bit line pairs B0 and $\overline{B0}$ and the bit lines B1 and $\overline{B1}$. For example, the metal layer forming the bit lines B1 and $\overline{B1}$ may be used to establish an overlap of a constant length with the bit lines B0 and $\overline{B0}$ made of a different metallic layer and be switched by an equal length to the metallic layer forming the bit lines B0 and $\overline{B0}$ thereby to cause an overlap with the bit lines B1 and $\overline{B1}$.

Moreover, the wiring layers may be different between the bit line pairs B0 and $\overline{B0}$, and B1 and $\overline{B1}$. As to the bit lines B0 and $\overline{B0}$, for example, the bit line B0 may be made of a first metallic (or silicide) layer, and the bit line $\overline{B0}$ may be made of a second metallic layer. Since, in this structure, the bit line pairs B0 and $\overline{B0}$ are insulated by the inter-layer insulating film, the space between the aforementioned two wiring lines (from a top view) can be shortened to zero. If the parasitic capacities of the bit lines themselves are unbalanced, the coupling noises of the bit lines can be reduced while balancing the wiring lines capacities by adopting the aforementioned bit line crossing system.

Incidentally, the memory cells are connected with the aforementioned bit lines, and their layout may determine the minimum pitch of the bit lines.

In this case, the aforementioned other embodiments are adopted to realize the high density of the memory cell array.

Figure 17:
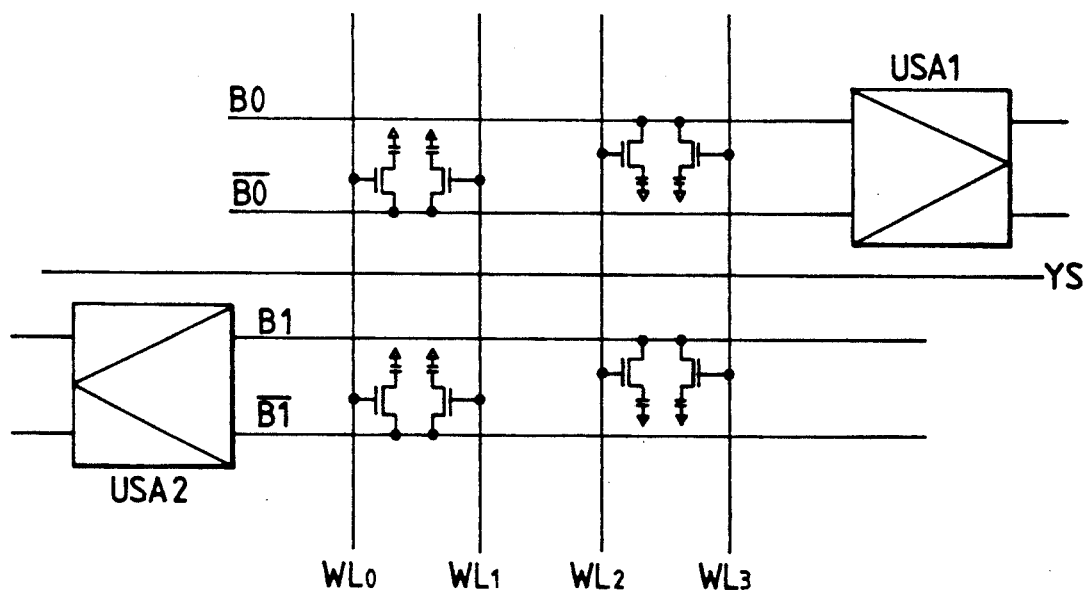
FIG. 17 is a schematic circuit diagram showing another embodiment of the memory cell array according to the present invention.

FIG. 17 is a schematic circuit diagram showing another embodiment of the memory cell array according to the present invention. In FIG. 2, there are exemplified as representatives like before: two pairs of bit lines B0 and $\overline{B0}$, and B1 and $\overline{B1}$; corresponding unit sense amplifiers USA1 and USA2; one column selection line YS arranged in parallel with the bit lines; and four word lines WL0 to WL3 arranged orthogonally of the bit lines.

In order to make the memory cell array highly dense, according to this embodiment, the unit sense amplifiers are alternately arranged at the two ends of the bit lines. The unit sense amplifier USA1 is arranged at the righthand end of the bit line pairs B0 and $\overline{B0}$ which are arranged in parallel, as exemplified as above. The unit sense amplifier USA2 is arranged at the lefthand end of the bit line pairs B1 and $\overline{B1}$ which are shown as the remaining representatives adjacent to the foregoing bit line pairs B0 and B0. Although not shown in FIG. 17, the sense amplifier USA1 is arranged at the righthand end of the bit line pairs of an even number, and the sense amplifier USA2 is arranged at the lefthand end of the bit line pairs of an odd number.

In FIG. 17, the column selection line YS is arranged between and in parallel with the aforementioned two bit line pairs B0 and $\overline{B0}$, and B1 and $\overline{B1}$, and the word lines WL0 to WL3 are shown by way of example to cross them at a right angle.

At the intersections between the aforementioned word lines WL0 to WL3 and the one-side bit lines B0 and B1 or $\overline{B0}$ and $\overline{B1}$ of the parallel bit line pairs B0 and $\overline{B0}$, and B1 and $\overline{B1}$, there are arranged memory cells which are composed of address selecting MOSFETs and information storing capacitors like before.

The aforementioned unit sense amplifiers USA1 and USA2 are made to have similar structures which are composed of a pair of CMOS inverter having their inputs and outputs connected crossly. These CMOS inverters are made to have a relatively large element size so as to amplify at a high speed the fine signals read out from the memory cells to the bit lines. This makes it necessary to prepare a relatively large area occupied for constructing those CMOS sense amplifiers. In the structure having the sense amplifiers disposed at the one-side ends of the bit lines like the aforementioned embodiment of the conventional DRAM, the wiring line width and the memory cell elements could be made fine, but the high integration of the memory cell array is restricted by the limit to the layout at the sense amplifiers. In the structure having the unit sense amplifiers arranged alternately at the two ends of the bit lines as in this embodiment, on the contrary, the unit sense amplifiers USA can be arranged by using the pitches of the two bit line pairs. AS a result, the pitches of the bit lines can be made as small as possible to make the memory cell array highly dense.

In order that the word lines may be arranged highly densely in this case, the adjacent ones of word line backing wiring lines are made of two alternately different metallic layers like the foregoing embodiment. As a result, the bit line density and the word line density can be increased to reduce the area occupied by the memory cell array.

In case the aforementioned backing wiring lines of the word lines have a margin, the bit lines are two-layered. For example, the bit lines B0 and $\overline{B0}$ of an even order may be a first metallic (or silicide) layer, and the bit lines B1 and $\overline{B1}$ of an odd number may be a second metallic layer. In this structure, the two bit pairs B0 and $\overline{B0}$, and B1 and $\overline{B1}$ are insulated through the inter-layer insulating film so that the two wiring space can be reduced to zero like the case of the word lines. Since the unbalance is then enlarged in the coupling noises of the bit line pairs, the know bit line crossing system for interchanging the bit line pairs may be used at such a constant interval as to equalize the bit lines.

The column selection line YS may be arranged with an overlap with the bit line pairs B0 and $\overline{B0}$, and B1 and $\overline{B1}$ at a constant interval by the using the two metallic layers, although not especially limited thereto. For example, the metal layer for forming the bit lines B1 and $\overline{B1}$ is used to overlap with the bit lines B0 and $\overline{B0}$, which are made of a different metallic layer, over a constant length, and the metallic layer formed with the bit lines B0 and $\overline{B0}$ of the same length may be switched to overlap with the bit lines B1 and $\overline{B1}$.

Figure 18:
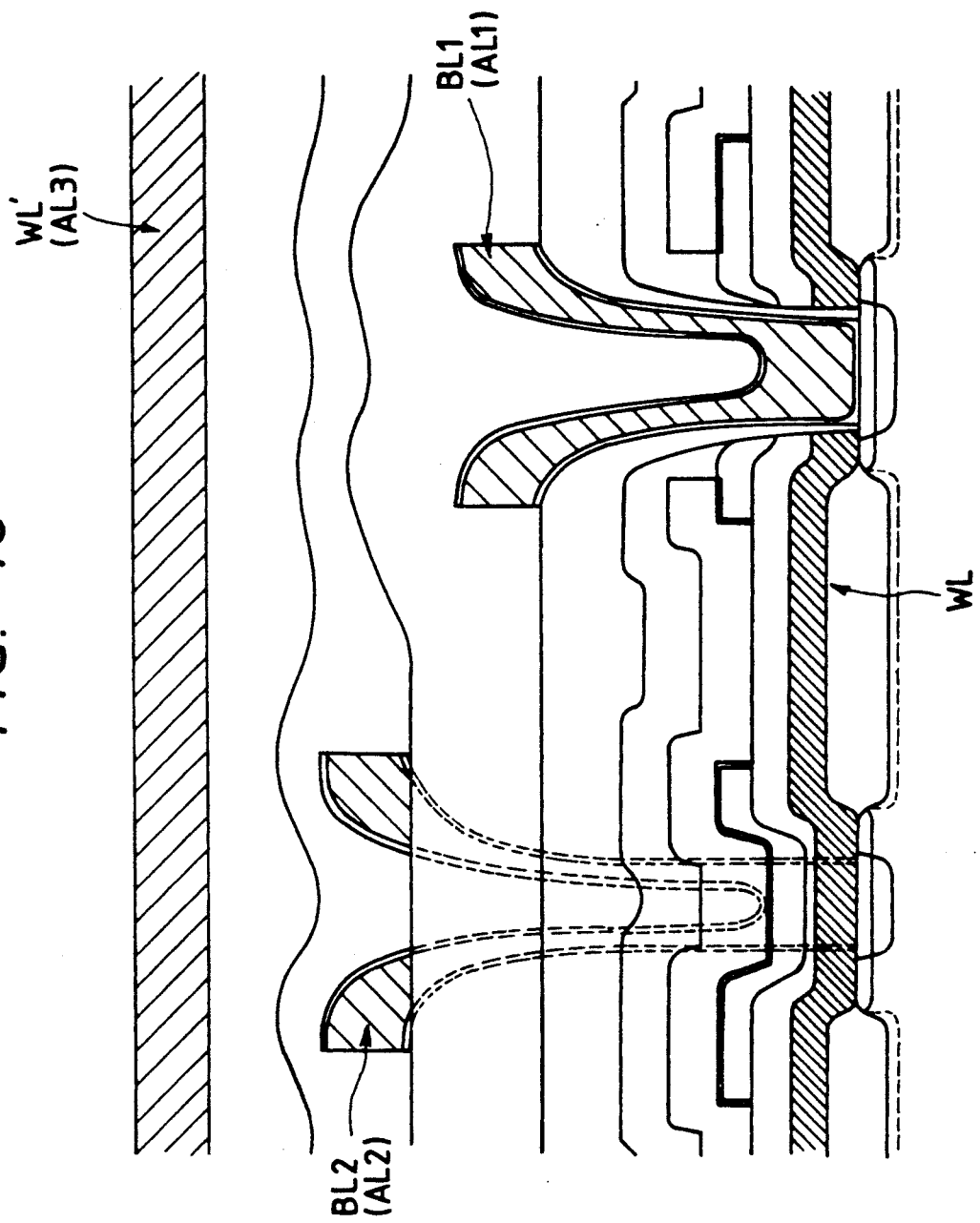
FIG. 18 is a section showing the element structure according to another embodiment of the memory cell.

FIG. 18 is a section showing the element structure according to one embodiment in case the bit lines are multi-layered like the foregoing embodiments. FIG. 18 is a section showing the structure taken along the word lines.

A bit line BL1 is made of a first aluminum layer, as has been described hereinbefore, and an adjacent bit line BL2 is made of a second aluminum layer which is formed through an inter-layer insulating film with respect to the aforementioned first aluminum layer. Moreover, the word shunting wiring line WL' is made of a third aluminum layer which is formed through an inter-layer insulating film with respect to the second aluminum layer.

A word line WL is made of a polysilicon layer which is formed integrally with the gate electrode of a MOSFET for selecting the memory cell addresses. The word line WL and the word shunting wiring line are connected with each other by the contact portions which are shorn in the aforementioned pattern diagram.

Figure 19B:
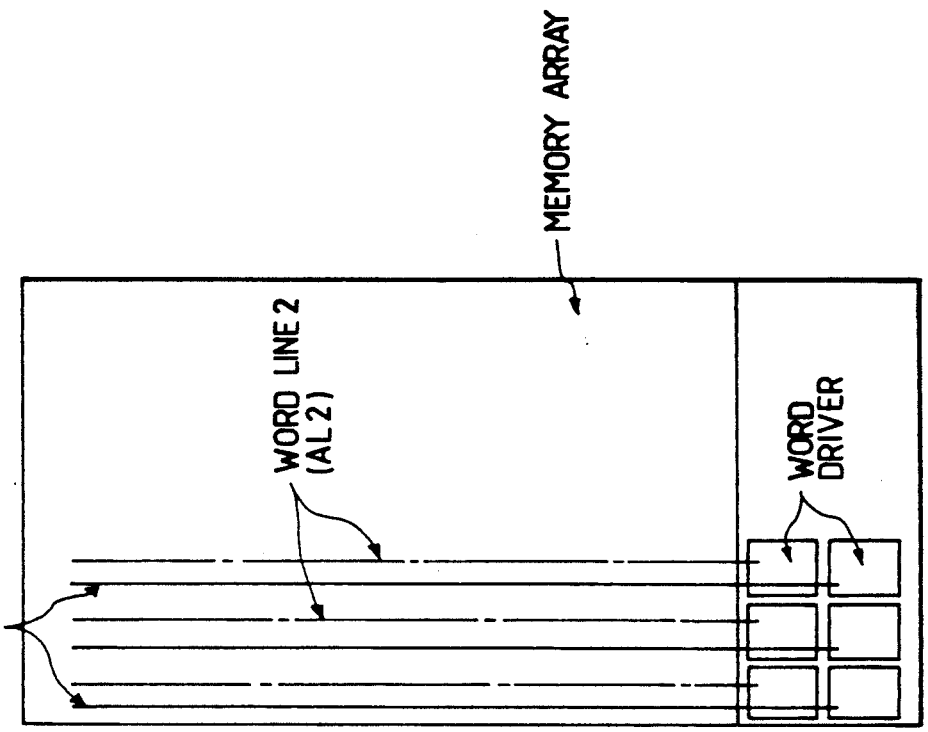
FIG. 19B is a layout showing another embodiment of the word lines and their drivers of the memory cell array according to the present invention.
Figure 19A:
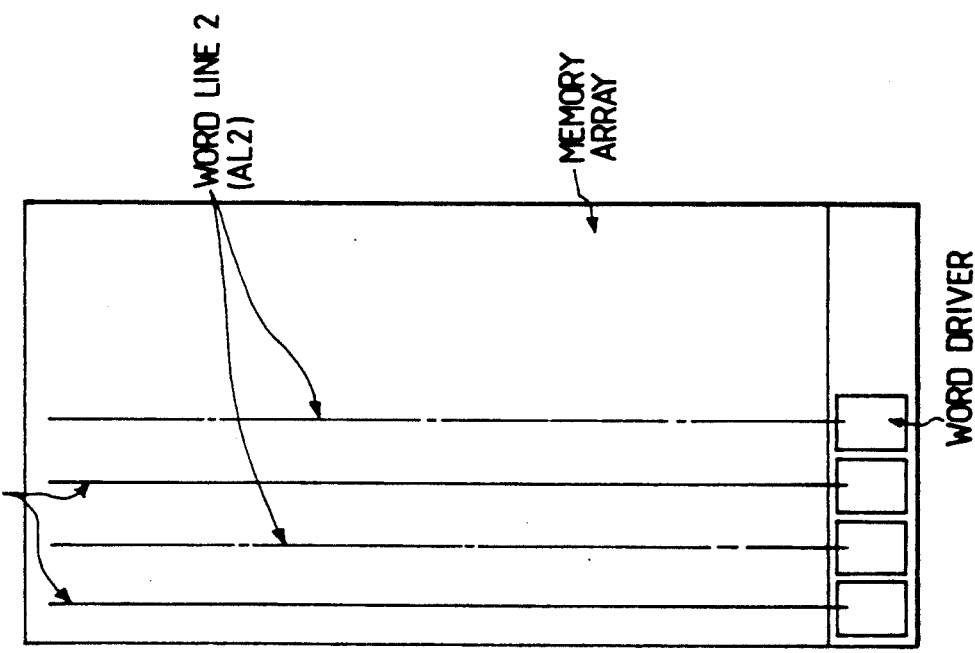
FIG. 19A is a layout showing one embodiment of the word lines and their drivers of the memory cell array according to the present invention.

FIG. 19A is a schematic diagram showing one embodiment of the layout of the word lines and their drivers in the aforementioned memory cell array. In FIG. 19A, four word lines and corresponding drivers are representatively shown by way of example.

In FIG. 19A, word lines 2 indicated by single-dotted lines are the backing wiring lines which are made of the second aluminum layer, as in the second embodiment of FIG. 14, and word lines 1 indicated by solid lines are made of the aforementioned third aluminum layer. Thus, the word lines can be packaged in a high density by arranging the adjacent word line backing wiring lines alternately by using the second metallic layer.

FIG. 19B is a schematic circuit diagram showing another embodiment of the layout of the word lines in the aforementioned memory cell array and their drivers. In FIG. 19B, six word lines and corresponding drivers are representatively shown by way of example.

In order to drive at a high speed the word lines which are given a large load capacity by coupling a number of memory cells, the circuit scale of the drivers for driving the word lines is accordingly enlarged. As a result, even if the word lines are made to have a small pitch in the memory cell array, as shown in FIG. 19A, the drivers may not be formed in conformity to the pitch.

In this embodiment, therefore, the word drivers are arranged in two steps, as shown, so that the word drivers apart from the memory array have their output lines running over the word drivers close to the memory array by using the word lines 1 made of the aforementioned third metallic layer. In tis structure, the word lines made of the polysilicon layer and connected with the memory cells are given the selection/unselection levels through the aforementioned word shunting backing wiring lines. By this two-step arrangement of the word drivers, the pitch of the word drivers can be made twice as large as that of the word line pitch. As a result, the word drivers enabled to have a high-speed drive can be laid out while packaging the word lines highly densely.

The aforementioned two-layered word lines may be vertically interchanged, if necessary.

In case, on the other hand, the bit lines are made of silicide, as described hereinbefore, the aforementioned word line backing wiring lines are made of the first and second metallic layers. Incidentally, in case the scale of the word drivers is enlarged for speeding up the operations, it is unnecessary to use the aforementioned multiple metallic wiring layers.

Figure 20B:
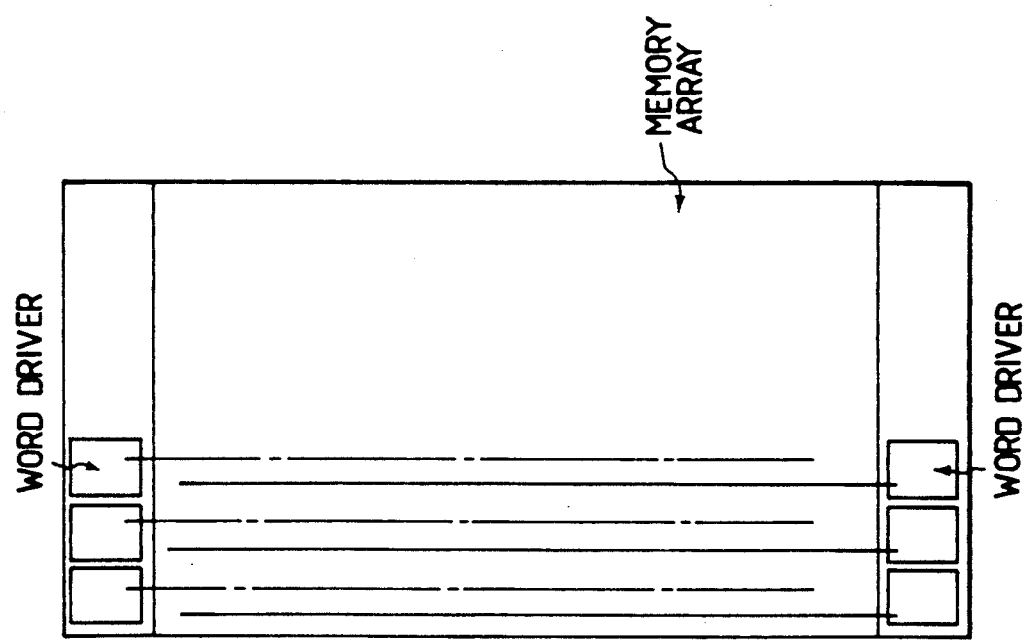
FIG. 20B is a layout showing another embodiment of the word lines and their drivers of the memory cell array according to the present invention.
Figure 20A:
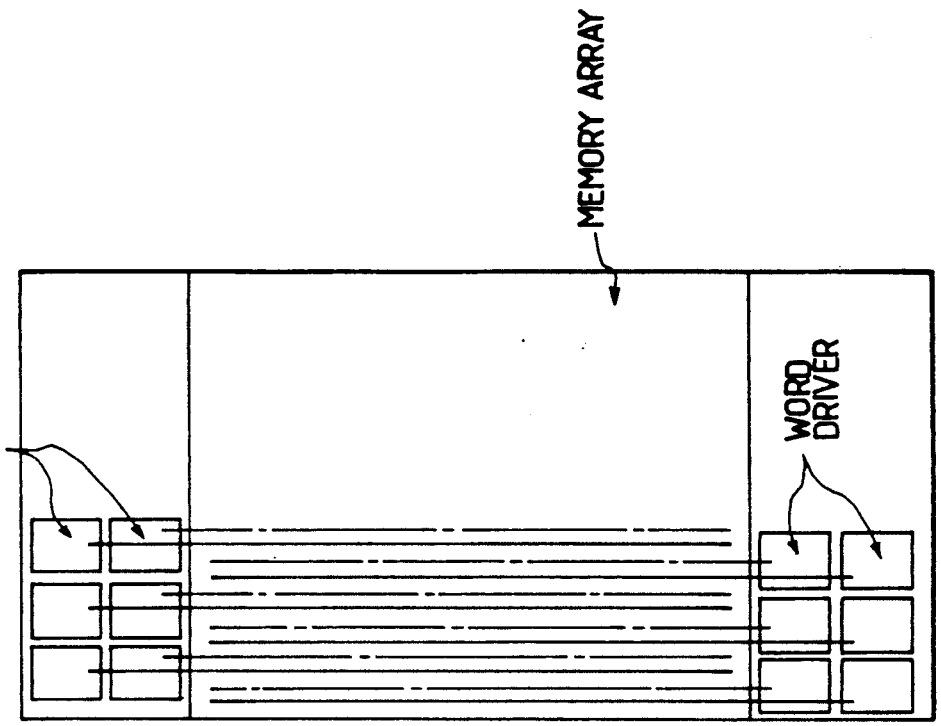
FIG. 20A is a layout showing another embodiment of the word lines and their drivers of the memory cell array according to the present invention.

FIG. 20A is a schematic circuit diagram showing another embodiment of the layout of the word lines in the aforementioned memory cell array and their drivers. In FIG. 20A, six word lines and the corresponding drivers are representatively shown by way of example.

In FIG. 20A, like before, the word lines indicated by single-dotted lines are the backing wiring lines made of the second aluminum layer like that exemplified in the foregoing embodiment of FIG. 14, and the word lines indicated by the solid lines are made of the aforementioned third aluminum layer. The wiring lines for backing the adjacent word lines are alternately arranged by making use of the aforementioned two metallic layers so that the word lines can be packaged in high density.

In this embodiment, in accordance with such highly dense word line pitch, the word drivers having a high drivability are arranged over and below the memory cell array (or memory mat). Specifically, the word drivers corresponding to the word lines made of the second metallic layer are arranged over the memory cell array, and the word drivers corresponding to the word lines made of the third metallic layer are arranged below the memory cell array. In other words, the word drivers are alternately arranged at the two ends of the word lines. Thus, the pitch of the word drivers can be made two times as large as the word line pitch. As a result, it is possible to layout the word drivers which are enabled to accomplish the drives at a high speed while packing the word lines in high density. Incidentally, the word lines may have their upper and lower layers interchanged, if necessary, as has been described hereinbefore. In case the word drivers are large-scaled for the high speed, the aforementioned multi-layered metallic wiring layers need not be used if the word shunting backing wiring lines have a margin.

FIG. 20B is a schematic circuit diagram showing another embodiment of the layout of the word lines of the aforementioned memory cell array and their drivers. In FIG. 20B, twelve word lines and their corresponding drivers are representatively shown by way of example.

In FIG. 20B, like before, the word lines indicated by single-dotted lines are backing wiring lines made of the second aluminum layer like the aforementioned embodiment of FIG. 14, and the word lines indicated by solid lines are made of the third aluminum layer, as has been described hereinbefore. Thus, the high density packaging of the word lines can be achieved by arranging the adjacent word line backing wiring lines alternately with the aforementioned two metallic layers. In order that the drivers may be arranged to correspond to the word lines arranged in high density, according to this embodiment, they are composed of two steps closer to and apart from the word lines at the two ends of the memory cell array like the aforementioned embodiment of FIG. 19B. Incidentally, the word lines may be vertically interchanged, if necessary, as has been described hereinbefore. In case the word drivers are large-scaled to speed up the operations, the aforementioned multiple metallic wiring layers need not be used if the aforementioned word shunting backing wiring lines have a margin.

FIG. 20C is a schematic circuit diagram showing another embodiment of the layout of the word lines in the aforementioned memory cell array and their drivers. At (A) of FIG. 20C, the drivers may be disposed at the two ends of one word line. Since, in this case, one word line is driven from its two ends by the two word drivers, the drivability of one word driver disposed at one end of the word line can be halved. With this layout, too, the word drivers of high-speed drive can be laid out while packaging the word lines in high density. In case the word drivers are large-scaled for the high-speed operations, it is not necessary to use the aforementioned multi-layered metallic wiring layers if the aforementioned word shunting backing wiring lines have a margin. At (B) of FIG. 20(C), the drivers at the two ends of the adjacent word lines are constructed of two steps like the aforementioned embodiment of FIG. 19B. With this structure, too, the word drivers capable of driving at the high speed can be laid out while packing the word lines in high density. In case the word drivers are large-scaled for the high-speed operations, it is not necessary to use the aforementioned multi-layered metallic wiring layers if the aforementioned word shunting backing wiring lines have a margin.

At (A) and (B) of FIG. 20C, moreover, there arises a problem that a DC current will flow if the operation timing of the drivers to be disposed at the two ends of one word line are lost. Therefore, the word lines may be separated at their middle points. By adopting this structure, the load upon the word lines can be halved so that the selections of the word lines are identical to the aforementioned ones.

The multi-layered structures of the word lines and bit lines and the structures of the word drivers and the sense amplifier, as has been described with reference to FIGS. 14 to 20C, can naturally be applied to not only the memory blocks constituting the large-scale semiconductor memory device of about 64 Mbits but also to semiconductor memory devices having a smaller storage capacity such as about 1 Mbits or 4 M bits than that of the RAM of the aforementioned embodiment.

Figure 21:
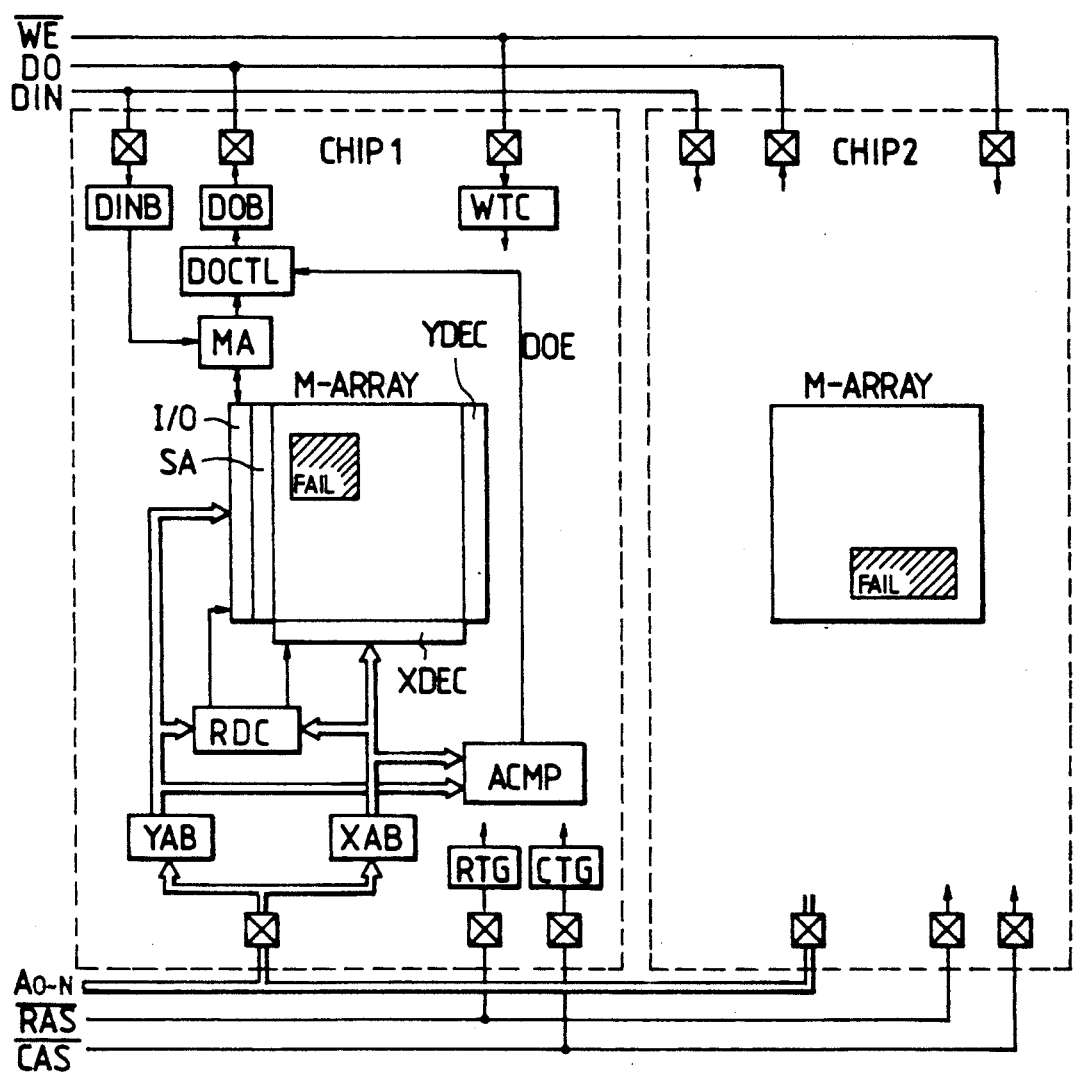
FIG. 21 is a schematic block diagram for explaining one embodiment of the defect relieving method according to the present invention.

FIG. 21 is a schematic block diagram for explaining one embodiment of a method of relieving defects of the semiconductor integrated circuit according to the present invention.

In this embodiment, one semiconductor memory device is constructed with a two-chip packaging method. According to this two-chip packaging method, two defective chips are packaged in one package to constitute one semiconductor memory device.

In the defect relieving method of the prior art, the memory cell array is provided with a redundant memory cell array, to which a memory access to the defective portion is switched. For this, a redundancy address comparator is provided. In case the redundant memory cell array is composed of row and column arrays, redundancy address comparators are provided for the two arrays.

By the prior art defect relieving method described above, the number of the defects to be relieved is limited by the number of the redundancy word and bit lines acting as the redundant memory cell arrays and the number of the redundancy address comparators. As a result, the defective portions exceeding that number cannot be relieved so that they are disposed of as defective chips.

In this embodiment, substantially one non-defective chip is to be made by combining two defective chips which could not be relieved by the defect relieving method of the prior art. By making use of the later-described packaging technologies of the multi-chips, more specifically, the two chips having the defective portions left are packaged in one chip so that they may be handled as one non-defective semiconductor memory device from the outside.

In FIG. 21, there is shown an example in which memory chips CHIP1 and CHIP2 are accommodated in one package. These two chips CHIP1 and CHIP2 have individual defect relieving functions using redundancy circuits, and the individual memory arrays are defective in the hatched regions, irrespective of the redundancy defect relief. Here, the two memory chips CHIP1 and CHIP2 are so selected that their defective portions are not overlapped in their addressed.

The defective chips having a larger number of defects than that of redundancy circuits are not disposed of, as in the prior art, and two chips having no defective portions overlapped are selected and combined without using any redundancy circuit, although not especially limited thereto. The chips having overlapped defective portions are subjected to the defect relief by using the redundancy circuit of one memory chip. In case the overlapped defective portions remain even if all the redundancy circuit of one chip are used, the defect relief is accomplished by using the redundancy circuit disposed in the other chip. Thus, the individual redundancy circuits of the two memory chips are used to relieve only the overlapped defective portions so that most of the defective chips having defective portions at the memory array portions can be relieved.

The memory chips CHIP1 and CHIP2 of FIG. 21 are operated in parallel, although not especially limited thereto. In other words, the two memory chips are read/written in parallel. The two memory chips are equipped with an address comparator ACMP for detecting the memory access to the remaining defective portion. If the access to the defective address is detected, individual output circuits DOB are controlled in accordance with the detection signal DOE to cause an output high-impedance state. Since the two memory chips have no defective portions overlapped, as has been described above, the memory access is accomplished at the defective portions to inhibit the output of one memory chip. Then, the read signal from the other memory chip having been subjected to the normal reading operation is outputted as an output signal DO. when the normal memory cells are read out at both the two memory chips, the identical signal DO is outputted from the two output circuit DOB.

By using the two memory chips having the defective portions left, an apparently complete product can be made. As a result, a non-defective semiconductor memory device can be obtained from the memory chips which have been disposed of in the prior art, so that there can be attained an effect that the substantial production yield can be enhanced.

Especially, memory chips having a large storage capacity such as the dynamic RAM of about 64 Mbits have a relatively large size so that the number of the memory chips to be formed from one sheet of semiconductor wafer is limited, and a larger number of defects are necessarily caused with the larger chip size. As a result, the defect relieving method using the redundancy circuits according to the prior art limits the improvement in the production yield. By adopting the relieving method of the prior art, however, it is possible to expect a drastic improvement in the production yield.

In case two-chip memories are operated in parallel as in this embodiment, a parity check circuit may be provided to inhibit the operations of the output control circuit at the memory chip in which a parity error has occurred. As a result, not only the aforementioned hard errors but also soft errors can be relieved to provide a highly reliable semiconductor memory device.

Figure 22:
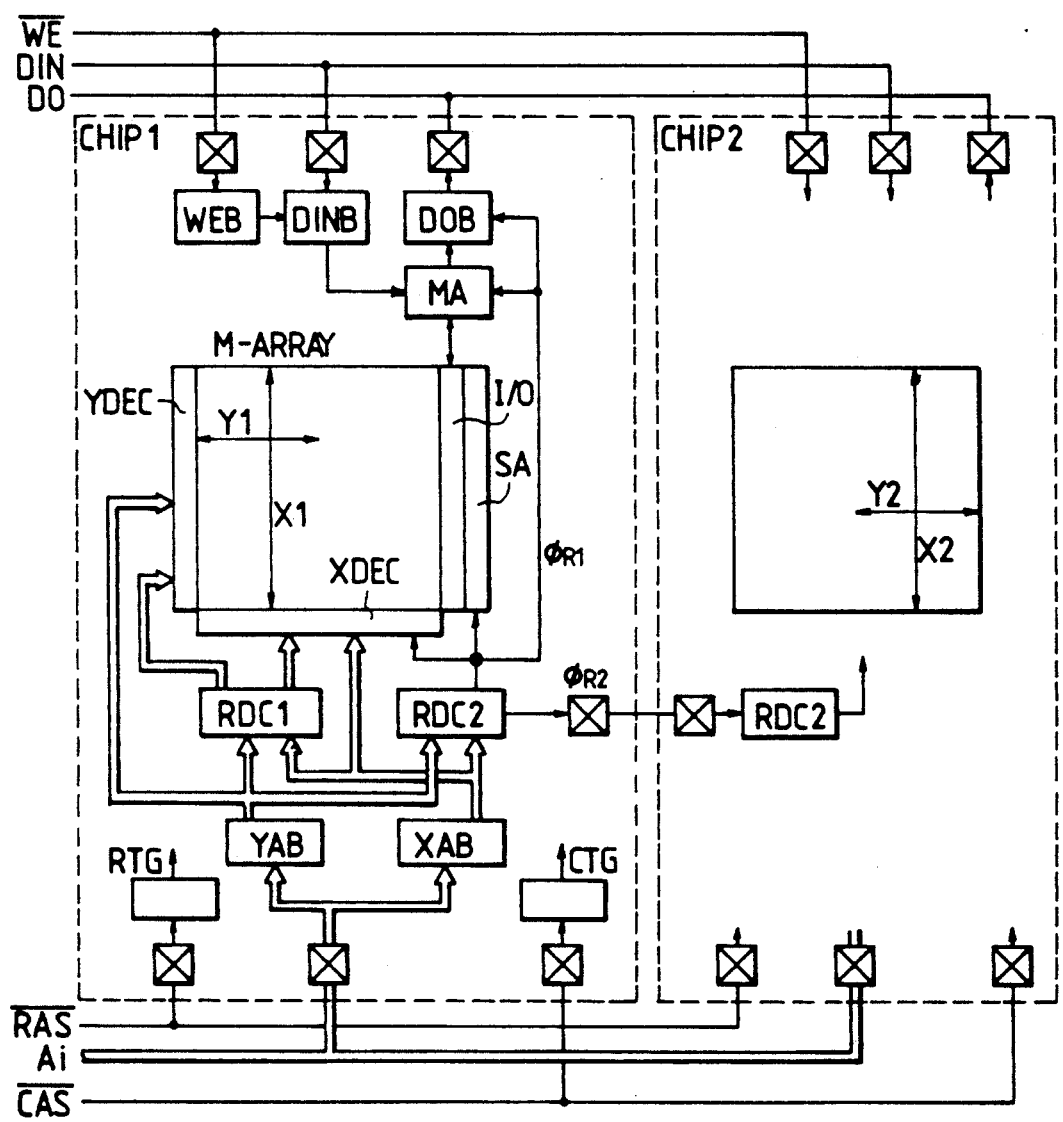
FIG. 22 is a schematic block diagram for explaining another embodiment of the defect relieving method according to the present invention.

FIG. 22 is a schematic block diagram for explaining another embodiment of the defect relieving method of the semiconductor integrated circuit according to the present invention.

In the defect relieving method described above, the two memory chips CHIP1 and CHIP2 are operated in parallel so that the current consumption is accordingly increased. If, moreover, a memory access is accomplished to defective portions in one memory chip CHIP1 or CHIP2, the output of the output control circuit is brought into the high-impedance state so that the output current is halved. In other words, if the data are to be read out in parallel from the two memory chips CHIP1 and CHIP2, the output current is two times as large as that of the case in which one memory chip CHIP1 or CHIP2 is defective. Thus, there arises a problem that the output current changes depending on whether the memory accesses to addresses of the defect relief or not.

In this embodiment, the memory chip CHIP1 is equipped with a priority decision circuit RDC2. This priority decision circuit RDC2 gives a priority to the other memory chip CHIP2 if it detects the memory access to the aforementioned defective portions.

Let the case be considered, in which a setting is made by the bonding or the like to give the priority to the memory chip CHIP1. For a memory access, if any, the row address circuits in the two chips are rendered operative. In this case, the address input and the address comparison are accomplished in parallel in both the memory chips CHIP1 and CHIP2, although not especially limited thereto. If, in this address comparison, the access is not to the defective portions in the priority memory chip CHIP1, this memory chip retains its priority to continue the subsequent memory access operations so that the other memory chip CHIP2 is promptly rendered inoperative in response to an output signal φR2. If, in this address comparison, the access is to the defective portions in the priority memory chip CHIP1, the priority is transferred from the memory chip CHIP1 to the memory chip CHIP2 in response to the signal φR2 so that the subsequent memory access operations are continued. The one memory chip CHIP1 having lost the aforementioned priority is promptly rendered inoperative in response to a signal φR1.

Here in the dynamic RAM, if the word lines are brought into their selected states, the stored charges held in the capacitor are lost by the charges of the bit lines and the charge share so that they have to be rewritten by the amplified outputs of the sense amplifier. For this necessity, it is important that both the aforementioned address comparison and the according priority determination are accomplished before the rise of the word lines by the two memory chips CHIP1 and CHIP2.

As a result, the aforementioned address buffer and address comparison are accomplished in parallel in the two chips, thus reducing the power consumption. In the dynamic RAM, the selection of the word line of the most current consumption and the amplification of the sense amplifiers are accomplished in only one memory chip so that the current consumption can be substantially equalized to that of a complete product made of one memory chip. Despite of the provision of the two memory chips unlike the foregoing embodiment, however, only the data output circuit of one memory chip always operates to leave the output current unchanged according to this structure.

In the address multiplex type RAM made receptive of X- and Y-address signals in time-series, the control of the operations of the two memory chips by the address comparisons is limited to the case in which only the X-system is defective. In case the access to the defective portions is not decided before the Y-address comparison, that application cannot be achieved because the word lines and the sense amplifiers start their operations. In case the Y-address comparison has to be accomplished, the operations of the memory chips to be rendered inoperative are stopped after the column selections or the main amplifier selections. In this case, the output current is not changed because what always operates is the output buffer of one memory chip.

In the DRAM to be fed with the X- and Y-address signals in parallel from independent terminals, the aforementioned defect relieving method can be adopted independently of the X- and Y-defective addresses.

When one memory chip is given a priority so that its defective portion is subjected to a memory access, the defective relieving method for validating the operations of the other memory chip has different current consumptions between the cases in which the X-system has the defective portion, as above, and in which the Y-system has the defective portion. Depending upon the defective portions, therefore, the memory chips may be handled as differ kinds.

In a system of accessing only the macro-cellulated memory blocks having address assignments, as embodied in FIG. 11, the X-address signals are used as the address signals for designating the memory block. Therefore, two memory chips are so combined as to prevent the defectives from being overlapped at the unit of the memory block so that the addresses of the memory block having the defective portions are registered by applying the defect relieving method of this embodiment. Since the aforementioned transfer of the priority can always be accomplished by the X-address comparison, the power consumption can be reduced independently of the defective portions.

The aforementioned address registration (or program) of the defective portions is accomplished by the same means as the address registration circuit used in the redundancy address comparator for cutting the fuse means made of a polysilicon layer by exposing it selectively to a laser beam or the like, although not especially limited thereto.

By using these two memory chips having the defective portions left as they are, the appearance can be identical to that of the complete product, as has been described hereinbefore. As a result, a good semiconductor memory device can be produced from the memory chips which have been disposed of in the prior art, so that the production yield can be substantially enhanced. Especially, the memory chip having a large storage capacity such as the aforementioned dynamic RAM of about 64 Mbits is limited in its improvement in the yield by the defect relieving method of the prior art using the redundancy circuit. This is because the memory chip of the large storage capacity is so large-sized that the number of memory chips to be fabricated from one semiconductor wafer is reduced and that more defects are accordingly caused. Since, however, the defects are re-lived not wholly by the redundancy circuit but partially with the defects being left in accordance with the defect reliving method of this embodiment, the production yield can be expected to rise remarkably.

Figure 23:
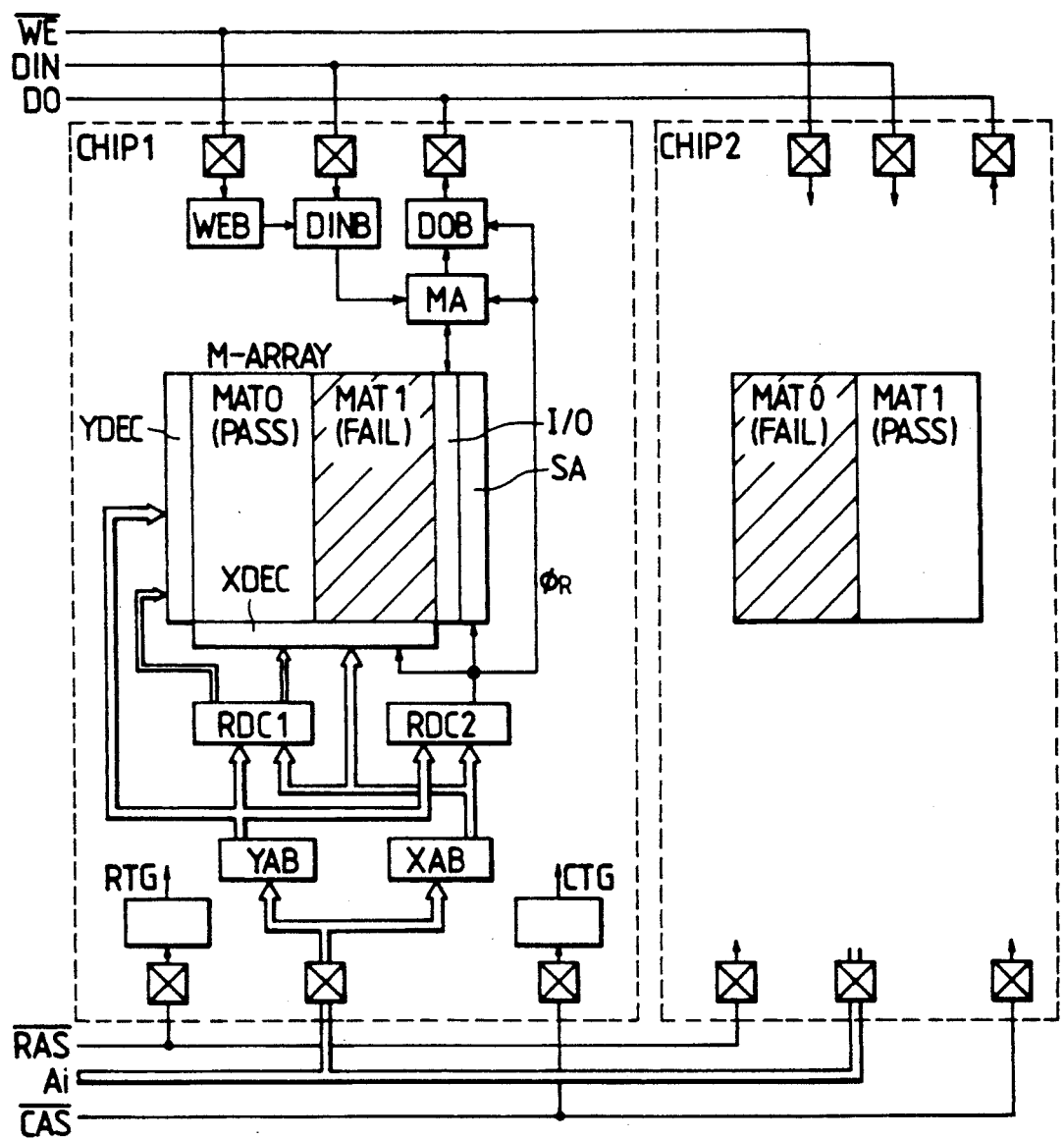
FIG. 23 is a schematic block diagram for explaining another embodiment of the defect relieving method according to the present invention.

FIG. 23 is a schematic block diagram for explaining another embodiment of the method of relieving the defects of a semiconductor integrated circuit according to the present invention.

The aforementioned defect relieving method shown in FIG. 22 requires a priority decision circuit to enlarge the scale of the circuit accordingly.

In this embodiment, the defect relief is accomplished by using the individual redundancy circuits such at one CHIP1 of the memory chips has defects (or FAIL) at the righthand half of the memory array, as hatched in FIG. 23, and that the other memory chip CHIP2 has defects (or FAIL) at the lefthand half of the memory array, as hatched. In other words, i the memory chip CHIP1, only the lefthand half is subjected to the defect relief by using its redundancy circuit while ignoring the defects in the righthand half. In the other memory chip CHIP2, on the other hand, only the righthand half is subjected to the defect relief by using its redundancy circuit while ignoring the defects in the lefthand half. As to the memory chips having the defects, the numbers of defects at the righthand and lefthand halves are examined so that the area having less defects is subjected to the defect relief.

The address of the most significant bit is selected as that for dividing the memory area into halves. By using this address signal as the chip selection signal for the aforementioned memory chips CHIP1 and CHIP2, the memory access can be limited to either the memory chip CHIP1 or CHIP2.

In this case, the priority decision circuit or the like can be dispensed with so that the structural elements and controls of the circuit can be made simpler than those of the foregoing embodiment shown in FIG. 21.

If the memory array is halves, as above, the defects may be concentrated at either the righthand or lefthand halves in dependence upon the production lots. In this case, the memory chips using the righthand or lefthand side are so increased that the two memory chips cannot be combined.

Thus, each memory chip is given a function to invert the address inputted selectively rom the fuse means. As a result, for one of the two memory chips utilizing either the physically identical righthand (or lefthand) half, the chip selection address is inverted by cutting the aforementioned fuse means. Then, this memory chip can be used as one which utilizes the lefthand (or righthand) half opposite to that physically identical area. As a result, it is possible to provide one semiconductor memory device which uses a pair of righthand and lefthand identical areas.

The system for accessing only the macro-cellulated memory blocks having the address assignments shown in the foregoing embodiment of FIG. 11 uses the X-address signals as those for designating the memory blocks. By combining the two memory chips each utilizing eight of the sixteen memory block units, therefore, the defect relieving method of this embodiment is applied to register the addresses of the non-defective memory block so that the chips may be activated by accessing to the addresses registered.

In this case, the bit number of the address for dividing the eight memory blocks, as above, may be not only four but also three or two bits. If the bit number is one, this embodiment is substantially equalized to the foregoing embodiment.

In the RAM system for feeding the X- and Y-address signals in parallel, on the other hand, the Y-address signals can also be used as those for dividing the memory areas.

By using the two memory chips having their defective portions left, the appearance can be identical to that of the complete product, as has been described hereinbefore. As a result, the good semiconductor memory device can be produced from the memory chips which have been disposed of in the prior art, so that the production yield can be substantially enhanced.

Especially, the memory chip having a large storage capacity such as the aforementioned dynamic RAM of about 64 Mbits is limited in its improvement in the yield by the defect relieving method of the prior art using the redundancy circuit. This is because the memory chip of the large storage capacity is so large-sized that the number of memory chips to be fabricated from one semiconductor wafer is reduced and that more defects are accordingly caused. Since, however, the defects are relieved not wholly by the redundancy circuit but partially with the defects being left in accordance with the defect relieving method of this embodiment, the production yield can be expected to rise remarkably.

Figure 24:
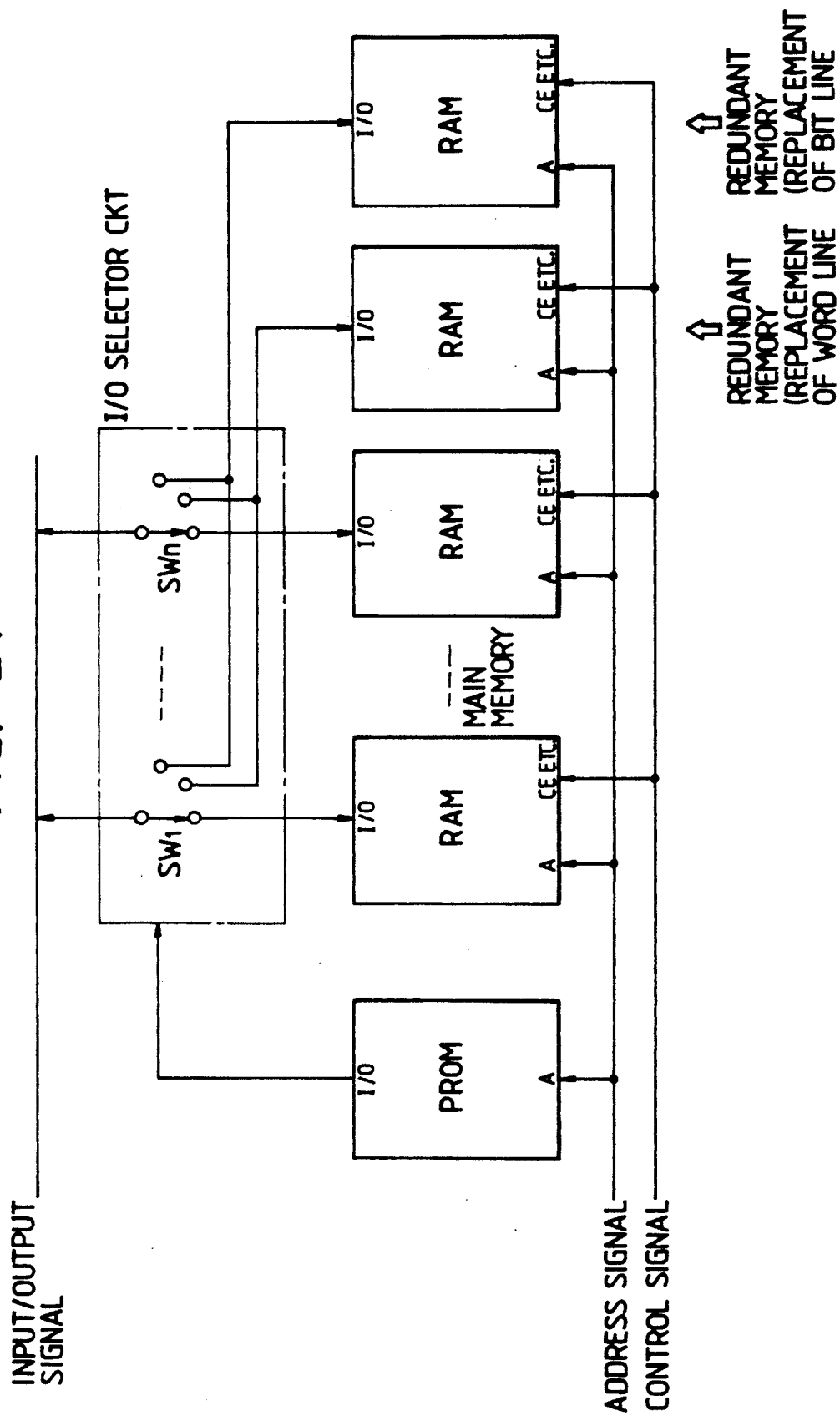
FIG. 24 is a schematic block diagram for explaining still another embodiment of the defect relieving method according to the present invention.

As shown in FIG. 24, a main memory composed of a plurality of chips is equipped with two redundant memories, although not especially limited thereto. These redundant memories are red with the address signals and the control signals in parallel, and an I/O selector is provided for the input/output lines. This I/O selector is switched by the switching information which is stored in a PROM (i.e., programmable ROM) for storing the defective addresses, although not especially limited thereto. The RAM chips constituting the aforementioned main memory have defective bits. The number of the defective bits at the identical address is conditioned within that of the aforementioned redundant memories. Of the data composed of the plural bits for writing/reading the plural main memories, the defects up to 2 bits are accessed for the redundant memories in accordance with the defective address switching information stored in the PROM. The aforementioned RAM chips, the PROM and the I/O selector may be either packaged as one module in the package or constituted over the package substrate. By establishing the condition under which the aforementioned defective portions are not accessed by using such redundant memories, the RAM chips having the defective bits can be apparently handled as non-defective products.

Figure 25:
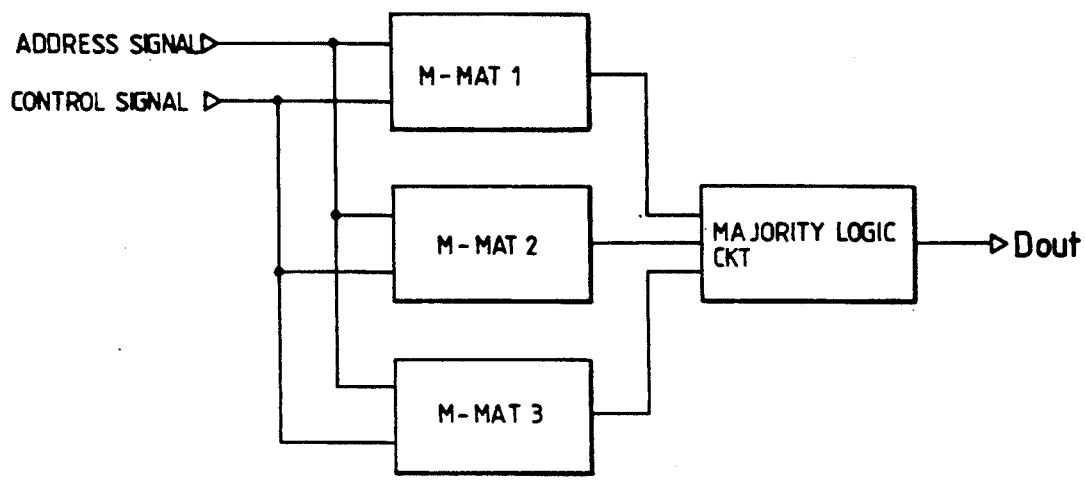
FIG. 25 is a schematic block diagram for explaining still another embodiment of the defect relieving method according to the present invention.

FIG. 25 is a block diagram showing one embodiment of the defect relieving method according to the majority decision method.

In this embodiment, three memory chips CHIP1 to CHIP3 are used, which are fed with an address signal and a control signal in parallel. Their read signals only are outputted through the majority logic circuit. Those memory chips CHIP1 to CHIP3 are so selected that their defective portions are not overlapped. In other words, the defective addresses to be relieved by the individual redundancy circuits of the memory chips CHIP1 to CHIP3 are so relieved that their defective portions may not be overlapped. According to this structure, the soft errors, if any in one chip at other than the defective addresses, can be automatically corrected.

The majority defect relieving method of this embodiment may be applied to one dynamic RAM. In case the storage capacity is about 64 Mbits, as in this embodiment, the defect relief is so accomplished by the redundancy circuits that the defects may not be overlapped in the three of the four quarters of the storage capacity, and the signals of 3 bits are outputted through the majority logic circuit. Thanks to this structure, each quarter can be used as a RAM of about 16 Mbits. In this case, too, a soft error, if any, can be relieved if the remaining bits are correctly read out to provide a merit that the reliability can be enhanced.

The defect relieving method thus far described can naturally be applied to not only the aforementioned semiconductor memory device of a large scale such as about 16 Mbits or about 64 Mbits but also a semiconductor memory device having a relatively small storage capacity such as about 4 Mbits or about 1 Mbits.

Figure 26A:
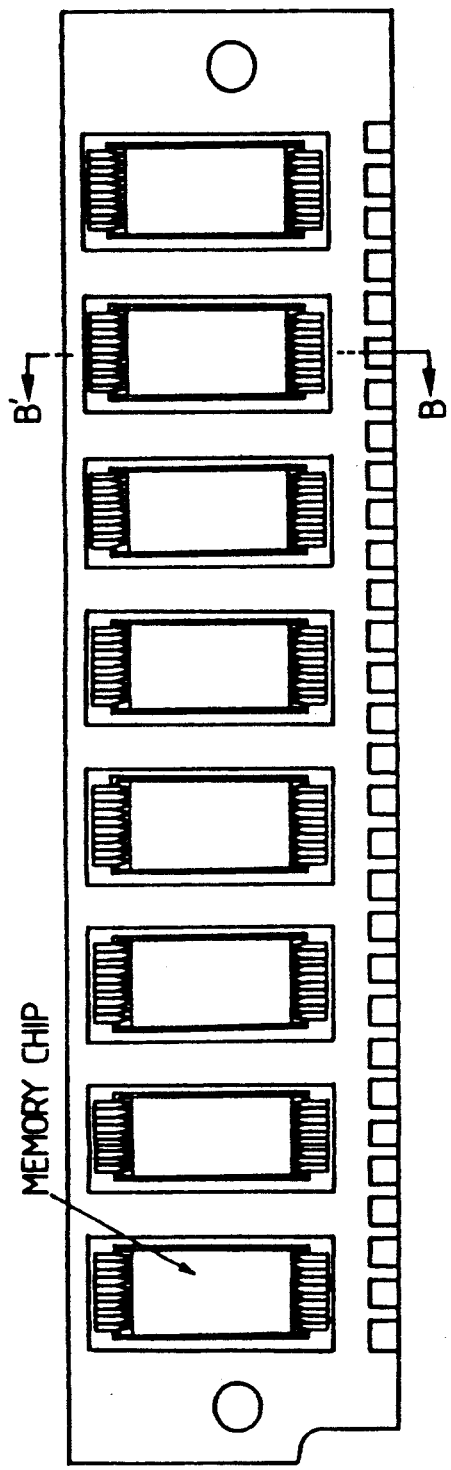
FIG. 26 is a top plan view showing one embodiment of the multi package of stack type.
Figure 26C:
Figure 26B:
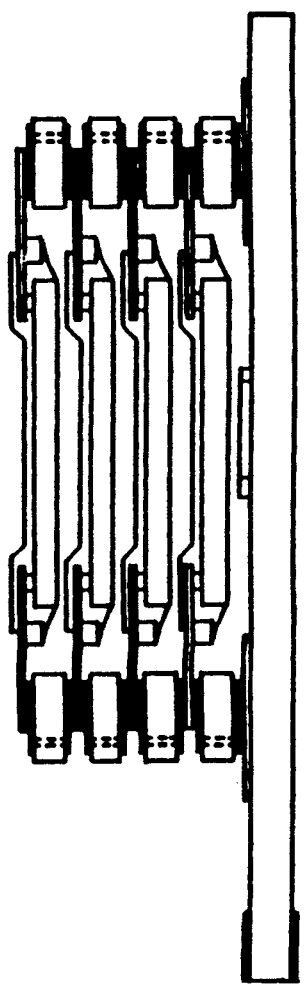
Figure 27A:
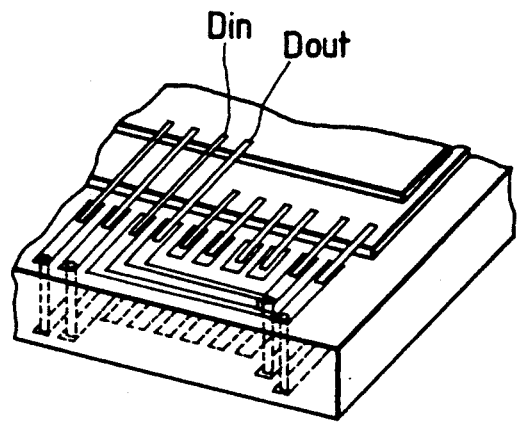
FIGS. 27(A-D) are an enlarged perspective view of FIG. 26.
Figure 27B:
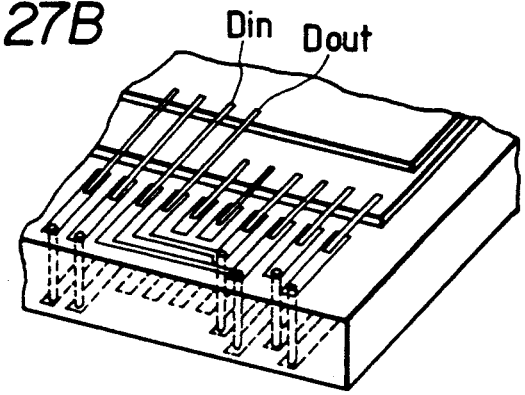
Figure 27C:
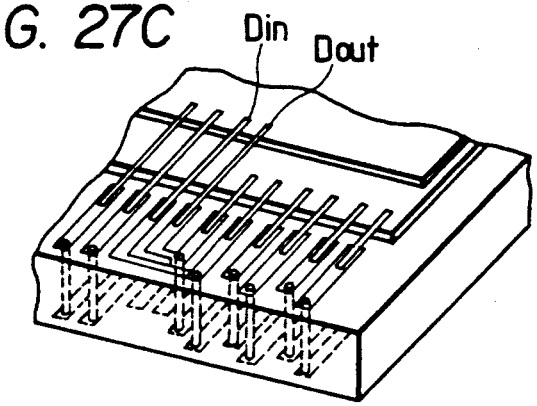
Figure 27D:
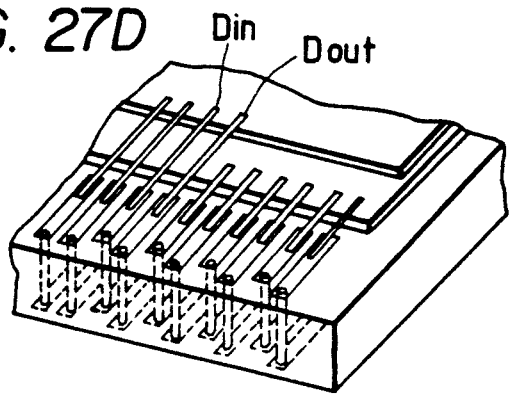

FIG. 26 presents a top plan view and corresponding section views taken along the line B—B' from the top plan view for explaining one embodiment of the stacked multi-chips package to be used in the defect relieving method thus far described. The small section view to approximate scale is supplemented in FIG. 26 with an expanded section view for ease of understanding. FIG. 27 shows enlarged perspective views of multi-chips package with different wiring arrangements shown in the various perspective views.

As is apparent from FIGS. 26 and 27, the base is exemplified by a lead frame on which a plurality of semiconductor chips are packaged by stacking them through film-shaped spacers. By using this multi-chip technology, one semiconductor memory device can be produced without any change in the appearance and size.

Figure 29:
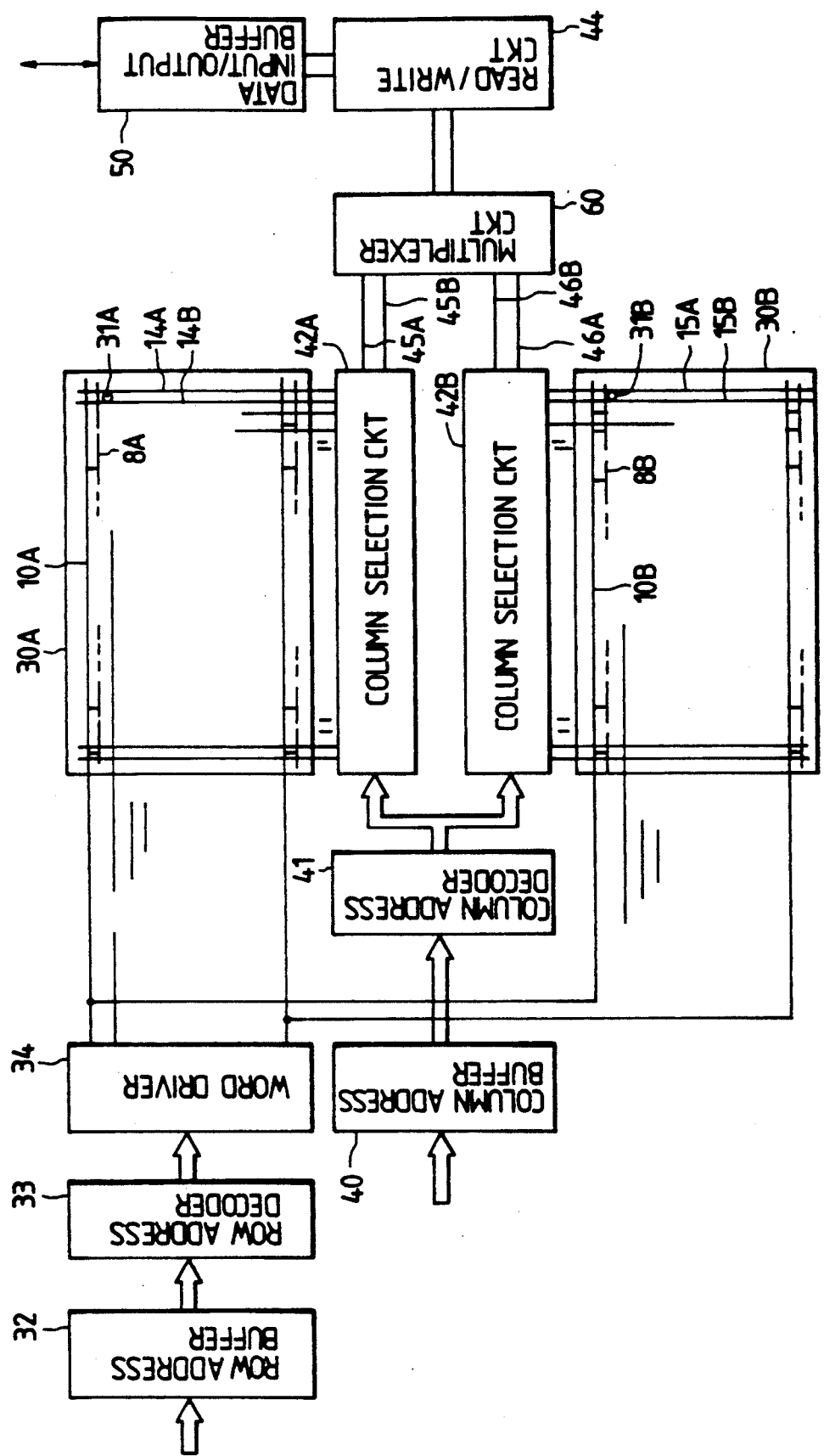
FIG. 29 is a block diagram showing the whole structure of the DRAM of FIG. 28.

FIG. 29 shows the fundamental structure of the DRAM which is equipped with rod shunting wiring lines according to another embodiment of the present invention.

The DRAM, as shown, is formed over one semiconductor substrate made of silicon.

Memory mats 30A and 30B are arranged at the center of the DRAM, as shown in FIG. 29, and are constructed by arranging one-transistor type memory cells 31A and 31B in a matrix shape. In the memory mat 30A, the selection terminals of the memory cells arranged in the matrix shape are coupled for the individual tows to corresponding word lines 8A, and the data input/output terminals of the memory cells are coupled to complementary bit lines 14A and 14B. The individual word lines 8A are made of polycrystalline silicon to act as the gate electrodes of the selection transistors of the memory cells. The word lines 8A are cut midways and are commonly connected wit the word shunting line 10A which is made of aluminum having a lower resistance than that of the polycrystalline silicon.

The aforementioned word lines 8A are cut at plural portions so that the disconnections of the aforementioned word shunting lines 10A can be detected at the stage of the wafer. Since the word lines 8A are cut, the detection of the disconnections of the aforementioned word shunting lines 10A by the conduction or function test can be facilitated to exclude the defective wafer before they are sent to the assembly step.

Since the aluminum making the aforementioned word shunting lines 10A has a lower resistance than that of the polycrystalline silicon making the aforementioned word lines 8A, the CR time constant of the word shunting lines 10A is smaller than that of the word lines 8A made of the polycrystalline silicon only so that the drive signal or selection signal form the word driver can be transmitted at a high speed to the terminal of the word shunting lines 10A.

In the memory mat 30B, too, the data input/output terminals of the memory cell 31B are coupled to complementary bit lines 15A and 15B, and word lines 8B constituting a common row are cut midways and commmonly connected with a word shunting line 10B.

Here, the materials for the word lines 8A and 8B should not be limited to the polycrystalline silicon but may be extended to a metal of high melting point such as W, Ti, Ta or Mo, or a composite film of the aforementioned polycrystalline silicon and the refractory metal.

In the memory mats 30A and 30B, the memory cells 31A and 31B, the word lines 8A and 8B, the word shunting lines 10A and 10B, and the bit lines 14A, 14B, 15A and 15B have their portions shown as representatives.

The word shunting lines 10A and 10B are coupled to the output terminals of a word driver 34 so that totally two of them each for the memory mat are simultaneously driven tot he selection level on the basis of the output selection signal of a row address decoder 33.

The complementary bit lines 14A and 14B at the side of the memory mat 30A are commonly connected through a column selection circuit 42A to common data lines 45A and 45B, and the complementary bit lines 15A and 15B at the side of the memory mat 30B are commonly connected through a column selection circuit 42B to common data lines 46A and 46B. The individual common data lines are coupled through a multiplexer circuit 60 to a read/write circuit 44. This read/write circuit 44 is connected through a data input/output buffer 50 to the outside.

An arbitrary memory cell of the DRAM of the present embodiment is accessed to by feeding a row address signal to a row address buffer 32 from the outside, by decoding the internal complementary address signal outputted form the row address buffer 32 by the row address decoder 33, and by selecting the individual word lines 8A and 8B to drive the halved memory mats 30A and 30B in response to the signal coming from the aforementioned row address decoder 33.

Next, the column address signal is fed to a column address buffer 40 and converted into an internal complementary address signal, which is then decoded by a column address decoder 41. In response to this decoded signal, the desired complementary bit lines 14A, 14B, 15A and 15B are connected through the not-shown selection switches contained in the column selection circuits 42A and 42B to the corresponding common data lines 45A, 45B, 46A and 46B. As a result, the memory cell 31A in the memory mat 30A and the memory cell 31B in the memory mat 30B are addressed. In the DRAM under discussion, which of the two memory cells addressed is determined by the predetermined one bit of the column address signal fred from the outside, although not especially limited thereto. In accordance with this determination, for example, the multiplexer circuit 60 is selected and controlled to connect either the aforementioned common data lines 45A and 45B or 46A and 46B to the aforementioned read/write circuit 44. As a result, either of the two memory cells selected by the row and column address signals is fed with the write data in accordance with the instruction of the read/write operation. Alternatively, either of the memory cell data is outputted to the outside.

In the DRAM, in order that the stored information in the form of charges in the storage capacity element of the memory cell may be prevented form being reduced and lost with the lapse of time, the memory cell data have to be refreshed within a constant time period to reproduce the stored content.

In order to refresh all the memory cells in the memory mats 30A and 30B, the refresh address signals are sequentially produced by the not-shown built-in refresh counter, while activating the not-shown sense amplifiers, so that they may be fed to the aforementioned row address decoder 33 to select the word shunting lines sequentially.

As in the present embodiment, the memory cell arrays corresponding to the data of one bit to be read and written are constructed of the two memory mats 30A and 30B, and the two word shunting lines are simultaneously driven by the single word line selection. Thus, the time period for refreshing the DRAM s a whole can be halved so that the using efficiency of the DRAM in the system operations can be improved for the restriction that the read/write operations cannot be accomplished during the refreshing operation.

Figure 30:
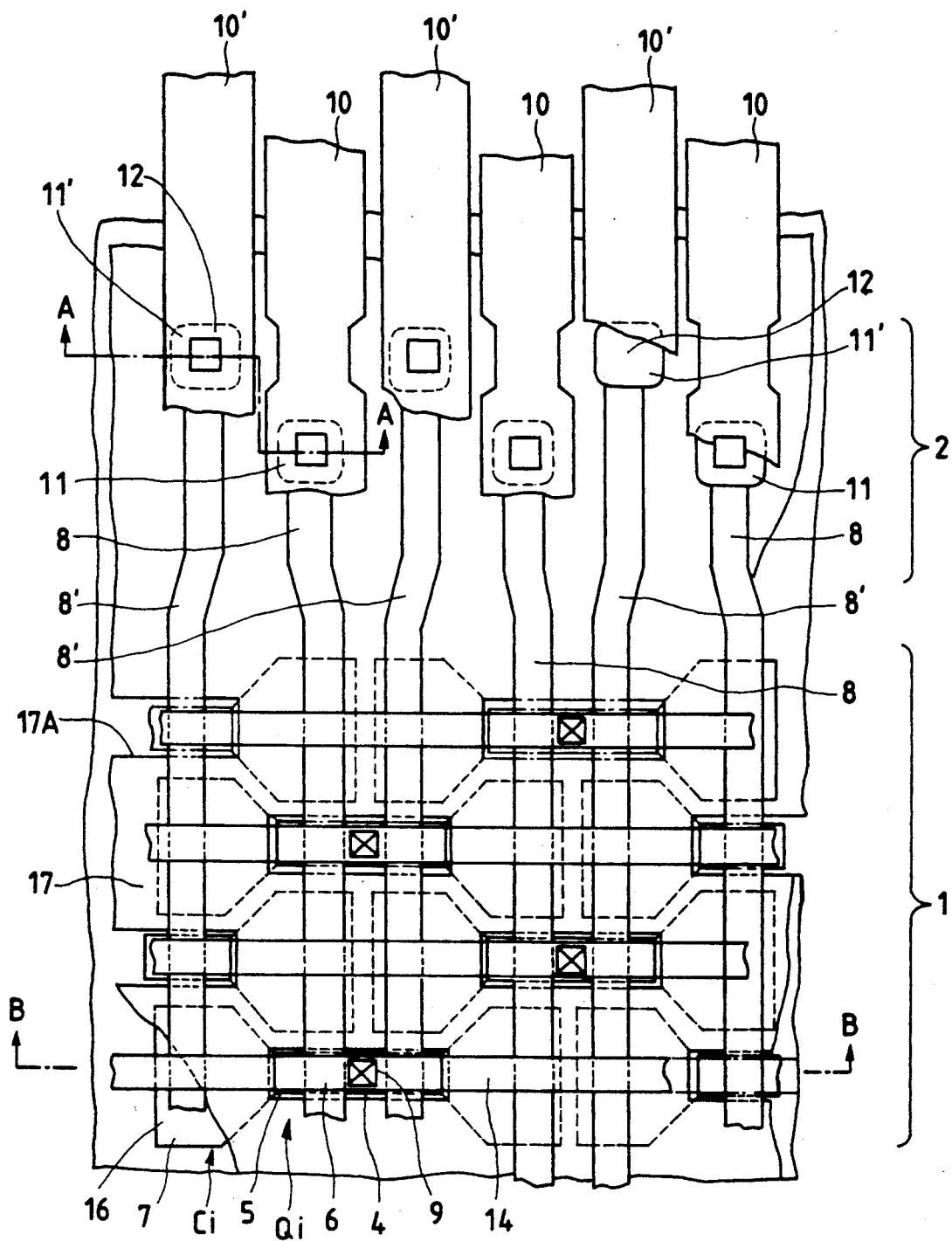
FIG. 30 is a top plan view showing a major portion of the memory mat of the DRAM.

FIG. 30 is a top plan view showing the major portion of the memory mat of the aforementioned DRAM. In FIG. 30, there are shown the memory cell forming region 1 and the shunting region 2.

Figure 31:
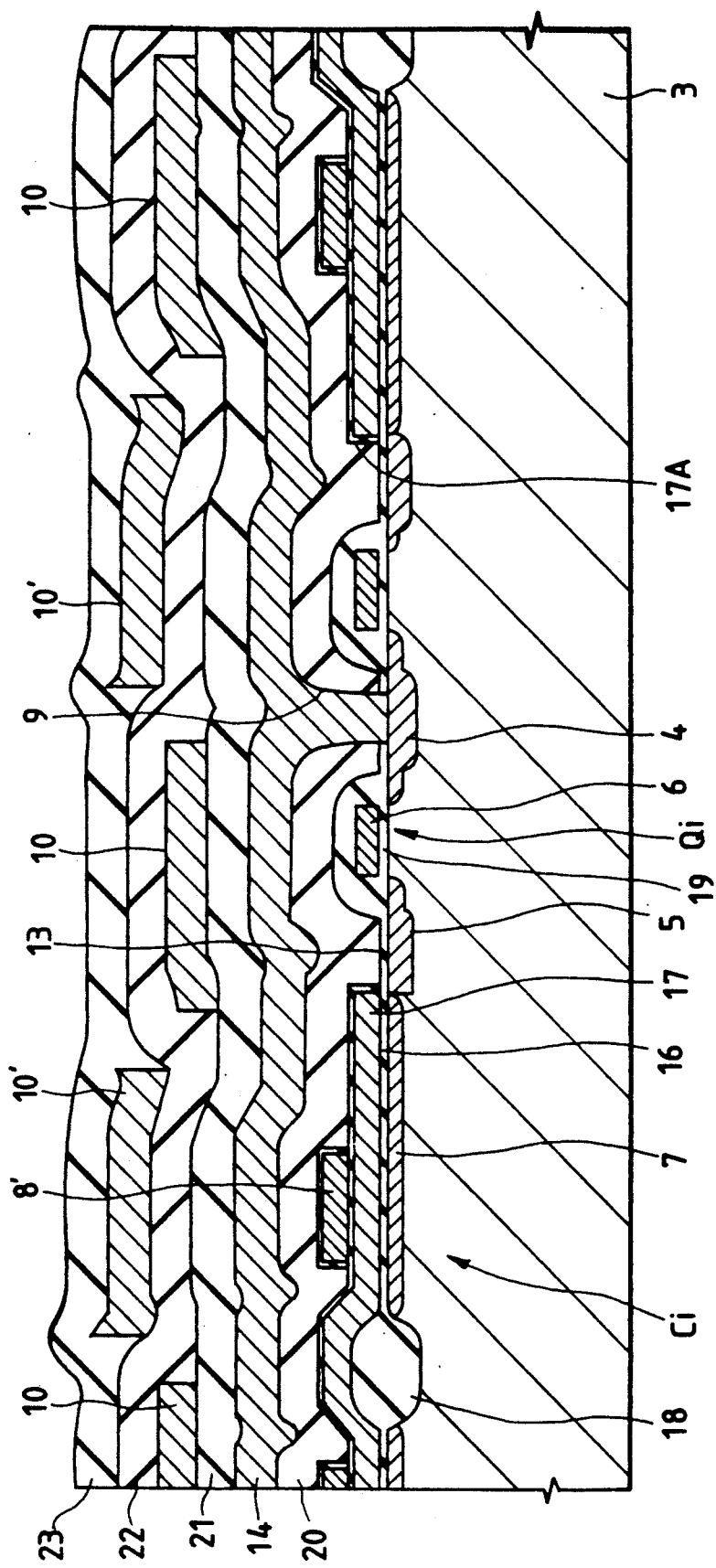
FIG. 31 is a section showing the memory cell portion of the major portion of the memory mat shown in FIG. 30.

The memory cell forming region 1 will be described with reference to FIG. 30 and FIG. 31 presenting a section taken along line B—B of FIG. 30. The memory cell to be formed in the aforementioned memory cell forming region 1 is of one-transistor type which is composed of: an N-channel selection MISFET Qi formed over a P-type semiconductor substrate 3; and a planar storage capacity element Ci connected directly with the selection MISFET Qi.

This MISFET Qi has its source or drain electrodes 4 and 5 formed at a predetermined spacing on the surface of the semiconductor substrate 3. Between the electrodes 4 and 5, there are formed through a gate insulating film 19 made of silicon oxide the gate electrodes 6 which also act as word lines 8 in even columns. Word lines 8' of odd columns are formed in the rows adjacent to the memory cells which are arranged in a common row. Over and in parallel with the word lines 8, there are formed word shunting lines 10 of even columns, which are formed of a second aluminum wiring layer. Over and in parallel with the aforementioned word lines 8', there are formed word shunting lines 10' of odd columns, which are formed of a third aluminum wiring layer. These word shunting lines 10' are formed over the wiring layer in which the word shunting lines 10 are formed. In other words, the plural word shunting lines shown representatively in FIG. 30 are made of layers, the adjacent ones of which are vertically offset and made different.

One source or drain electrode of the aforementioned MISFET Qi is connected with the planar storage capacity element Ci. This planar storage capacity element Ci is composed of: a lower electrode 7 formed over the semiconductor substrate 3, a plate electrode 17 formed on the surface of the semiconductor substrate; and a dielectric film 16 formed between the lower electrode 7 and the plate electrode 71. This plate electrode 17 is formed with an opening 17A over the aforementioned MISFET Qi. Over the aforementioned plate electrode 17, there are formed through an insulating film the word lines 8' of odd columns, which are made of polycrystalline silicon.

On the surface of the semiconductor substrate including the aforementioned storage capacity element Ci and the aforementioned word lines 8', there is deposited an inter-layer insulating film 20, which is formed thereover with bit lines 14 to be connected through contact holes 9 with the aforementioned source or drain electrodes. Over the aforementioned inter-layer insulating film 20 including the bit lines 14, there is formed an inter-layer insulating film 21 which is formed thereover with the word shunting lines 10 of even columns, for example. On the inter-layer insulating film 21 including the word shunting lines 10, there is deposited an inter-layer insulating film 22, which is formed thereover with the word shunting lines 10' of odd columns. A passivation film 23 is formed over the aforementioned inter-layer insulating film 22 including the aforementioned word shunting lines 10'.

Incidentally, reference numeral 18 designates an inter-element separating insulating film which is made of silicon oxide.

Figure 28:
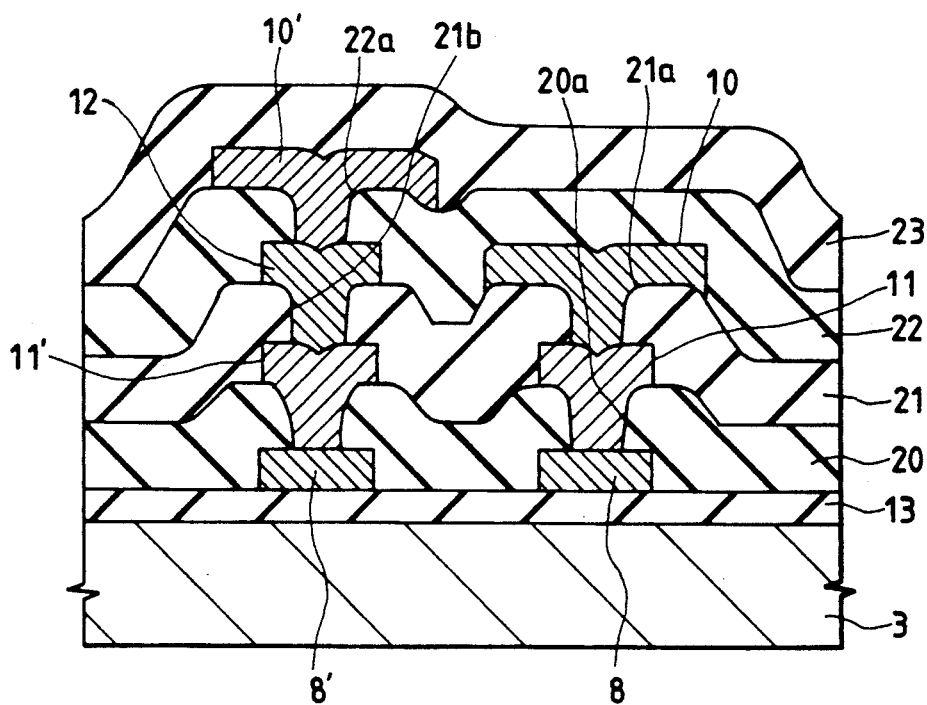
FIG. 28 is a longitudinal section showing one example of the vertically different arrangement structure of the word shunting lines in the DRAM according to one embodiment of the present invention.

Next, the aforementioned shunting region 2 shown in FIG. 30 will be described in the following with reference to FIG. 30 and FIG. 28 presenting the section taken along line A—A of FIG. 30.

As has been described hereinbefore, for example, the word lines 8 of even columns are connected at the shunting region with the word shunting lines 10 of even columns, and the word lines 8' of odd columns are connected at the shunting region with the word shunting lines 10' of odd columns.

On the aforementioned word lines 8 and 8', there is deposited the inter-layer insulating film 20 which is made of silicon oxide. This inter-layer insulating film 20 is formed with contact holes 20a at positions corresponding to the word lines 8 and 8'. Pad electrodes 11 and 11' made of aluminum are so formed over the aforementioned inter-layer insulating film 20 that they are connected with the word lines 8 and 8' through the aforementioned contact holes 20a. The aforementioned pad electrodes 11 and 11' are formed simultaneously as the bit lines 14 made of the first aluminum wiring layer are formed. On the aforementioned inter-layer insulating film 20 including the pad electrodes 11 and 11', there is deposited an inter-layer insulating film 21 which is made of silicon oxide. This inter-layer insulating film 21 is formed with through holes 21a and 21b at positions corresponding to the aforementioned pad electrodes 11 and 11'.

The word shunting lines 10 of even columns are so formed over the inter-layer insulating film 21 that they are connected with the pad electrode 11 through the aforementioned through holes 21a.

A pad electrode 12 made of aluminum is so formed that it is connected through the aforementioned through hole 21b with the aforementioned pad electrode 11'. This pad electrode 12 is formed simultaneously with the aforementioned word shunting lines 10 of even columns. On the aforementioned inter-layer insulating film 21 including the word shunting line 10 and the pad electrode 12, there is deposited an inter-layer insulating film 22 which is made of silicon oxide. This inter-layer insulating film 22 is formed with a through hole 22a over the pad electrode 12. Word shunting lines 10' of odd columns of aluminum are so formed over the aforementioned inter-layer insulating film 22 that they are connected with the aforementioned pad electrode 12 through the aforementioned through hole 22a.

This shunting is accomplished at the shunting region having no memory cell. This is because the first and second aluminum wiring layers are used for forming the pad electrodes. Thus, the adjacent word shunting lines 10 and 10' are formed of vertically different layers through the insulating film so that their transverse spacing can be reduced. Even in case the degree of integration equal to or higher than that of the prior art is to be retained, the durability against the EMD and SMD can be improved by increasing the width of the word shunting lines. Since the adjacent word shunting lines are formed of vertically different layers, the spacing between the adjacent word shunting lines can be made larger than that of the prior art while improving the durability against the EMD and SMD in relation to the desired degree of integration. Thus, it is possible to reduce the undesired coupling capacity between the adjacent word shunting lines. When the word shunting lines to be selected are to be driven to the selection level, the adjacent word shunting lines to be intrinsically unselected may have their potentials raised to eh undesired level and over the threshold voltage of the selection transistor. Then, the word lines of different rows may be simultaneously selected to cause the conflicts of the memory cell data and accordingly malfunctions in the read/write of the data. The fear of the malfunctions can be eliminated by decreasing the coupling capacity, as has been described hereinbefore.

Over the aforementioned inter-layer insulating film 22 including the aforementioned word shunting lines 10' of odd columns, there is formed a passivation film 23 which is made of nitride, for example. In the present embodiment, as has been described with reference to FIG. 29, one word shunting line is selected from each of the halved memory mats 30A and 30B. When the word shunting line formed in the upper layer is to be selected, the load for driving this is lighter than that for driving the word shunting line of the lower layer. The capacitance of the upper shunting line for the semiconductor substrate is smaller than that of the lower shunting line for the same. Thus, the loads of the word shunting lines formed in the upper and lower layers are different, although only slightly. In the present embodiment, the row address decoder is given such a selection logic that one of the two word shunting lines selected simultaneously may be that formed in the upper layer whereas the other may be that formed in the lower layer. When the a desired address signal is fed to the row address decoder, one of the word shunting lines to be selected one by one from each of the memory mats in response to the address signal is used as the word shunting line formed in the upper layer, whereas the other is sued as the word shunting line formed int he lower layer. Especially in the present embodiment, the word shunting lines of the memory mat 30A are alternately formed in the order of the lower and upper layers form the left-hand side, and the word shunting lines of the memory mat 30B are alternately formed in the order of the upper and lower layers from the lefthand side. The upper word shunting lines and the lower word shunting lines are alternately coupled in pairs to the individual output terminals of the word drivers. Irrespective of the row address signals fed to the row address decoder, the loads of the two word shunting lines to be driven by the word driver are always constant so that the operations can be accomplished at a high speed. No matter which of the word shunting lines to be simultaneously selected might be the upper or lower word shunting line, the load is higher in case the two lower word lines are selected than in case the two upper word lines are selected. As a result, the CR time constant is increased to delay the reach time of the drive signal relatively. As a result, the internal timing setting has to match the later access time of the case in which the two lower word shunting lines are selected.

The operational effects to be obtained from the embodiments thus far described will be descried in the following:

(1) A large-scaled semiconductor memory device is constructed by macro-cellulating a circuit block including: a memory array; an address selector for the memory array; and an input/output circuit for reading/writing the memory cell. According to this structure, there can be attained an effect that the design layout and control of the large-scaled semiconductor memory circuit can be simplified by combining the macro-cellulations.

(2) The aforementioned semiconductor memory device is constructed of: a memory circuit having a plurality of the aforementioned macro cells; and a control circuit for generating a selection signal for selecting any of the plural macro cells and major timing signals necessary for the selections. According to this structure, there can be attained an effect that the circuit of the macro cells can be made small to reduce the whole circuit scale because each control circuit can be commonly used.

(3) The aforementioned control circuit is exemplified by an address control circuit for sharing the address signals into an address signal for designating the memory cell in the macro cell and an address signal for designating the macro cell itself, and a refresh address counter circuit to be commonly used for the plural macro cells. As a result, the memory circuit composed of the macro cells can be simplified to provide an effect that the whole circuit scale can be reduced.

(4) A plurality of macro cells having specific circuit functions are provided, and bonding pads for signals inputted from the outside are disposed close to the corresponding macro cells and are bonded by LOC leads extending close thereto and coating wires. According to this structure, there can be attained an effect that the transmission of the signals to be fed from the outside to the macro cells can be speeded up.

(5) The macro cell equipped with those bonding pads and LOC leads is composed of a circuit constituting one semiconductor memory circuit itself. Thus, there can be attained an effect that the layout of the large-scaled semiconductor memory device can be simplified and speeded up.

(6) The aforementioned LOC leads are used as a part of the wiring lines for connecting the bonding pads disposed to correspond to the plural macro cells for feeding eh same signal. There can be attained an effect that the operations of the large-scaled integrated circuit can be speeded up.

(7) The aforementioned LOC leads can also be used as a part of the signal wiring lines to be transmitted between the plural macro cells. There can be attained an effect that the operations can be speeded up.

(8) The backing wiring lines of the word lines to be arranged int eh memory array and in a common plane are multi-layered, and the backing wiring lines to be used in the adjacent word lines are made of different layers. There can be attained an effect that the word lines can be substantially laid out in high density.

(9) The aforementioned backing wiring lines are made of two metallic wiring layers which are vertically interchanged at the word shunting portion. There can be attained an effect that the unbalance in the wiring capacitance and the coupling can be eliminated.

(10) The bit lines to be arranged in the memory array are multi-layered so that the adjacent bit lines may be sued as different wiring layers. There can be attained an effect that the bit lines can be laid out in high density.

(11) The aforementioned bit lines are made of two metallic wiring layers such that their adjacent ones are arranged to become upper and lower layers alternately at the unit of the sense amplifier. There can be attained an effect that the bit lines can be laid out in high density.

(12) The aforementioned bit lines are constructed by arranging a pair of parallel-arranged complementary bit lines alternately as upper and lower wiring lines. There can be attained an effect that the bit lines can be laid out in high density.

(13) The two-layered bit lines are vertically interchanged midways. There can be attained an effect that the unbalance of the capacitance and the coupling noises of the bit lines can be eliminated.

(14) The backing wiring lines corresponding to the adjacent word lines are alternately arranged by using the two metallic wiring layers. Drivers for driving the word lines are arranged from the two ends of the word lines. Since the drivability of the drivers can be halved according to this structure, There can be attained an effect that the word lines can be packaged in high density so that the driver having its drivability raised accordingly can be arranged.

(15) The backing wiring lines corresponding to the adjacent word lines are alternately arranged by using the two metallic wiring layers, and the word lines are arranged at their one-side ends with odd word line drivers and at their other ends with even word line drivers so that the pitch of the word lines can be enlarged by two times, as seen from the drivers. There can be attained an effect that the word lines can be packaged in high density so that the driver having its drivability raised accordingly can be arranged.

(16) The backing wiring lines corresponding to the adjacent word lines are alternately arranged by using the two metallic wiring layers, and their drivers are constructed of two steps, one of which is arranged close to the word lines and the other of which is arranged apart from the same. By using the upper metallic wiring layer as the output line of the remote driver, the pitch of the word lines, as seen from the side of the driver, can be such that the word lines can be packaged in high density so that the driver having its drivability raised accordingly can be arranged.

(17) Of the plural pairs of bit lines, the odd bit lines are arranged at their one-side ends with the corresponding sense amplifiers, and the even bit lines are arranged at their other ends with the corresponding sense amplifiers. Thus, there can be attained effects that the amplification factor of the sense amplifiers can be enlarged and that the high-density layout of the bit lines can be realized.

(18) The aforementioned odd and even bit line pairs are alternately arranged by the two metallic wiring layers. There can be attained an effect that the bit lines can be laid out in high density.

(19) The backing wiring lines of the word lines to be arranged orthogonally of the aforementioned bit lines are constructed of two metallic wiring lines. There can be attained an effect that the memory cell array can be laid out in high density.

(20) The bit lines and word lines to be accessed and the sense amplifier columns ar driven in the normal mode, and the numbers of the word lines to be simultaneously selected and the operating sense amplifier columns ar switched in the refresh mode to integer times as large as the normal mode. There can be attained an effect that the power consumption and the refresh cycle number can be reduced.

(21) There is provided a semiconductor memory circuit which has a macro-cellulated circuit block including: a memory array; an address selection circuit for the memory array; and an input/output circuit for reading/writing the memory cell, so that the column circuit of the macro-cellulated semiconductor memory circuit may be inactivated in the refresh mode. There can be attained an effect that the current consumption in the refresh operation can be reduced.

(22) In the counter test mode, the set/reset method different from that in the refresh mode is adopted so that the column circuit is activated only in the counter test mode to output the read data. There can be attained an effect that the counter operation can be tested while reducing the power consumption in the refresh operations.

(23) There is provided a semiconductor memory circuit which has a macro-cellulated circuit block including: a memory array; an address selection circuit for the memory array; and an input/output circuit for reading/writing the memory cell, so that the word line drive circuit for the normal mode may be rendered inoperative when in the refresh mode whereas the word line selections may be accomplished by a circuit having a small drivability and made receptive of the selection signal at that input portion. There can be attained an effect that the current consumption and the peak current in the refresh mode can be reduced.

(24) There is provided a semiconductor memory circuit which has a macro-cellulated circuit block including: a memory array; an address selection circuit for the memory array; and an input/output circuit for reading/writing the memory cell, to give a function to make the sense amplifier current smaller in the refresh mode than that in the normal mode. There can be attained an effect that the current consumption and the peak current in the refresh mode can be reduced.

(25) There is provided a semiconductor memory circuit which has a macro-cellulated circuit block including: a memory array; an address selection circuit for the memory array; and an input/output circuit for reading/writing the memory cell, to give a function to make the word line selection time and/or the sense amplifier amplification time longer than those in the normal cycle. There can be attained an effect that the current consumption in the refresh mode can be reduced.

(26) There is provided a semiconductor memory circuit which has a macro-cellulated circuit block including: a memory array; an address selection circuit for the memory array; and an input/output circuit for reading/writing the memory cell, so that the refreshing operation is accomplished while giving a time difference to the plural macro-cells with the peak currents of the sense amplifiers being different from one another. There can be attained an effect that the current consumption in the refresh mode can be reduced.

(27) There is provided a semiconductor memory circuit which has a macro-cellulated circuit block including: a memory array; an address selection circuit for the memory array; and an input/output circuit for reading/writing the memory cell, so that one or more macro-cellulated circuit blocks may be activated in the normal mode whereas circuit blocks an integer number as many as that of the normal mode may be activated in the refresh mode. There can be attained an effect that the power consumption and the refresh cycle number can be reduced.

(28) Of the memory arrays constituting a semiconductor memory circuit, one of two memory chips having no overlapped defective portions is accommodated in one package so that only the non-defective portions of the two memory chips may be accessed to. There can be attained an effect that a complete product can be obtained from the defective chips which have been disposed of in the prior art.

(29) The memory array of the aforementioned two memory chips is divided into two memory areas according to the addresses of one or plural specific bits so that such one of the two chips as has non-defective memory areas may be selectively accessed in accordance with the address signal for designating the corresponding memory area. There can be attained an effect that the defective chips can be relieved without any increase in the current consumption.

(30) One of the two memory chips is assigned a priority so that, when one of the memory chips is accessed, the other memory chip is accessed. There can be attained an effect that the defective chip can be relieved without increasing the current consumption for the two chips.

(31) The aforementioned two memory chips are rendered operative together till the previous address decision before the word line selections are started so that the memory chips having been unaccessed are instantly stopped in accordance with the address decision. There can be attained an effect that the increase in the current consumption can be prevented while relieving the defective chips.

(32) The aforementioned memory chips are equipped with a defect relieving circuit of the redundancy circuit method, which is used for forming a constant memory area having no defect. There can be attained an effect that the redundancy circuit can be efficiently used.

(33) Either three or more memory chips having no defect at an identical address or one memory chip having three or more divided memory blocks is packaged in one package, and the memory chips or memory blocks are subjected to a memory access in parallel so that the read signal may be outputted through a majority decision logic circuit. There can be attained an effect that the defect relief can be accomplished by using the defective chips.

(34) Redundant memory chips are prepared for the main memory chips for storing data of plural bits so that they may be accessed when the access to the defective bits by the main memory chips is detected. There can be attained an effect that the defect relief can be accomplished by using the memory chips having defective bits.

(35) Since the adjacent word shunting lines 10 and 10' are made of vertically different layers through an insulting layer, their spacing corresponding to the adjacent memory cells can be reduced so that the word shunting lines 10 and 10' can be made wider than the prior art to improve the durability against the EMD and SMD.

(36) The spacing between the adjacent word shunting lines 10 and 10' can be made larger than that of the prior art to reduce the undesired coupling capacity formed thereby. As a result, the word shunting lines to be left unselected can be prevented from being erroneously set to the selection level to prevent the read/write malfunctions of the data due to the coupling capacity.

(37) The row address decoder 33 always selects the two word shunting lines formed in vertically different wiring layer regions, when it selects the word shunting lines 10A and 10B one by one from the two memory mats. As a result, the overall load of the two selected word shunting lines can always be identical to achieve the high-speed access.

Although our invention has been specifically described in connection with the embodiments thereof, it should not be limited thereto but can naturally be modified in various manners without departing from the gist thereof. For example, the macro-cellulated dynamic RAM may be modified from the aforementioned address multiplex method, in which the row address signals and the column address signals are inputted in the time-series manner, to a structure in which the row address signals and the column address signals are inputted in parallel. In this non-address multiplex method, the chip selection signal or chip enable signal is used in place of the address strobe signal, and a variety of timing generators necessary for the internal operations are accordingly provided. On the other hand, each memory block may have a storage capacity of about 1 Mbits, and the memory blocks of 4×4 number are arranged to provide a semiconductor memory device of about 16 Mbits. The memory capacity of each memory block may be about 4 Mbits so that a semiconductor memory device having a storage capacity of 32 Mbits may be provided by combining eight memory blocks. Thus, the storage capacity of one memory block and the combination of the whole storage capacities may adopt a variety of modes of embodiments.

Figure 32:
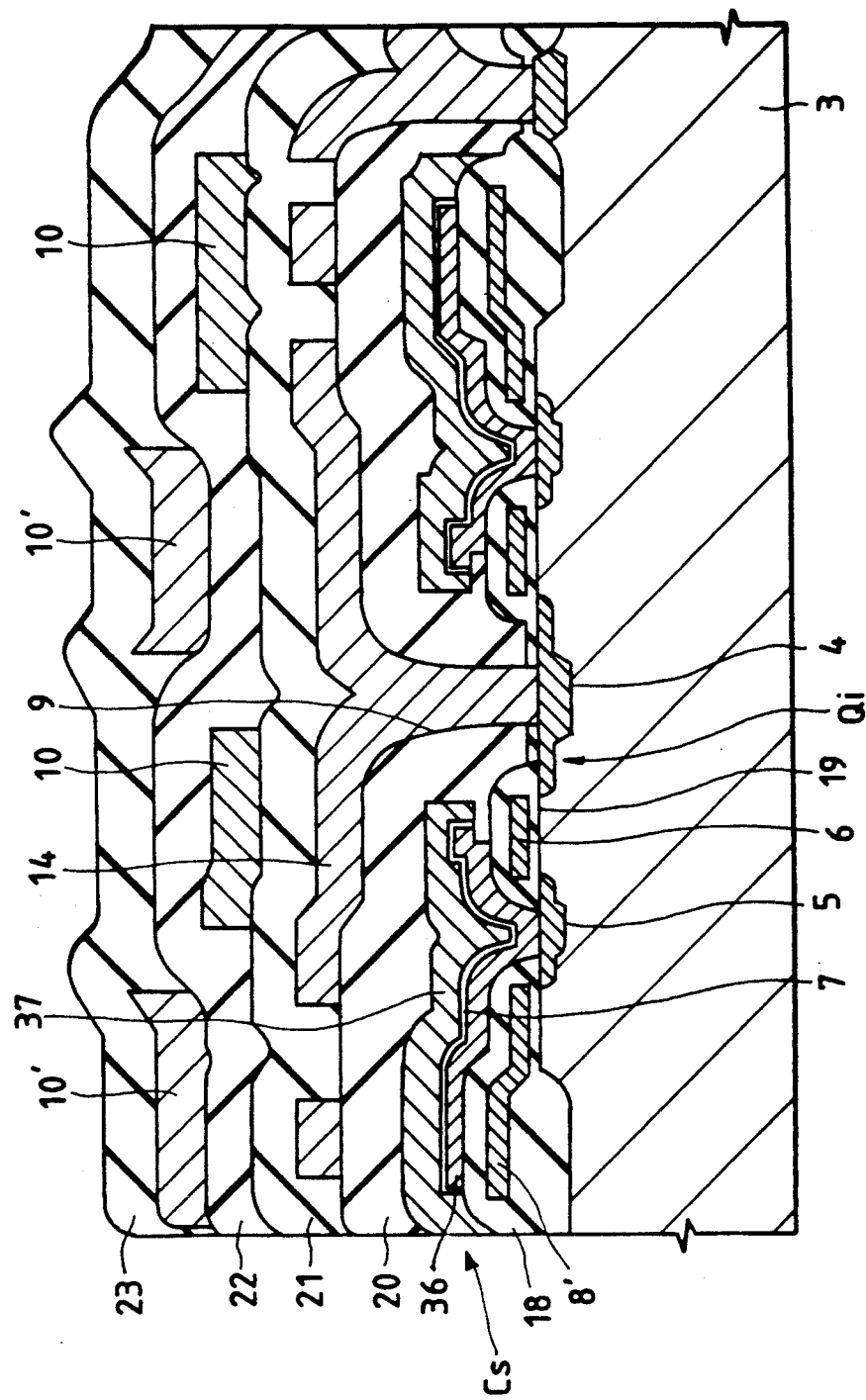
FIG. 32 is a longitudinal section showing an essential portion of the DRAM having the stack type storage capacity element according to another embodiment of the present invention.

In the foregoing embodiments, for example, although the storage capacitors of the memory cells are of the planar type, they should not be necessarily limited thereto but may be of stack or trench type. FIG. 32 is a section showing the essential portion of a memory cell in case the stack type storage capacity element is used. Since the stack type storage capacitor element Cs, as shown, has a stereoscopic structure, a larger storage capacitor can be achieved with a smaller cell area than that of the planar type. Since, moreover, no diffusion layer region is required in the charge storage capacitor portion, it can be expected to improve the soft error coefficient due to the alpha rays. In FIG. 32, reference numeral 36 designates one electrode of the stack type storage capacitor element Cs, and numeral 37 designates the other electrode of the storage capacitor element Cs shared with another storage capacity element.

The same parts as those of the embodiment shown in FIGS. 28 to 31 are designated with common reference numerals so that their detailed descriptions are omitted.

Figure 33:
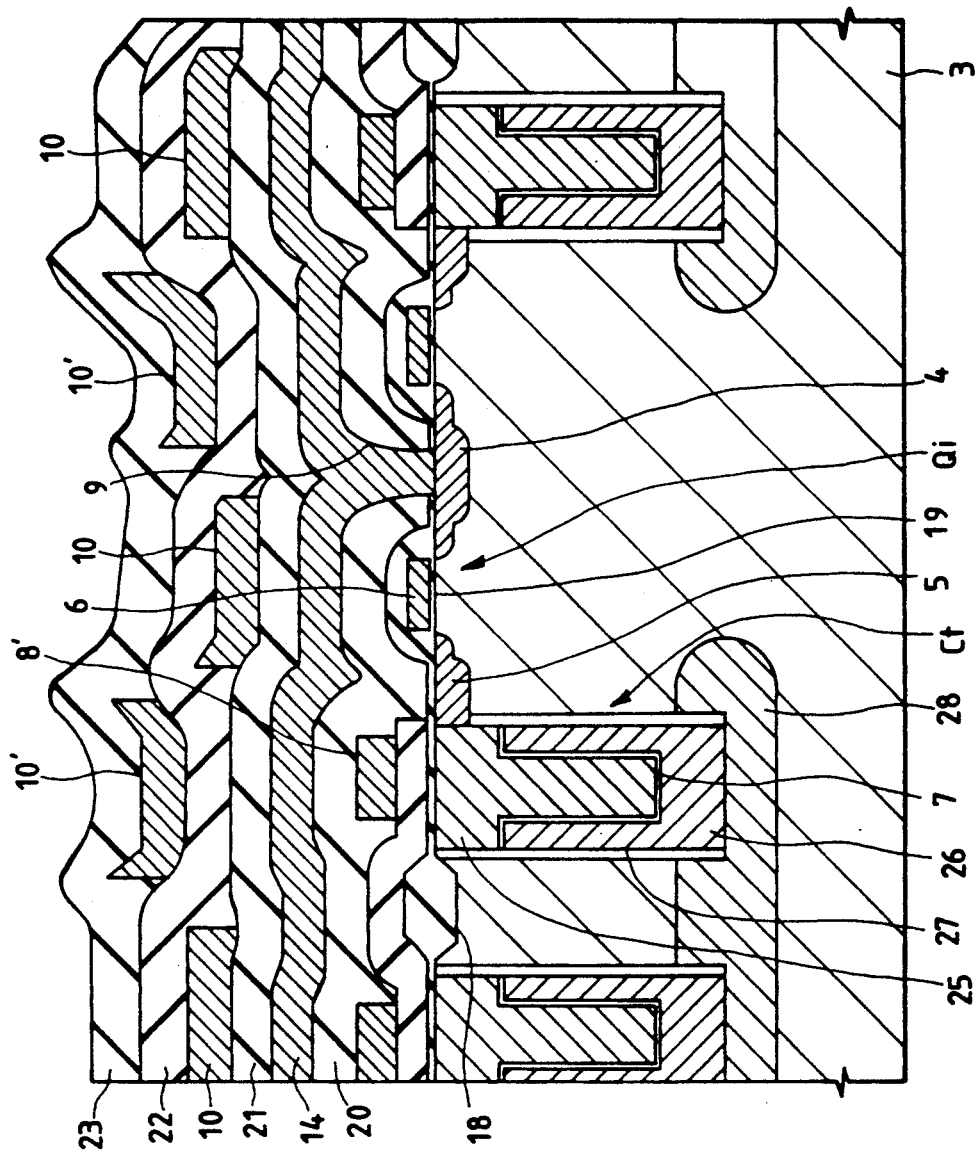
FIG. 33 is a longitudinal section showing the essential portion of the DRAM having the trench type storage capacity element according to still another embodiment of the present invention.

FIG. 33 is a section showing the essential portion of the memory cell in case the trench type storage capacity element is used. As shown, the trench type storage capacity element Ct is formed to dig a trench in the semiconductor substrate so that a larger storage capacity than that of the stack type can be attained with a smaller cell area. If the memory cell is thus reduced in size, the necessity for the technology for forming the word shunting lines alternately in different layers, as disclosed in the present invention, grows higher and higher. In FIG. 33: reference numeral 25 designates one electrode of the trench type storage capacity element Ct; numeral 26 the other electrode of the storage capacity element Ct shared with another storage capacity element; number 27 a sheath insulating film; and numeral 28 a conductive region for connecting the electrodes 26 with each other.

In FIGS. 32 and 33, the same parts as those of the embodiment shown in FIGS. 28 to 31 are designated with common reference numerals so that their detailed descriptions are omitted.

In the foregoing embodiment, the memory mat is halved for one bit of the read/write data, but the present invention should not be necessarily limited thereto. The memory mats may be modified to have an increased number of divisions and to be formed for each bit.

In the foregoing embodiment, moreover, the word shunting lines are formed of two upper and lower layers. However, the present invention should not be limited thereto but can be modified such that the word shunting lines are formed of three or four layers. In this case, the address decode logic for always making constant the loads of the plural word shunting lines to be selected has to consider a complicated disadvantage.

Although the foregoing embodiment has its word shunting lines made of aluminum, the present invention should not be necessarily limited thereto but may suitably adopt a refractory metal such as tungsten or molybdenum or their silicides.

In the forgoing embodiment, the pad electrodes are sued to connect the short shunting lines and the word lines. The present invention should not be limited thereto but may adopt a method in which contact holes are formed through two or three inter-layer insulating films to connect the word shunting lines and the word lines therethrough.

Although the memory blocks have been shown only as dynamic RAMS, other types of memory could be used such as a static RAM, a programmable ROM (Read Only Memory) such as EEPROM or EPROM, or a combination of the dynamic RAM and the static RAM. As one example, the aforementioned static memory may be utilized as the cashe memory portion. Thus, the memory block can take a variety of modes of embodiments.

The defect relieving method may be either accommodated in one package, as has been described hereinbefore, or suited for a plurality of semiconductor integrated circuit devices which are mounted over a packaging substrate such as a printed substrate.

The present invention may be directed to not only the aforementioned semiconductor memory device (including DRAM, SRAM and so on) but also a macro-cellulated circuit block such as the memory circuit, the micro processor, its peripheral circuit, or a variety of semiconductor integrated circuit devices or one-chip micro computers having a high performance and multiple functions.

The effects to be obtained by the representative examples of the invention disclosed herein will be briefly summarized as follows. Specifically, a large-scaled memory device can be provided by macro-cellulating a circuit block including a memory array, an address selection circuit for the memory array, and an input-/output circuit for reading/writing the memory cell, and by providing a control signal for generating the selection signal for selecting any of the plural macro cells and a major timing signal necessary for the operations. A plurality of the macro cells having the specific circuit functions are provided, and the bonding pads for the signals inputted from the outside are disposed close to the corresponding macro cells and are bonded by the LOC leads extending in the vicinity thereof and the coating wires so that the transmission of the signals to be fed from the outside to the individual macro cells can be speeded up. At the same time, the operations of the large-scaled integrated circuit can be speeded up by using the aforementioned LOC leads as a part of the wiring lines for connecting the bonding pads which are provided to correspond to the plural macro cells for feeding the common signals.

The backing wiring lines of the word lines to be arranged in the memory array in a common plane and in parallel are multi-layered, and the backing wiring layers to be used in the aforementioned adjacent word lines are made of different layers which are vertically interchanged at the word shunting portion, so that the unbalance of the wiring capacitance or the coupling can be eliminated while making the word lines denser. The highly dense layout of the bit lines can be realized by multi-layering the bit lines to be arranged in the memory array and by constructing the sense amplifier units or the bits lines of upper and lower wiring layers one by one. Moreover, the unbalance of the bit line capacity and the coupling noise can be eliminated by vertically interchanging the bit lines in their midway points.

The high-speed drive and high-density layout of the word lines can be realized by arranging the word line drivers at the two ends of the word lines to drive the word lines from the two ends, or by arranging the odd word line drivers at the one-side ends of the word lines and the even word line drivers at the other ends of the word lines. The amplification factor of the sense amplifiers can be enlarged, and the high-density layout of the bit lines can be realized, by arranging the corresponding sense amplifiers at the one-side ends of the odd bit lines of the plural bit line pairs and the corresponding sense amplifiers at the other ends of the even bit lines. The high-density layout of the bit lines can be achieved by arranging the odd bit lines pairs and the even bit line pairs alternately by the two metallic wiring layers.

The power consumption and the refresh cycle number can be reduced by driving the bit lines and word lines to be accessed and the sense amplifier rows in the normal mode and by switching, in the refresh mode, the numbers of the word lines to be simultaneously selected and the operating sense amplifier columns to integer times as many as that in the normal mode. In the refresh, moreover, the column circuit of the macro-cellulated semiconductor memory circuit can be inactivated to reduce the current consumption of the refreshing operation. The counter test mode is set by the set/reset method different from that in the refresh mode, and the read data is outputted by activating the column circuit so that the counter operations can be tested while reducing the power consumption in the refresh operations. The current consumption in the refresh mode can be reduced to increase the number of the memory cells to be once refreshed, by rendering the word line driver inoperative in the refresh mode to select the word lines in the circuit made receptive of the selection signal of the input portion of the driver and having a small drivability, by making the sense amplifier current smaller than that in the normal mode, by making the word line selection time and/or the sense amplification time longer than those of the normal cycle, and by refreshing the plural macro cells with a time difference in which the peak currents of the sense amplifiers ar offset from each other. The power consumption and the refresh cycle number can be reduced by activating the one or plural macro-cellulated circuit blocks in the normal mode and by activating the circuit blocks of an integer number as many as that in the normal mode when in the refresh mode.

In accordance with another aspect of the invention, a complete product can be obtained from the defective chips which are disposed of in the prior art, by accommodating two memory chips having no overlapped defective portions in one package so that only the non-defective portion of the two memory chips may be accessed. Moreover, the defective chips can be relieved without any increase in the current consumption by dividing the memory array of the two memory chips into two memory areas according to the addresses of one or plural specific bits and by selectively accessing the chip having the memory area without any defect in accordance with the address signals designating the individual memory areas. If one of the two memory chips is given a priority and has its defective portion accessed, the defective chip can be relieved without any increase in the current consumption as for the two chips, by making a switch to access the other memory chip. The aforementioned memory chips can use the redundancy circuits efficiently by providing the defect relieving circuit using the redundancy circuit method so that the defect relieving circuit may be used for forming a constant memory area having no defect.

Since the adjacent word shunting lines are formed of vertically different layers, their width can be enlarged to prevent the EMD and SMD in the word shunting lines.

Since, moreover, the adjacent word shunting lines can have their coupling capacitance reduced, the word shunting lines to be unselected are substantially brought into the selected state to provide an effect that it is possible to prevent the malfunctions in the read/write data.

Another effect is obtained such that the accessing operations of the semiconductor memory circuit can be stabilized while permitting high-speed access, by giving the row address decoder the selection logic such that the loads of the word shunting lines to be selected are constant even for any address signal when the row address decoder selects the word shunting lines simultaneously.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor integrated circuit device comprising:

a first memory block formed in a main surface of a semiconductor chip, which includes a first memory array having memory cells arranged in a matrix form, a first address decoder coupled to said first memory array and a first data input/output circuit coupled to said first memory array;

a second memory block formed in said main surface of said semiconductor chip, which includes a second memory array having memory cells arranged in a matrix form, a second address decoder coupled to said second memory array and a second data input/output circuit coupled to said second memory array;

a first external terminal formed in said main surface of said semiconductor chip, to provide an external connection point for internal elements of said first memory block, said first external terminal being formed to be closer to the first memory block than to the closet peripheral edge of the semiconductor chip to shorten the connection distance between the first external terminal and the first memory block;

a second external terminal formed in said main surface of said semiconductor chip, to provide an external connection point for internal elements of said second memory block, said second external terminal being formed to be closer to the second memory block than to the closest peripheral edge of the semiconductor to shorten the connection distance between the second external terminal and the second memory block;

a lead attached on said main surface of said semiconductor chip via an insulator;

a first bonding wire for coupling said lead and said first external terminal; and a second bonding wire for coupling said lead and said second external terminal, wherein said lead crosses a peripheral edge of the chip to extend from outside of said chip to the interior of said chip, wherein said lead has a first end located over the interior of said chip, and wherein at least one of said first and second bonding wires extends from a portion of said lead located over the interior of said chip, other than the first end of said lead, to shorten the distance for the connection between the lead and the corresponding first or second external terminal.

2. A semiconductor integrated circuit device according to claim 1, further comprising:

a first circuit for outputting a signal for selecting either one of said first and second memory blocks.

3. A semiconductor integrated circuit device according to claim 2, further comprising:

a first circuit for outputting a first address signal supplied to said first and second memory blocks and a second address signal supplied to said first circuit.

4. A semiconductor integrated circuit device according to claim 3, wherein said memory cells are dynamic type memory cells.

5. A semiconductor integrated circuit device according to claim 4, further comprising:

a third circuit for outputting a third address signal supplied to said first and second memory blocks when said semiconductor integrated circuit device is in a refresh mode.

6. A semiconductor integrated circuit device according to claim 5, wherein said first memory block has a first address selector for supplying either one of said first and third address signals to said first address decoder.

7. A semiconductor integrated circuit device according to claim 6, wherein said second memory block has a second address selector for supplying either one of said first and third address signals to said second address decoder.

8. A semiconductor integrated circuit device according to claim 7, further comprising:

a fourth circuit for outputting a timing signal to said first memory block which is selected by said first circuit.

9. A semiconductor integrated circuit device according to claim 7, wherein said first and second external terminals are address signal terminals.

10. A semiconductor integrated circuit device according to claim 7, wherein said first and second external terminals are row address strobe signal terminals.

11. A semiconductor integrated circuit device according to claim 7, wherein said first and second external terminals are column address strobe signal terminals.

12. A semiconductor integrated circuit device according to claim 7, wherein said first and second external terminals are write enable signal terminals.

13. A semiconductor integrated circuit device according to claim 9, wherein said first and second bonding wires are coated with insulators.

14. A semiconductor integrated circuit device according to claim 7, wherein selecting signals for selecting predetermined ones of said memory cells are formed on the basis of said first address signal when said semiconductor integrated circuit device is in a normal mode, wherein said selecting signal for selecting said first and second memory blocks is formed on the basis of said second address signal, and wherein selecting signals for selecting predetermined ones of said memory cells are formed on the basis of said third address signal when said semiconductor integrated circuit device is in a refresh mode.

15. A semiconductor integrated circuit device comprising:

a first memory block formed in a main surface of a semiconductor chip, which includes a first memory array having memory cells arranged in a matrix form, a first address decoder coupled to said first memory array and a first data output circuit coupled to said first memory array;

a second memory block formed in said main surface of said semiconductor ship, which includes a second memory array having memory cells arranged in a matrix form, a second address decoder coupled to said second memory array and a second data output circuit coupled to said second memory array;

a first external terminal formed in said main surface of said semiconductor chip, to provide an external connection point for internal elements of said first memory, said first external terminal being formed to be closer to the first memory block than to the closest peripheral edge of the semiconductor chip to shorten the connection distance between the first external terminal and the first memory block;

a first lead attached on said main surface of said semiconductor chip via an insulator;

a first coupling means for coupling said first lead and said first external terminal; and a second coupling means for coupling said first lead and said second external terminal, wherein said lead crosses a peripheral edge of the chip to extend from outside of said chip to the interior of said chip, wherein said lead has a first end located over the interior of said chip, and wherein at least one of the first and second coupling means extends from a portion of said lead located over the interior of said chip, other than the first end of said lead, to shorten the distance for connection between the lead and the corresponding first or second coupling means.

16. A semiconductor integrated circuit device according to claim 15, further comprising:

a third external terminal formed in said main surface of said semiconductor chip, which corresponds to said first memory block;

a fourth external terminal formed in said main surface of said semiconductor chip, which corresponds to said second memory block;

a second lead attached on said main surface of said semiconductor chip via an insulator;

a third coupling means for coupling said second lead and said third external terminal; and a fourth coupling means for coupling said second lead and said fourth external terminal.

17. A semiconductor integrated circuit device according to claim 16, further comprising:

a first circuit for outputting a signal for selecting either one of said first and second memory blocks.

18. A semiconductor integrated circuit device according to claim 17, further comprising:

a second circuit for outputting a first address signal supplied to said first and second memory blocks and a second address signal supplied to said first circuit, wherein selecting signals for selecting predetermined ones of said memory cells are formed on the basis of said first address signal, and further wherein said selecting signal for selecting said first and second memory blocks is formed on the basis of said second address signal.

19. A semiconductor integrated circuit device according to claim 18, wherein said memory cells are dynamic type memory cells.

20. A semiconductor integrated circuit device according to claim 19, wherein said first and second external terminals are address signal terminals.

21. A semiconductor integrated circuit device according to claim 20, wherein said third and fourth external terminals are address strobe signal terminals.

22. A semiconductor integrated circuit device according to claim 19, wherein said first, second, third and fourth coupling means are bonding wires.

23. A semiconductor integrated circuit device according to claim 22, wherein said bonding wires are coated with insulators.

24. A semiconductor integrated circuit device comprising:

a plurality of memory blocks formed in a main surface of a semiconductor chip, each of which includes a memory array having memory cells arranged in a matrix form, an address decoder coupled to said memory array and a data output circuit coupled to said memory array;

a plurality of external terminal groups formed in said main surface of said semiconductor chip, each of which external terminals corresponds to a respective one of said memory blocks to provide an external connection point for internal elements of its corresponding memory block, and each of which is closer to its corresponding memory block than to the closest peripheral edge to shorten the connection distances between the external terminals and their corresponding memory blocks;

first and second leads attached on said main surface of said semiconductor chip via an insulator;

a first coupling means for coupling said first lead and said external terminals which belong to different external terminal groups to each other; and a second coupling means for coupling said second lead and said external terminals which belong to different external terminal groups to each other, wherein said first and second leads each cross a peripheral edge of the chip to extend from outside of the chip to the interior of the chip, wherein each of the first and second leads has a first end located over the interior of said chip, wherein said first coupling means extends from a portion of the first lead, other than the first end thereof, to shorten the distance for connection between the first lead and one of the plurality of external terminals, and wherein the second coupling means extends from a portion of a second lead, other than the first end thereof, to shorten the distance for connection between the second lead and another one of the plurality of external terminals.

25. A semiconductor integrated circuit device according to claim 24, wherein said plurality of memory blocks are arranged in a matrix form.

26. A semiconductor integrated circuit device according to claim 25, wherein each of said external terminal groups is commonly used for said memory blocks which are arranged closely to each other.

27. A semiconductor integrated circuit device according to claim 26, wherein said first and second coupling means are bonding wires.

28. A semiconductor integrated circuit device according to claim 27, wherein said bonding wires are coated with insulators.